US012769921B2

(12) United States Patent
Chen et al.

(10) Patent No.: US 12,769,921 B2
(45) Date of Patent: Oct. 20, 2026

(54) LAYOUT METHOD, NON-TRANSITORY COMPUTER-READABLE MEDIUM, AND ASSOCIATED INTEGRATED CIRCUIT

(71) Applicant: FARADAY TECHNOLOGY CORPORATION, Hsinchu City (TW)

(72) Inventors: Chin-Cheng Chen, Hsinchu City (TW); Jui-Hung Hung, Hsinchu City (TW); Jen-Hsing Lin, Hsinchu City (TW)

(73) Assignee: FARADAY TECHNOLOGY CORPORATION, Hsinchu City (TW)

( * ) Notice: Subject to any disclaimer, the term of this patent is extended or adjusted under 35 U.S.C. 154(b) by 620 days.

(21) Appl. No.: 18/244,326

(22) Filed: Sep. 11, 2023

(65) Prior Publication Data

US 2024/0296271 A1 Sep. 5, 2024

(30) Foreign Application Priority Data

Mar. 1, 2023 (TW) ................................ 112107302

(51) Int. Cl.
*G06F 30/32* (2020.01)
*G06F 30/392* (2020.01)
*G06F 30/394* (2020.01)

(52) U.S. Cl.
CPC .......... *G06F 30/392* (2020.01); *G06F 30/394* (2020.01)

(58) Field of Classification Search
CPC ....... G06F 30/392; G06F 30/394; G06F 30/32
See application file for complete search history.

(56) References Cited

U.S. PATENT DOCUMENTS

| | | | | |
|---|---|---|---|---|
| 7,107,566 | B1 * | 9/2006 | McElheny | G06F 30/34 716/133 |
| 9,508,405 | B2 * | 11/2016 | Jain | G11C 7/12 |
| 9,800,132 | B2 * | 10/2017 | Szczesny | H02M 1/088 |
| 10,068,048 | B1 * | 9/2018 | Eslami Dehkordi | G06F 30/392 |
| 10,860,765 | B1 * | 12/2020 | Li | G06F 30/337 |
| 2005/0091629 | A1 | 4/2005 | Eisenstadt et al. | |

FOREIGN PATENT DOCUMENTS

CN 105917338 A 8/2016

OTHER PUBLICATIONS

Office Action issued by Taiwan Intellectual Property Office on Oct. 11, 2023.

* cited by examiner

*Primary Examiner* — Nghia M Doan
(74) *Attorney, Agent, or Firm* — WPAT, PC

(57) ABSTRACT

A layout method, a non-transitory computer-readable medium, and an associated integrated circuit are provided. The non-transitory computer-readable medium records a software program for performing the layout method of the integrated circuit having Q circuit blocks. The layout method includes the following steps. K gate-controlled elements and (K−1) buffers are placed on the edge of a qth circuit block. The K gate-controlled elements are connected between a supply voltage terminal and the qth circuit block. (K−1) gate-controlled elements, including an SEL[1]-th gate-controlled element, are selected as (K−1) source nodes. Another (K−1) gate-controlled elements, other than the SEL[1]-th gate-controlled element, are selected as (K−1) destination nodes. The (K−1) buffers are routed as (K−1) delayed gating lines connected between the (K−1) source nodes and the (K−1) destination nodes.

20 Claims, 32 Drawing Sheets

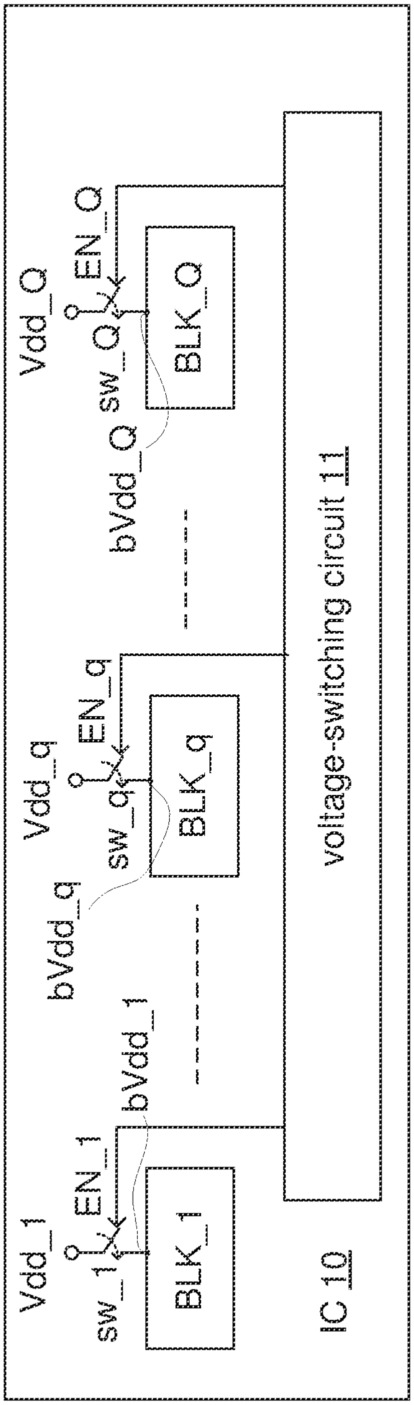
FIG. 1 (PRIOR ARTS)
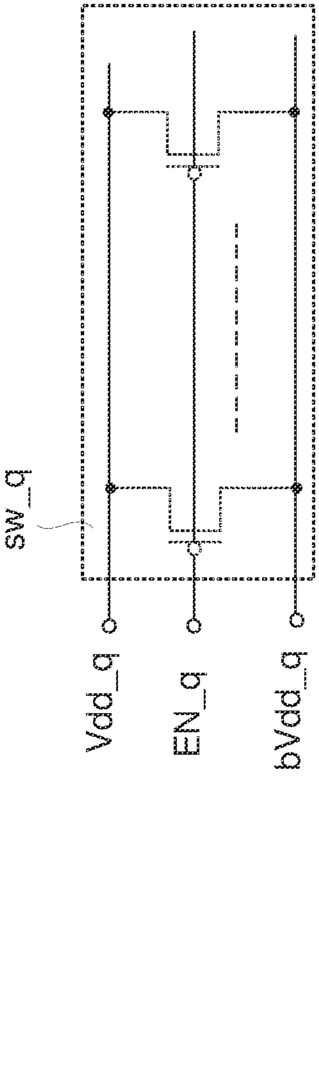
FIG. 2 (PRIOR ARTS)

LAYOUT METHOD, NON-TRANSITORY COMPUTER-READABLE MEDIUM, AND ASSOCIATED INTEGRATED CIRCUIT

This application claims the benefit of Taiwan application Serial No. 112107302, filed Mar. 1, 2023, the disclosure of which is incorporated by reference herein in its entirety.

TECHNICAL FIELD

The disclosure relates in general to a layout method, a non-transitory computer-readable medium, and an associated integrated circuit, and more particularly to a layout method, a non-transitory computer-readable medium, and an associated integrated circuit used for power gating.

BACKGROUND

Power saving is an important issue for mobile electronic products. Therefore, it is required that integrated circuits have dynamic power-saving functions. Integrated circuits usually include circuit blocks receiving different supply voltages or operating at different periods. One type of known power-saving operation of the integrated circuits is setting idle circuit blocks in a disabled mode MDoff with no power input to save power.

FIG. 1 is a schematic diagram illustrating that different supply voltages Vdd_1~Vdd_Q are provided to different circuit blocks BLK_1~BLK_Q in an integrated circuit. The integrated circuit (IC) 10 includes circuit blocks BLK 1~BLK_Q, a voltage-switching circuit 11, and switch sets sw_1~sw_Q. The circuit blocks BLK_1~BLK_Q correspond to the supply voltages Vdd_1~Vdd_Q, respectively. The supply voltages Vdd_1~Vdd_Q may have different voltage values from each other, or some of the supply voltages Vdd_1~Vdd_Q have an identical voltage value but are not enabled at the same period.

The switch sets sw_1~sw_Q are selectively switched on or switched off in response to the corresponding block-enabling signals EN_1~EN_Q sent by the voltage-switching circuit 11. For example, when the switch set sw_q is switched on in response to the block-enabling signal EN_q, the block voltage terminal bVdd_q of the circuit block BLK_q receives the supply voltage Vdd_q through the switch set sw_q. Similarly, the circuit blocks BLK_1~BLK_Q receive the supply voltages Vdd_1~Vdd_Q through the switch sets sw_1~sw_Q, respectively. The voltage-switching circuit 11 uses the block-enabling signals EN_1~EN_Q to selectively and dynamically activate the circuit blocks BLK_1~BLK_Q or set the idle circuit blocks BLK_1~BLK_Q in the disabled mode MDoff to save power.

FIG. 2 is a schematic diagram illustrating those parallel-connected PMOS transistors, which receive the block-enabling signal EN_q synchronously and collectively, are utilized as the switch set sw_q according to the prior arts. In the PMOS transistors, the source terminals are connected to the supply voltage terminal Vdd_q, the drain terminals are connected to the block voltage terminal bVdd_q, and the gate terminals synchronously receive the block-enabling signal EN_q. When the block-enabling signal EN_q is at the low logic level, the PMOS transistors are switched on synchronously to enable and activate the circuit block BLK_q. In contrast, when the block-enabling signal EN_q is at the high logic level, the PMOS transistors are switched off synchronously to disable and deactivate the circuit block BLK_q. Adopting the architecture of FIG. 2, at the moment when the circuit block BLK_q just receives the supply voltage Vdd_q, multiple current paths are simultaneously formed between the supply voltage terminal Vdd_q and the block voltage terminal bVdd_q. Each of these current paths corresponds to a branch current, and the sum of the branch currents could be considered an overall current conducting the supply voltage to the circuit block BLK_q.

For illustration purposes, it is assumed that the circuit block BLK_q is in the disabled mode MDoff and all other (Q−1) circuit blocks BLK_1~BLK_(q−1), BLK_(q+1)~BLK_Q are in the enabled mode MDon. Immediately after the circuit block BLK_q is switched from the disabled mode MDoff to the enabled mode MDon, the circuit block BLK_q receives a high inrush current from the supply voltage terminal Vdd_q. The other (Q−1) circuit blocks BLK_1~BLK_(q−1), BLK_(q+1)~BLK_Q in the enabled mode MDon may be disturbed by the inrush current flowing through the circuit block BLK_q so that IR drop occurs. Therefore, the switching operation of the supply voltage Vdd_q in the prior arts needed to be improved.

SUMMARY

The disclosure is directed to a layout method, a non-transitory computer-readable medium, and an associated integrated circuit.

According to one embodiment, a layout method is provided. The integrated circuit includes Q circuit blocks. The layout method includes the following steps. Firstly, K gate-controlled elements and (K−1) buffers are placed on the edge of a qth circuit block among the Q circuit blocks. Each of the K gate-controlled elements includes a first terminal, a second terminal, and a control terminal, and each of the (K−1) buffers includes an input terminal and an output terminal. Then, the first terminals of the K gate-controlled elements are connected to a supply voltage terminal, and the second terminals of the K gate-controlled elements are connected to the qth circuit block. Among the K gate-controlled elements, (K−1) gate-controlled elements, including an SEL[1]-th gate-controlled element, are selected as (K−1) source nodes, wherein the control terminal of the SEL[1]-th gate-controlled element receives a qth enabling signal corresponding to the qth circuit block. Among the K gate-controlled elements, another (K−1) gate-controlled elements other than the SEL[1]-th gate-controlled element are selected as (K−1) destination nodes. The (K−1) buffers are respectively routed as the (K−1) delayed gating lines connected between the (K−1) source nodes and the (K−1) destination nodes. The variables Q, q, K, and SEL[1] are positive integers, SEL[1] is smaller than K, and q is smaller than or equivalent to Q.

According to another embodiment, a non-transitory computer-readable medium is provided. The non-transitory computer-readable medium records a software program for performing the above-described layout method on an integrated circuit.

According to a further embodiment, an integrated circuit is provided. The integrated circuit includes Q layout blocks corresponding to Q supply voltages respectively. A qth layout block among the Q layout blocks includes a qth circuit block, K gate-controlled elements, and (K−1) buffers. The qth circuit block operates with a qth supply voltage among the Q supply voltages. The K gate-controlled elements are placed on the edge of the qth circuit block. Each of the K gate-controlled elements includes a first terminal connected to a supply voltage terminal, a second terminal connected to the qth circuit block, and a control terminal. The control terminal of a SEL[1]-th gate-controlled element among the K gate-controlled elements receives a qth enabling signal corresponding to the qth circuit block. The (K−1) buffers are placed on the edge of the qth circuit block. Each of the (K−1) buffers includes an input terminal and an output terminal. Among the K gate-controlled elements, (K−1) gate-controlled elements, including the SEL[1]-th gate-controlled element, are selected as (K−1) source nodes, and another (K−1) gate-controlled elements other than the SEL[1]-th gate-controlled element are selected as (K−1) destination nodes. The (K−1) buffers are selected as (K−1) delayed gating lines between the (K−1) source nodes and the (K−1) destination nodes, respectively. The variables Q, q, K, and SEL[1] are positive integers, SEL[1] is smaller than K, and q is smaller than or equivalent to Q.

BRIEF DESCRIPTION OF THE DRAWINGS

The advantages of the present disclosure will become more readily apparent to those ordinarily skilled in the art after reviewing the following detailed description and accompanying drawings.

FIG. 1 (prior art) is a schematic diagram illustrating that different supply voltages Vdd_1~Vdd_Q are provided to different circuit blocks BLK_1~BLK_Q in an integrated circuit.

FIG. 2 (prior art) is a schematic diagram illustrating those parallel-connected PMOS transistors receiving the block-enabling signal EN_q synchronously and collectively are utilized as the switch set sw_q according to the prior arts.

Figure 3:
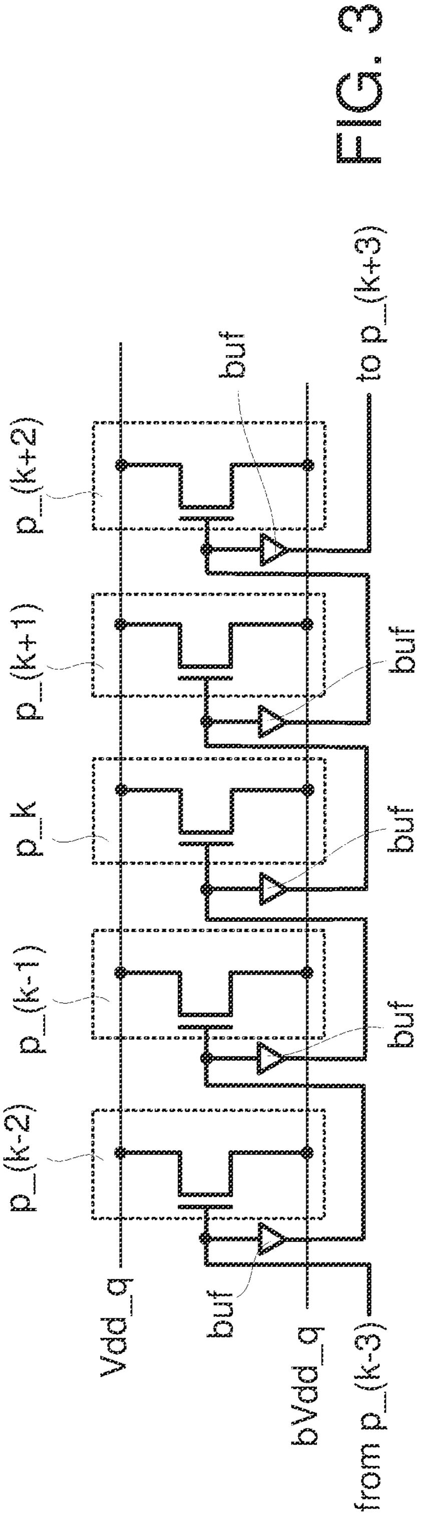
FIG. 3 is a schematic diagram showing that in Type A, the input terminals of the buffers buf are connected to the control terminals of the gate-controlled elements selected as the source nodes src[i], and the output terminals of the buffers buf are connected to the control terminals of the neighboring gate-controlled elements selected as the destination nodes dst[i].

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

As described above, when the integrated circuit in the prior arts switches the mode of the circuit block BLK_q, the high inrush current affects the voltages of other circuit blocks BLK_1~BLK_(q−1) and BLK_(q+1)~BLK_Q. Therefore, the disclosure proposes a specific layout of the gate-controlled elements of the circuit block BLK_q to eliminate the influence of the high inrush current on the peripheral-enabled circuit blocks BLK_1~BLK_(q−1) and BLK_(q+1)~BLK_Q.

The gate-controlled element in the disclosure generally refers to any element which is switched on or off by gate control. In the subsequent embodiments, the gate-controlled elements are implemented by NMOS transistors, which are switched on when the block-enabling signal EN_q is at the high logic level. However, the circuit behaviors of the gate-controlled elements p_1~p_K in response to the logic level of the block-enabling signal EN_q are not limited to the embodiments in practical applications. In the disclosure, the drain terminal, the source terminal, and the gate terminal of the NMOS transistor are defined as the first terminal, the second terminal, and the control terminal of the gate-controlled element, respectively. The first terminals of the gate-controlled elements p_1~p_K are all connected to the supply voltage Vdd_q, and the second terminals of the gate-controlled elements p_1~p_K are all connected to the block voltage terminal bVdd_q of the circuit block BLK_q.

According to the layout method of the disclosure, (K−1) buffers are selected as (K−1) delayed gating lines between the K gate-controlled elements p_1~p_K. In the disclosure, the variable "i" represents the numerical order (sequence number) of the delayed gating line, and the symbol buf[i] represents the buffer number, wherein i is a positive integer and i≤(K−1). The length of the ith delayed gating line (i=1~(K−1)) may vary with the sequence number i. In a concise manner, the buffers in the delayed gating lines are not shown in the subsequent figures, and the delayed gating lines are presented with simple lines.

In the embodiments of the disclosure, a layout loop includes sequentially viewing the 1st~Kth gate-controlled elements p_1~p_K on the edge of the circuit block BLK_q and selecting some of the gate-controlled elements p_1~p_K as source nodes src[i]/destination nodes dst[i] to route the delayed gating lines. Each layout loop usually routes Y delayed gating lines (Y<K). Therefore, the layout method of the disclosure needs several times of layout loops to route the (K−1)=91 delayed gating lines. According to the concepts of the disclosure, only one gate-controlled element is selected as the enablement input node p_enIN and directly receives the block-enabling signal EN_q with its control terminal, and other (K−1) gate-controlled elements do not directly receive the block-enabling signal EN_q with their control terminals, but indirectly and gradually receive the block-enabling signal EN_q through corresponding one or ones of the 1~(K−1) delayed gating lines. A combination of a circuit block BLK_q and its corresponding gate-controlled elements, buffers, delayed gating lines, and so forth adopted during the layout process is defined as a layout block in the specification.

Figure 4:
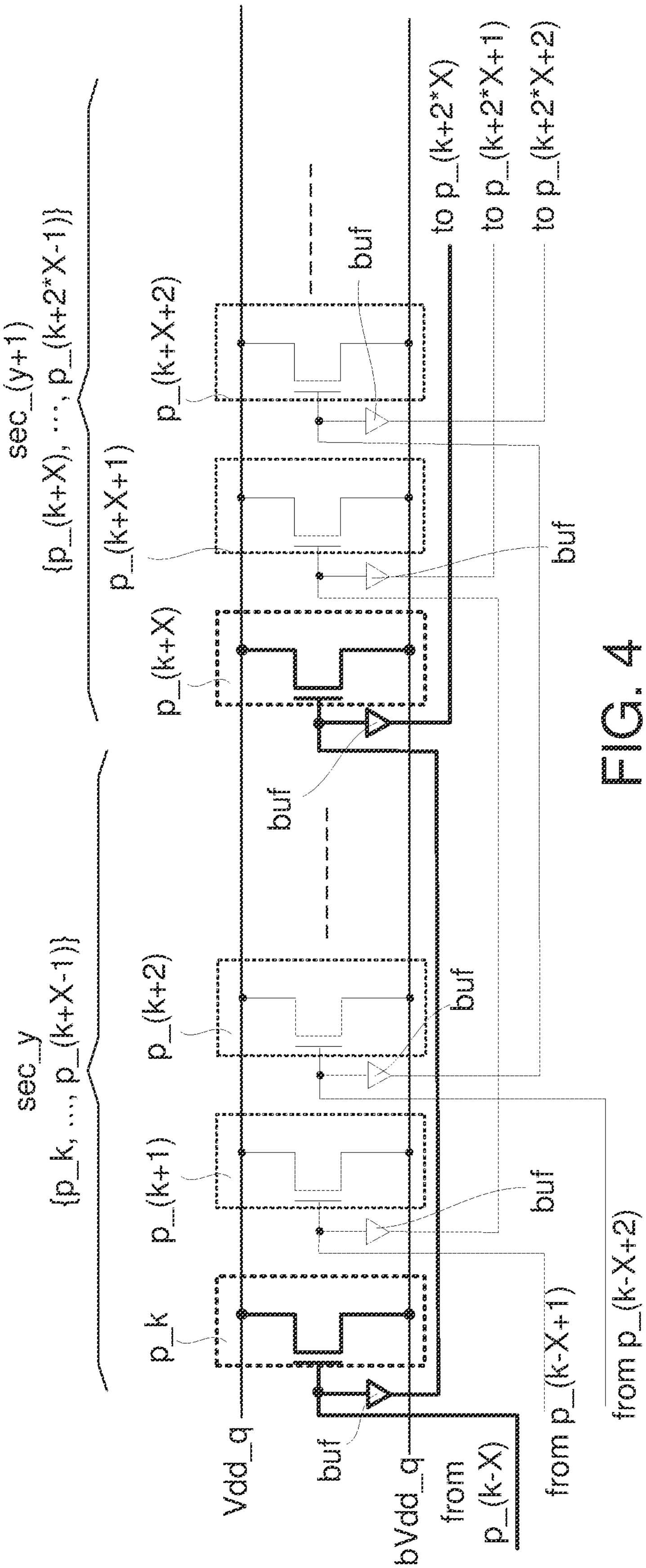
FIG. 4 is a schematic diagram showing that in Type B, the input terminals of the buffers buf are connected to the control terminals of the gate-controlled elements selected as the source nodes src[i], and the output terminals of the buffers buf are connected to the control terminals of the non-neighboring gate-controlled elements selected as the destination nodes dst[i].

The layout method of the disclosure provides two types of delayed gating lines to connect the gate-controlled elements, depending on the distance between two connected gate-controlled elements. The delayed gating line routed according to Type A means that the buffer buf connects the control terminal of the gate-controlled element selected as the source node src to the control terminal of the gate-controlled element selected as the destination node dst, wherein the two gate-controlled elements are neighboring gate-controlled elements (as shown in FIG. 3). The term "neighboring gate-controlled elements" in the disclosure means that there is no gate-controlled element interposed between the two gate-controlled elements. The delayed gating lines routed according to Type B means that the buffer buf connects the control terminal of the gate-controlled element as the source node src to the control terminal of the gate-controlled element as the destination node dst, wherein the two gate-controlled elements are non-neighboring gate-controlled elements (as shown in FIG. 4). The term "non-neighboring gate-controlled elements" in the disclosure means that there is at least one gate-controlled element interposed between the two gate-controlled elements. In the disclosure, the distance between two gate-controlled elements or the length of one delayed gating line is based on the number of the gate-controlled element(s) rather than a physical distance or a physical length. For example, the distance between two neighboring gate-controlled elements is one gate-controlled element, and so is the length of the delayed gating line routed according to Type A. The distance between the gate-controlled element p_1 and p_(1+X) is X gate-controlled elements, and so is the length of the delayed gating line connected between these two gate-controlled elements.

When the gate-controlled element selected as the source node src of one delayed gating line is switched on, the gate-controlled element selected as the destination node dst of the same delayed gating line is also switched on. As the delayed gating line routed according to Type A has a shorter distance between the gate-controlled element selected as the source node src[i] and the gate-controlled element selected as the destination node dst[i], the switch-on time difference between the two gate-controlled elements is shorter. The delayed gating line routed according to Type B has a longer distance between the gate-controlled element selected as the source node src[i] and the gate-controlled element selected as the destination node dst[i] so that the switch-on time difference between the two gate-controlled elements is longer. Although the switch-on time difference in one delayed gating line, regardless of Type A or Type B, is quite short, the gate-controlled element selected as the source node src[i] and the gate-controlled element selected as the destination node dst[i] are not switched on simultaneously. Actually, the gate-controlled elements are switched on sequentially.

TABLE 1

| Type of delayed gating line | Figure | Position relation | Length of delayed gating line | conduction of block-enabling signal EN_q |
|---|---|---|---|---|
| Type A | FIG. 3 | Source node src[i] and destination node dst[i] are neighboring gate-controlled elements | Shorter | Faster |
| Type B | FIG. 4 | Source node src[i] and destination node dst[i] are non-neighboring gate-controlled elements | Longer | Slower |

The gate-controlled elements selected as the source node src[i] and the destination node dst[i] of the ith delayed gating line are arranged clockwise in the drawings. The two gate-controlled elements selected as the source node src[i] and the destination node dst[i] in one clockwise layout loop have the relationship that the gate-controlled element selected as the source node src[i] has a smaller sequence number than the gate-controlled element selected as the destination node dst[i]. The exception is that the gate-controlled element selected as the source node src[i] is located at the fourth side, and the gate-controlled element selected as the destination node dst[i] is located at the first side. At this time, the gate-controlled element selected as the source node src[i] has a larger sequence number than the gate-controlled element selected as the destination node dst[i].

In the disclosure, the gate-controlled element for the enablement input node p_enIN is routed as the source node only, and the gate-controlled element for the destination node dst[K−1] of the (K−1)th delayed gating line is routed as the destination node only. Except for these two gate-controlled elements, other gate-controlled elements are routed as both the destination node dst[i] of one delayed gating line (for example, the ith delayed gating line) and the source node src[i+1] of the next delayed gating line (for example, the (i+1)th delayed gating line). In other words, after the gate-controlled element being selected as the destination node dst[i] is switched on, it is further selected as the source node src[i+1] to make the gate-controlled element being selected as the destination node dst[i+1] switched on.

FIG. 3 is a schematic diagram showing that in Type A, the input terminals of the buffers buf are connected to the control terminals of the gate-controlled elements as the source nodes src[i], and the output terminals of the buffers buf are connected to the control terminals of the neighboring gate-controlled elements as the destination nodes dst[i]. This diagram shows the connection relating to the gate-controlled element p_k, the gate-controlled elements p_(k−2), p_(k−1), p_(k+1), p_(k+2) on both sides of the gate-controlled element p_k and the buffers buf corresponding to the gate-controlled elements p_(k−2), p_(k−1), p_k, p_(k+1), p_(k+2).

The layout method of the disclosure routes the delayed gating line according to Type A as follows. The input terminal of a buffer buf is connected to the control terminal of the gate-controlled element p_(k−3) as the source node src, and the output terminal of another buffer buf is connected to the control terminal of the gate-controlled element p_(k−2) as the destination node dst. The control terminal of the gate-controlled element p_(k−1) as the destination node dst is connected to the control terminal of the gate-controlled element p_(k−2) as the source node src through a further buffer buf. The control terminal of the gate-controlled element p_k as the destination node dst is connected to the control terminal of the gate-controlled element p_(k−1) as the source node src through a further buffer buf. The control terminal of the gate-controlled element p_(k+1) as the destination node dst is connected to the control terminal of the gate-controlled element p_k as the source node src through a further buffer buf. The control terminal of the gate-controlled element p_(k+2) as the destination node dst is connected to the control terminal of the gate-controlled element p_(k+1) as the source node src through a further buffer buf. The control terminal of the gate-controlled element p_(k+2) as the source node src is connected to the control terminal of the gate-controlled element p_(k+3) as the destination node dst through a further buffer. Through the connection lines between the gate-controlled elements in FIG. 3, after the gate-controlled element p_(k−2) is switched on, the buffers buf make the gate-controlled elements p_(k−1), p_k, p_(k+1), p_(k+2) switched on in sequence.

FIG. 4 is a schematic diagram showing that in Type B, the input terminals of the buffers buf are connected to the control terminals of the gate-controlled elements as the source nodes src[i], and the output terminals of the buffers buf are connected to the control terminals of the non-neighboring gate-controlled elements as the destination nodes dst[i]. This diagram shows the connection relating to the gate-controlled element p_k and the nearby gate-controlled elements p_(k+1), p_(k+2) as the source node src or the destination node dst. In the embodiments, because the delayed gating lines are repetitively established between one gate-controlled element and the Xth gate-controlled element from the next, X successive gate-controlled elements are defined as a routing section. For example, in FIG. 4, the routing section sec_y includes the gate-controlled elements p_k~p_(K+X−1), and the routing section sec_(y+1) includes the gate-controlled elements p_(k+X)~p_(K+2*X−1).

In FIG. 4, the control terminal of the gate-controlled element p_(k−X) as the source node src is connected to the control terminal of the gate-controlled element p_k as the destination node dst, through a buffer buf. The control terminal of the gate-controlled element p_k, as the source node src is connected to the control terminal of the gate-controlled element p_(k+X) as the destination node dst, through another buffer buf. The control terminal of the gate-controlled element p_(k+X) as the source node src is further connected to the control terminal of the gate-controlled element p_(k+2*X) as the destination node dst, through a further buffer buf. Therefore, after the gate-controlled element p_(k−X) is switched on, the gate-controlled element p_k receives the block-enabling signal EN_q through the buffer buf with a specific delay and is then switched on. Similarly, after the gate-controlled element p_k is switched on, the gate-controlled elements p_(k+X), p_(k+2*X) receive the block-enabling signal EN_q with corresponding delays through the buffers buf and are switched on sequentially.

In FIG. 4, the control terminal of the gate-controlled element p_(k−X+1) as the source node src is connected to the control terminal of the gate-controlled element p_(k+1) as the destination node dst through a buffer buf. The control terminal of the gate-controlled element p_(k+1) as the source node src is connected to the control terminal of the gate-controlled element p_(k+X+1) as the destination node dst through another buffer buf. The control terminal of the gate-controlled element p_(k+X+1) as the source node src is further connected to the control terminal of the gate-controlled element p_(k+2*X+1) as the destination node dst through a further buffer buf. Therefore, after the gate-controlled element p_(k−X+1) is switched on in response to the block-enabling signal EN_q with a delay, the control terminal of the gate-controlled element p_(k+1) receives the block-enabling signal EN_q with a specific delay through the buffer buf and is then switched on. Similarly, after the gate-controlled element p_(k+1) is switched on, the control terminal of the gate-controlled elements p_(k+X+1), p_(k+2*X+1) receive the block-enabling signal EN_q with corresponding delays through the buffers buf and are switched on sequentially.

In FIG. 4, the control terminal of the gate-controlled element p_(k−X+2) as the source node src is connected to the control terminal of the gate-controlled element p_(k+2) as the destination node dst through a buffer buf. The control terminal of the gate-controlled element p_(k+2) as the source node src is connected to the control terminal of the gate-controlled element p_(k+X+2) as the destination node dst, through another buffer buf. The control terminal of the gate-controlled element p_(k+X+2) as the source node src is further connected to the control terminal of the gate-controlled element p_(k+2*X+2) as the destination node dst through a further buffer buf. Therefore, after the gate-controlled element p_(k−X+2) is switched on, the gate-controlled element p_(k+2) is also switched on. Similarly, after the gate-controlled element p_(k+2) is switched on, the gate-controlled elements p_(k+X+2), p_(k+2*X+2) are switched on sequentially.

Comparing FIG. 3 and FIG. 4, when the delayed gating line is routed according to either Type A or Type B, the input terminal of the buffer buf in the delayed gating line is connected to the control terminal of the gate-controlled element as the source node src; and the output terminal of the buffer buf in the delayed gating line is connected to the control terminal of the gate-controlled element as the destination node dst. Therefore, when the control terminal of the gate-controlled element, as the source node src, receives the block-enabling signal EN_q, the buffer buf connected to the control terminal of the gate-controlled element as the source node src, will delay the block-enabling signal EN_q, and then conduct the delayed block-enabling signal EN_q to the control terminal of the gate-controlled element as the destination node dst.

Therefore, the control terminal of the gate-controlled element selected as the source node src actually receives the block-enabling signal EN_q slightly earlier than the control terminal of the gate-controlled element selected as the destination node dst. Also, the gate-controlled element selected as the source node src is switched on to conduct an associated branch current slightly earlier than the gate-controlled element selected as the destination node dst. Hence, the overall current flows from the supply voltage Vdd_q to the circuit block BLK_q are gradually increased when more and more branch currents are generated.

Figure 5:
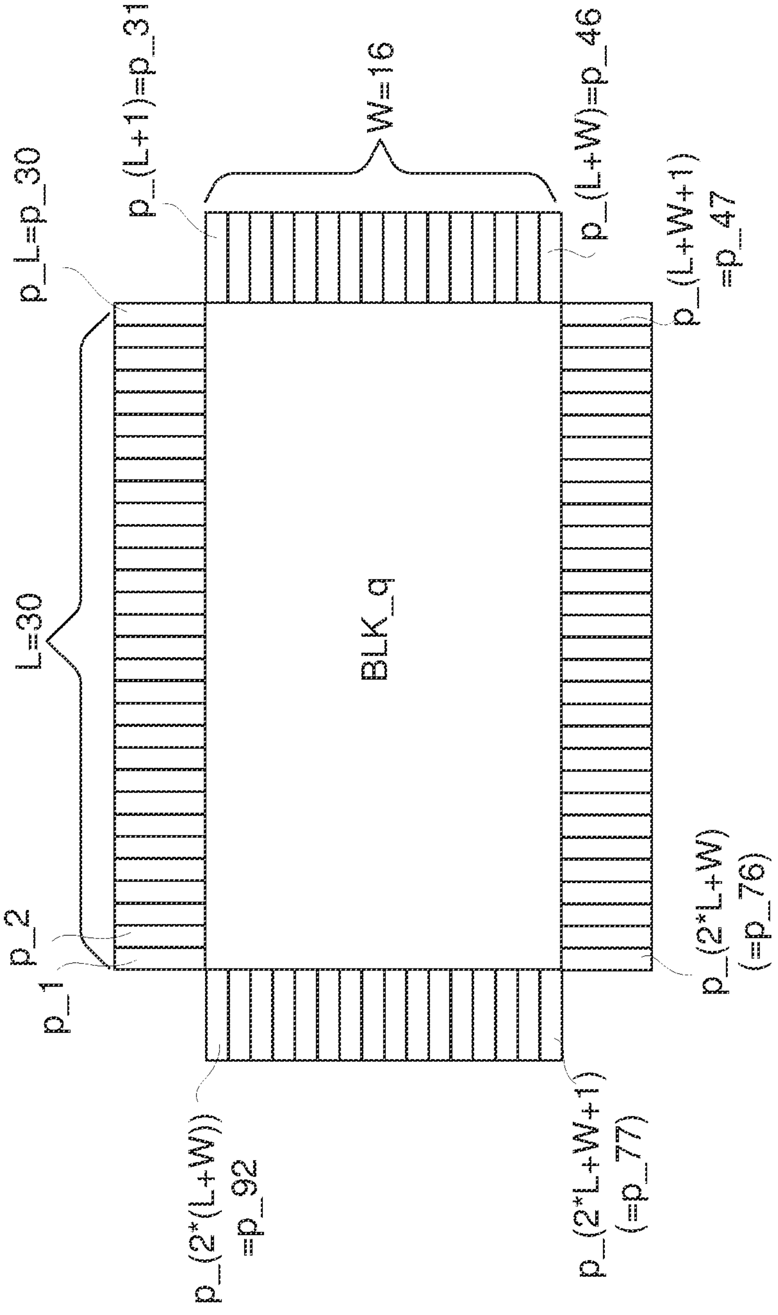
FIG. 5 is a schematic diagram showing the case of the circuit block BLK_q with the gate-controlled elements p_1~p_K on the edge.

FIG. 5 is a schematic diagram showing the case of the circuit block BLK_q with the gate-controlled elements p_1~p_K on the edge. For illustration purposes, the circuit block BLK_q has the shape of a rectangle, and its upper edge, right edge, lower edge, and left edge are defined as the first side, the second side, the third side, and the fourth side of the circuit block BLK_q, respectively. The drawing is simplified by using rectangles to represent the gate-controlled elements (p_1~p_92) and using dotted arrows to represent the signal conducted along the ith delayed gating lines (i=1~91). The tail of one dotted arrow indicates the source node src (or the input terminal of the buffer buf), and the head of the dotted arrow indicates the destination node dst (or the output terminal of the buffer buf). In the specification, the square brackets "[ ]" with a number or a symbol following the source node src or the destination node dst indicate the source node or the destination node of a specific delayed gating line. For example, the ith delayed gating line is connected between the source node src[i] and the destination node dst[i].

For illustration purposes, the embodiments give that there are K=92 gate-controlled elements arranged on the edge of the circuit block BLK_q, wherein L=30 gate-controlled elements (p_1~p_30, p_47~p_76) are arranged at the longer sides of the circuit block BLK_q, and W=16 gate-controlled elements (p_31~p_46, p_77~p_92) are arranged at the shorter sides of the circuit block BLK_q. In practical applications, the numbers K, L, and M are positive integers, L and M are much smaller than K, and K=2*(L+M). The values of K, L, and M are not limited to the embodiments of the disclosure. In fact, the number K may have a value up to thousands.

For illustration purposes, the gate-controlled elements p_1~p_K are numbered along the clockwise direction, and the source nodes src[1]~src[K−1] and the destination nodes dst[1]~dst[K−1] of the ith delayed gating lines (i=1~(K−1)) are determined based on the clockwise arrangement. Further, the gate-controlled element, as the source node src[1] of the first delayed gating line (i=1), is defined as the enablement input node p_enIN; and the gate-controlled element, as the destination node dst[K−1] of the (K−1)th delayed gating line (i=(K−1)), is defined as the layout loop-end position p_END. In practical applications, the layout method of the disclosure does not limit the numbering rule of the gate-controlled elements p_1~p_K, the relative position between the source nodes src[1]~src[K−1] and the destination nodes dst[1]~dst[K−1] of the ith delayed gating lines (i=1~(K−1)), and the position of the first numbered gate-controlled element at any side of the circuit block BLK_q.

As described above, two neighboring gate-controlled elements, used as the source node src[i] and the destination node dst[i] of the ith delayed gating line, are connected to each other through the buffer buf in FIG. 3, and it is defined that such delayed gating line is routed according to Type A. On the other hand, two non-neighboring gate-controlled elements, used as the source node src[i] and the destination node dst[i] of the ith delayed gating line, are connected to each other through the buffer buf in FIG. 4, and it is defined that such delayed gating line is routed according to Type B.

Please refer to both FIG. 4 and FIG. 5. In FIG. 4, the gate-controlled element selected as the destination node dst[i] is the Xth gate-controlled element from the next of the gate-controlled element selected as the source node src[i]. To simplify the design, it is set in the disclosure that the distance between two non-neighboring gate-controlled elements connected to each other through the ith delayed gating line is X gate-controlled elements. In practical applications, the distance between two non-neighboring gate-controlled elements connected to each other could be greater than, smaller than, or equivalent to X gate-controlled elements.

The K gate-controlled elements p_1~p_K in FIG. 5 are divided into Y routing sections sec_1~sec_Y according to the values of K and X, wherein each routing section sec_1~sec_Y corresponds to X successive gate-controlled elements. The value relation between the numbers K, X, and Y is expressed as $X*Y \leq K < X*(Y+1)$. Thus, one layout loop going around the edge of the circuit block BLK_q once can determine Y delayed gating lines, each having a length of X gate-controlled elements. For routing (K−1) delayed gating lines having a length of X gate-controlled elements by repetitively selecting the gate-controlled elements among the K gate-controlled elements, at least X circulations (layout loops) around the edge of the circuit block BLK_q are required to route the (K−1) delayed gating lines.

The layout method of the disclosure routs the delayed gating line according to either Type A or Type B. There are three types of connection configurations for connecting the K gate-controlled elements p_1~p_K on the edge of the circuit block BLK_q. The first type of connection configuration routes all the (K−1) delayed gating lines according to Type A; the second type of connection configuration routes all the (K−1) delayed gating lines according to Type B; and the third type of connection configuration routes some delayed gating lines according to Type A and other delayed gating lines according to Type B.

Figure 6:
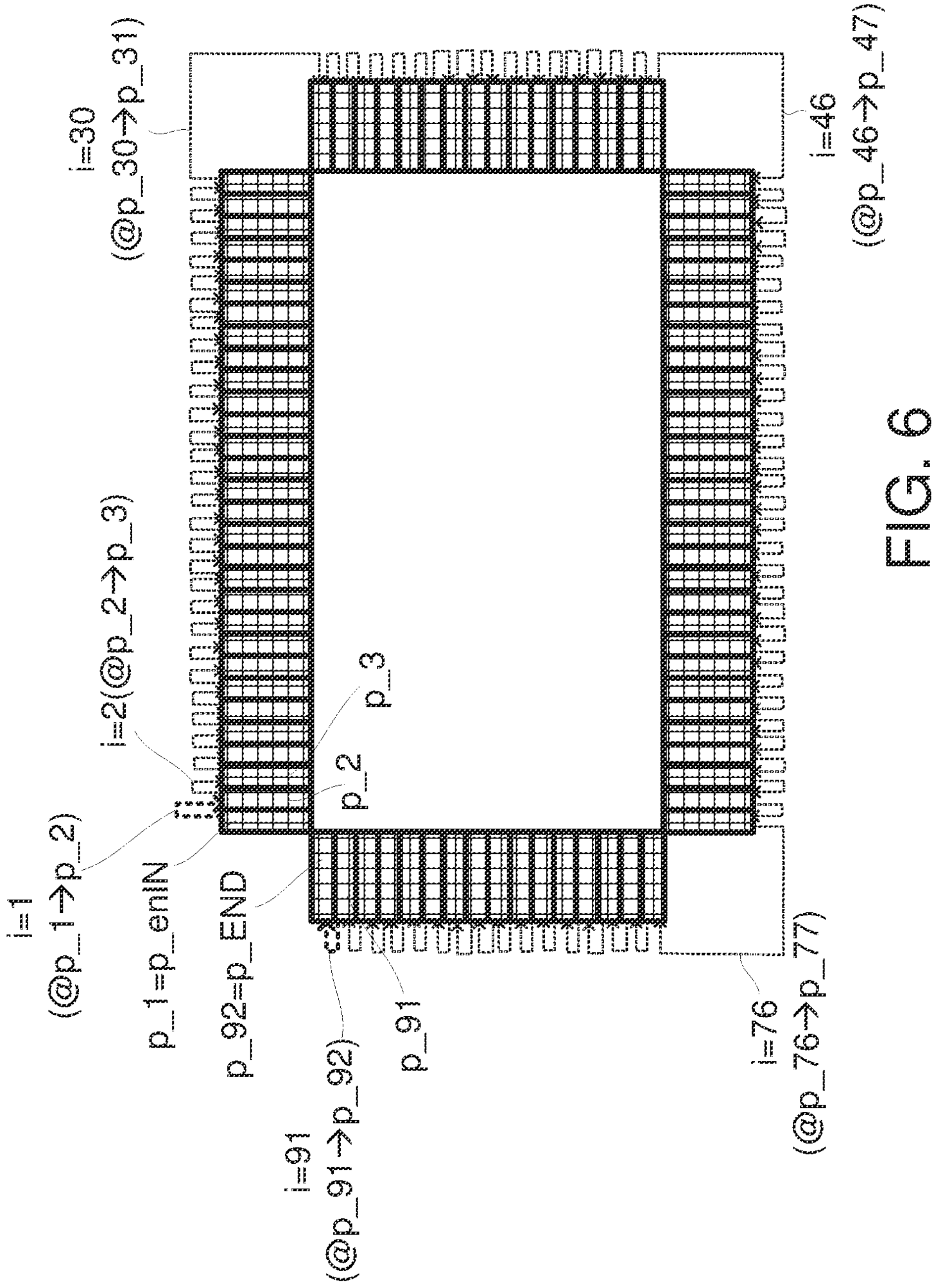
FIG. 6 is a schematic diagram showing that the ith delayed gating lines (i=1~(K−1)) are routed on the condition that X=1 and the gate-controlled element p_1 is selected as the layout loop-initialization position p_INIT and the enablement input node p_enIN (that is, p_INIT=p_enIN=p_1).
Figure 7:
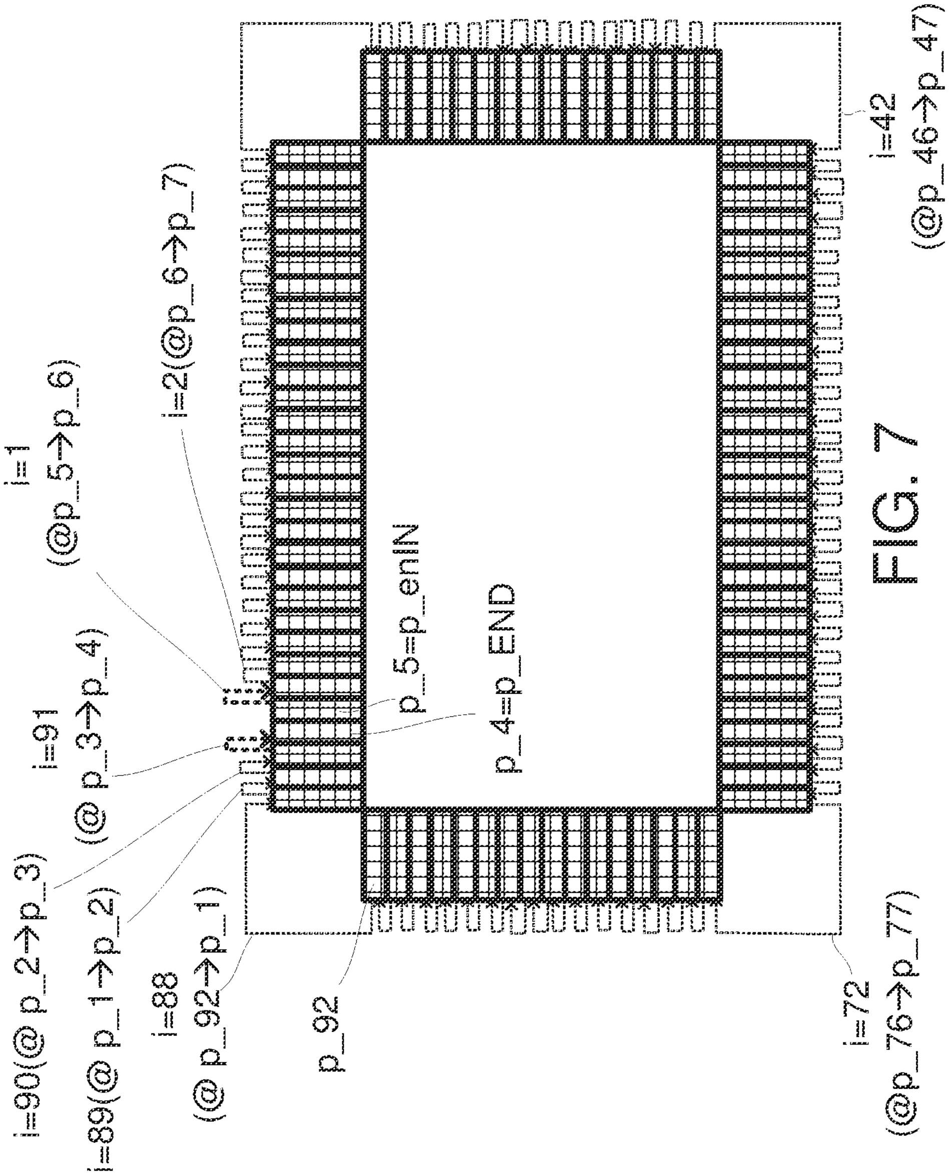
FIG. 7 is a schematic diagram showing that the ith delayed gating lines (i=1~(K−1)) are routed on the condition that X=1 and the gate-controlled element p_5 is selected as the layout loop-initialization position p_INIT and the enablement input node p_enIN (that is, p_INIT=p_enIN=p_5).

The second type of connection configuration is only applicable to the condition that the number K is a multiple of the number X (for example, K=92 and X=4), and the gate-controlled element p_1 is selected as the layout loop-initialization position p_INIT (that is, INIT=1). The second type of connection configuration for the layout needs Z=X layout loops to finish routing the delayed gating lines. FIGS. 6 and 7 illustrate the first type of connection configuration (adopting Type A only) and FIGS. 8~15 illustrate the third type of connection configuration (adopting both Type A and Type B). For illustration purposes, the variable Z represents the number of the layout loops in which the delayed gating lines are routed according to Type B, and the variable z represents the loop number of the current layout loop, wherein z, Z are positive integers, $z \leq Z$, and $Z \leq X$.

In the third type of connection configuration, it is not necessary that the first gate-controlled element of the routing section sec_1 is the gate-controlled element p_1. For illustration purposes, the first gate-controlled element of the routing section sec_1 is defined as the layout loop-initialization position p_INIT, wherein 1≤INIT≤L. Thus, Y is expressed as Y=floor((K−INIT+1)/X). When the layout loop-initialization position p_INIT is not the gate-controlled element p_1 (that is, INIT>1), it means that (INIT−1) gate-controlled elements located at the first side, where the layout loop-initialization position p_INIT is located, are selected to route the delayed gating lines according to Type A. Further, when K>((INIT−1)+Y*X), it means that R=(K−((INIT−1)+Y*X)) gate-controlled elements located at the fourth side are selected to route the delayed gating lines according to Type A.

According to the description above, to route the ith delayed gating line according to Type A, the source node src[i] and the destination node dst[i] of the ith delayed gating line are two neighboring gate-controlled elements. On the other hand, to route the ith delayed gating line according to Type B, the source node src[i] and the destination node dst[i] of the ith delayed gating line are two non-neighboring gate-controlled elements.

No matter whether the ith delayed gating line is routed according to Type A or Type B, the procedure of selecting the gate-controlled elements as the source node src[i] and the destination node dst[i] determines the sequence of switching on the gate-controlled elements. Especially, after the gate-controlled element selected as the source node src[i] is switched on, the buffer buf connected to the two gate-controlled elements delays the block-enabling signal EN_q and conducts the delayed signal to the control terminal of the gate-controlled element selected as the destination node dst[i]. Therefore, the switch-on time point of the gate-controlled element selected as the destination node dst[i] is slighter later than the switch-on time point of the gate-controlled element selected as the source node src[i]. Hence, the gate-controlled element selected as the source node src[i] and the gate-controlled element selected as the destination node dst[i] are sequentially switched on. Therefore, in the disclosure, the two ends of the ith delayed gating lines (i=1~(K−1)) determine not only how the buffers buf are routed between the gate-controlled elements, but also the switch-on order of the gate-controlled elements p_1~p_92 which conduct the supply voltage Vdd_q to the circuit block BLK_q.

FIGS. 6 and 7 illustrate the embodiments that all of the ith delayed gating lines (i=1~91) are routed according to Type A. In FIG. 6, the enablement input node p_enIN is the gate-controlled element p_1 (that is, p_enIN=p_1). In FIG. 7, the enablement input node p_enIN is not the gate-controlled element p_1 (herein p_enIN=p_5). For illustration purposes, in FIGS. 6 and 7, the thicker dotted arrows indicate the first delayed gating line (i=1) and the last delayed gating line (i=91), and the thinner dotted arrows indicate other delayed gating lines (i=2~91).

FIG. 6 is a schematic diagram showing that the ith delayed gating lines (i=1~(K−1)) are routed on the condition that X=1 and the gate-controlled element p_1 is selected as the layout loop-initialization position p_INIT and the enablement input node p_enIN (that is, p_INIT=p_enIN=p_1). In FIG. 6, the gate-controlled element p_1 is defined as the source node src[1] of the first delayed gating line (i=1), the gate-controlled element p_2 is defined as the destination node dst[1] of the first delayed gating line (i=1), and so forth. Thus, in FIG. 6, the ith delayed gating line takes the gate-controlled element p_i as the source node src[i] and takes the gate-controlled element p_(i+1) as the destination node dst[i].

It could be seen from FIG. 6, after receiving the block-enabling signal EN_q, the gate-controlled element p_1 is the first switch-on gate-controlled element. Then, the first delayed gating line conducts the block-enabling signal EN_q with a delay to the control terminal of the gate-controlled element p_2, and the gate-controlled element p_2 is switched on in response to the block-enabling signal EN_q with the delay conducted by the first delayed gating line, and so forth. In FIG. 6, the gate-controlled elements p_1~p_92 are switched on sequentially. Lastly, the layout method of FIG. 6 performed on the circuit block BLK_q takes the gate-controlled element p_92 as the layout loop-end position p_END (that is, p_92=p_END).

FIG. 7 is a schematic diagram showing that the ith delayed gating lines (i=1~(K−1)) are routed on the condition that X=1 and the gate-controlled element p_5 is selected as the layout loop-initialization position p_INIT and the enablement input node p_enIN (that is, p_INIT=p_enIN=p_5). In FIG. 7, two layout loops are required for routing the gate-controlled elements p_1~p_92 on the edge of the circuit block BLK_q. During the first layout loop, the gate-controlled elements p_5~p_92 are sequentially selected to route the ith delayed gating lines (i=1~87); and during the second layout loop, the gate-controlled elements p_92, p_1~p_4 are sequentially selected to route the ith delayed gating lines (i=88~91). During the second layout loop, the source node src[88] of the ith delayed gating line (i=88) is the gate-controlled element p_92, and the destination node dst[88] of this delayed gating line is the gate-controlled element p_1. The source nodes src[89]~src[91] of the ith delayed gating lines (i=89~91) are the gate-controlled elements p_1~p_3, respectively, and the destination nodes dst[89]~dst[91] of these delayed gating lines are the gate-controlled elements p_2~p_4, respectively.

It can be seen from FIG. 7 that after receiving the block-enabling signal EN_q, the gate-controlled element p_5 is the first switch-on gate-controlled element among the gate-controlled elements p_1~p_92. Then, the first delayed gating line conducts the block-enabling signal EN_q with a delay to the control terminal of the gate-controlled element p_6, and the gate-controlled element p_6 is switched on in response to the block-enabling signal EN_q with the delay conducted by the first delayed gating line. That is, the gate-controlled element p_6 is the second switch-on gate-controlled element among the gate-controlled elements p_1~p_92, and so forth. In FIG. 7, the gate-controlled elements p_6~p_92 and p_1~p_4 are switched on sequentially. Lastly, the layout method of FIG. 7 performed on the circuit block BLK_q takes the gate-controlled element p_4 as the layout loop-end position p_END (that is, p_4=p_END). That is, the gate-controlled element p_4 is the last switch-on gate-controlled element among the gate-controlled elements p_1~p_92.

Table 2 shows how the gate-controlled elements p_1~p_92 are selected to route the delayed gating lines according to Type A through the layout methods of FIGS. 6 and 7.

TABLE 2

| Figure | Delayed gating line | Source node src[i] | Destination node dst[i] |
|---|---|---|---|
| FIG. 6 (p_enIN = p_1) | i = 1~(K − 1) | p_i | p_(i + 1) |
| FIG. 7 (p_enIN ≠ p_1) | i = 1~(K − enIN) | p_(i + enIN − 1) | p_(i + enIN) |
| | i = (K − enIN + 1) | p_K | p_1 |
| | i = (K − enIN + 2)~(K − 1) | p_(enIN + i − K − 1) | p_(enIN + i − K) |

The simplest case to route the ith delayed gating line is that the gate-controlled element p_1 is selected as the enablement input node p_enIN (that is, p_enIN=p_1). In this case, the gate-controlled element p_i is selected as the source node src[i] of the ith delayed gating line, and the gate-controlled element p_(i+1) is selected as the destination node dst[i] of the ith delayed gating line.

On the other hand, if the gate-controlled element p_1 is not selected as the enablement input node p_enIN (p_enIN≠p_1), there are three conditions to route the ith delayed gating lines based on the relation between the values of i, enIN, K. In the first condition of 1≤i≤(K−enIN), the gate-controlled element p_(i+enIN−1) is selected as the source node src[i] of the ith delayed gating line, and the gate-controlled element p_(i+enIN) is selected as the destination node dst[i] of the ith delayed gating line. In the second condition of i=(K−enIN+1), the gate-controlled element p_K is selected as the source node src[i] of the ith delayed gating line, and the gate-controlled element p_1 is selected as the destination node dst[i] of the ith delayed gating line. In the third condition of (K−enIN+2)≤i≤(K−1), the gate-controlled element p_(enIN+i−K−1) is selected as the source node src[i] of the ith delayed gating line, and the gate-controlled element p_(enIN+i−K) is selected as the destination node dst[i] of the ith delayed gating line.

In the embodiments with reference to FIGS. 6 and 7, the delayed gating lines are routed just according to Type A. Furthermore, in FIGS. 8~15, the embodiments exemplify that the delayed gating lines are routed according to both Type A and Type B. These embodiments involve more variables, and the definition of these variables is listed in Table 3 in advance.

TABLE 3

| Variable | Definition |
|---|---|
| K | The overall number of the gate-controlled elements on the edge of the circuit module BLK_q<br>Example of K = 92 in the disclosure |
| X | The number of the gate-controlled elements in each routing section sec_1~sec_Y<br>Example of X = 6 in the disclosure. |
| Y | The number of the routing sections sec_1~sec_Y on the edge of the circuit module BLK_q, each routing section sec_1~sec_Y corresponding to X gate-controlled elements<br>Y varies with the values of K, INIT, and X<br>Y = floor((K − INIT + 1)/X) |
| p_INIT | The gate-controlled element having the smallest element number among the X gate-controlled elements in the routing section sec_1 |
| p_SEL[z] | The gate-controlled element selected as the first source node during the zth layout loop when the delayed gating lines are routed according to Type B, the loop starting position p_SEL[1] being the enablement input node p_enIN (p_SEL[1] = p_enIN)<br>The loop starting positions p_SEL[1]~p_SEL[Z] are located in the routing section sec_1 (p_INIT~p_(INIT + X − 1)) without limiting the position sequence of the loop starting positions p_SEL[1]~p_SEL[Z].<br>Example of the loop starting position p_SEL[1] = the layout loop-initialization position p_INIT in the disclosure<br>The layout loop-initialization position p_INIT could be one of the loop starting positions p_SEL[2]~p_SEL[Z] in practical applications. |
| Z | The number of layout loops in which the delayed gating lines are routed according to Type B (Z ≤ X) |
| z | The loop number of the layout loop in which the delayed gating lines are routed according to Type B (1 ≤ z ≤ Z) |
| R | The number of the gate-controlled elements located at the fourth side and routing the delayed gating lines according to Type A<br>K = (INIT − 1) + X*Y + R |
| i | The sequence number of the delayed gating line |

Figure 8:
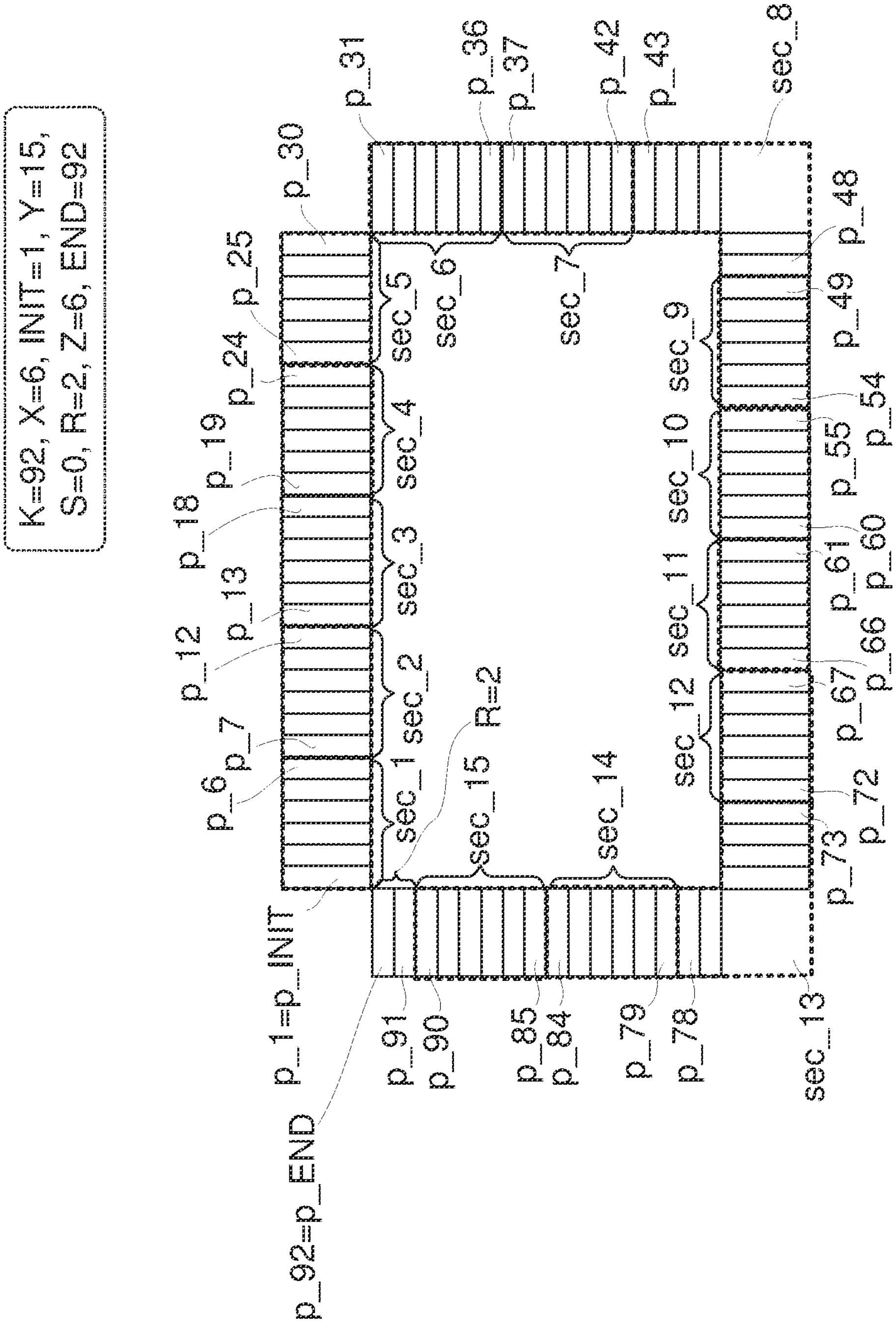
FIG. 8 is a schematic diagram showing the gate-controlled elements divided into routing sections sec_1~sec_15 on condition that K=92, X=6, and the gate-controlled element p_1 is selected as the layout loop-initialization position p_INIT (that is, p_INIT=p_1).

FIG. 8 is a schematic diagram showing the gate-controlled elements divided into routing sections sec_1~sec_15 on condition that K=92, X=6, and the gate-controlled element p_1 is selected as the layout loop-initialization position p_INIT (that is, p_INIT=p_1). Table 4 shows the gate-controlled elements and corresponding routing sections sec_1~sec_15 of FIG. 8. In FIG. 8, the gate-controlled element p_1 is selected as the layout loop-initialization position p_INIT (that is, p_INIT=p_1), and the gate-controlled element p_92 is selected as the layout loop-end position p_END (p_END=p_92). Please refer to both Table 4 and FIG. 8. It could be seen from FIG. 8 that starting from the gate-controlled element p_1, there are X*Y=6*15=90 gate-controlled elements (that is, the gate-controlled elements p_1~p_90) corresponding to the routing sections sec_1~sec_15, and the remained K−X*Y=92−6*15=2 gate-controlled elements (that is, the gate-controlled elements p_91, p_92) do not belong to any routing section.

TABLE 4

| Gate-controlled element | Routing section |
|---|---|
| p_1~p_6 | sec_1 |
| p_7~p_12 | sec_2 |
| p_13~p_18 | sec_3 |
| p_19~p_24 | sec_4 |
| p_25~p_30 | sec_5 |
| p_31~p_36 | sec_6 |
| p_37~p_42 | sec_7 |
| p_43~p_48 | sec_8 |
| p_49~p_54 | sec_9 |
| p_55~p_60 | sec_10 |
| p_61~p_66 | sec_11 |
| p_67~p_72 | sec_12 |
| p_73~p_78 | sec_13 |
| p_79~p_84 | sec_14 |
| p_85~p_90 | sec_15 |
| p_91, p_92 | — |

Based on the composition of the routing sections sec_1~sec_15 in FIG. 8, three sets of embodiments are provided wherein the gate-controlled element p_1 is set as the enablement input node p_enIN (that is, p_enIN=p_1) with different combinations of variables. Table 5 lists the variables in respective embodiments in a concise form.

TABLE 5

| Figure | Number of layout loops (Z ≤ X) | Loop starting position p_SEL[z] | Number of delayed gating lines (Type A) | Number of delayed gating lines (Type B) |
|---|---|---|---|---|
| 9A~9G | 6 | p_SEL[1] = p_1<br>p_SEL[2] = p_2<br>p_SEL[3] = p_3<br>p_SEL[4] = p_4<br>p_SEL[5] = p_5<br>p_SEL[6] = p_6<br>(sequential selection) | 2 | 89 |
| 12A, 12B | 1 | p_SEL[1] = p_1 | 62 | 29 |
| 13A~13G | 6 | p_SEL[1] = p_1<br>p_SEL[2] = p_4<br>p_SEL[3] = p_3<br>p_SEL[4] = p_5<br>p_SEL[5] = p_6<br>p_SEL[6] = p_2<br>(nonsequential selection) | 1 | 90 |

To route the delayed gating lines according to Type B, a few layout loops, which start from the enablement input node p_enIN and circulate the edge of the circuit block BLK_q along a clockwise direction, for repetitively selecting the source nodes src[i] and the destination nodes dst[i] as the ith delayed gating lines (i=1~(K−1)), are required. Herein, the variable Z represents the number of the layout loops around the circuit block BLK_q to route the delayed gating lines, each of which has a distance of X gate-controlled elements, wherein Z is a positive integer and Z≤X. Several layout loops circulating the circuit block BLK_q are required to route the (K−1) delayed gating lines (i=1~(K−1)), and each of the layout loops z=1~Z, in which the ith delayed gating lines (i=1~(K−1)) are routed, are illustrated in the embodiments with respective figures.

To make the drawings easy to read, the gate-controlled elements p_1~p_92 are shown with the corresponding screentone according to its role during the layout loop. The lattice screentone represents that the gate-controlled elements are selected as the delayed gating lines during the current layout loop, the dotted screentone represents that the gate-controlled elements have been selected as the delayed gating lines during the previous layout loop, and the white cell represents the delay gate-controlled elements which have not been selected for routing the delayed gating lines yet.

FIGS. 9A~9G are schematic diagrams showing that the ith delayed gating lines (i=1~91) are connected between the gate-controlled elements p_1~p_92 on condition that the gate-controlled element p_1 is selected as the layout loop-initialization position p_INIT (that is, p_INIT=p_1), and the delayed gating lines are routed according to Type B during Z=6 layout loops. Table 6 concludes the source nodes src[1]~src[91] and the destination nodes dst[1]~dst[91] of respective delayed gating lines (i=1~91) in the embodiments with reference to FIGS. 9A~9G.

TABLE 6

Figure 9A:
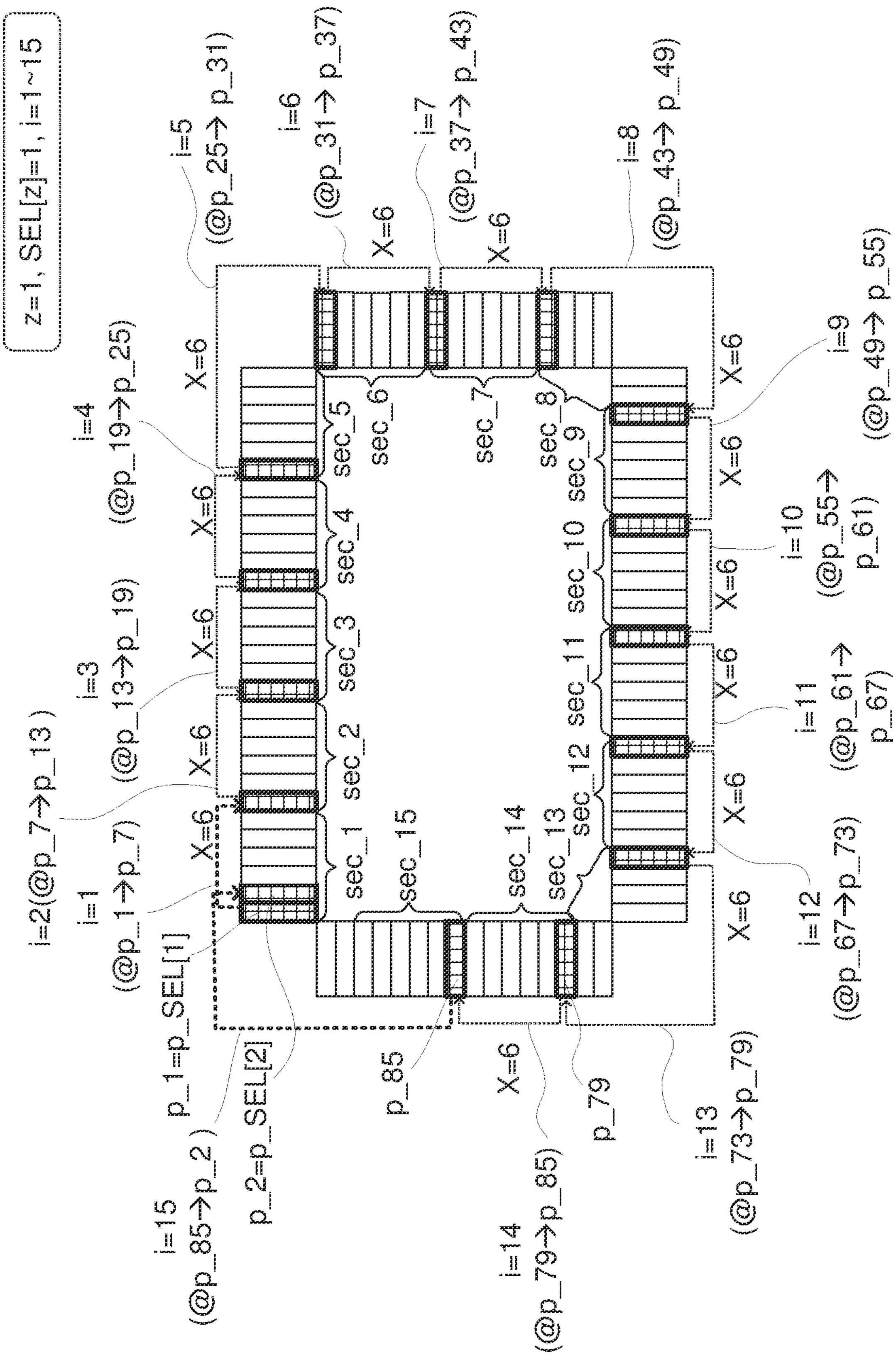
FIGS. 9A-9G are schematic diagrams showing that the buffers buf[1]~buf[91] are selected as the ith delayed gating lines (i=1~91) between the gate-controlled elements p_1~p_92 on condition that the gate-controlled element p_1 is selected as the layout loop-initialization position p_INIT is (that is, p_INIT=p_1) and the delayed gating lines are routed according to Type B during Z=6 layout loops.
Figure 9B:
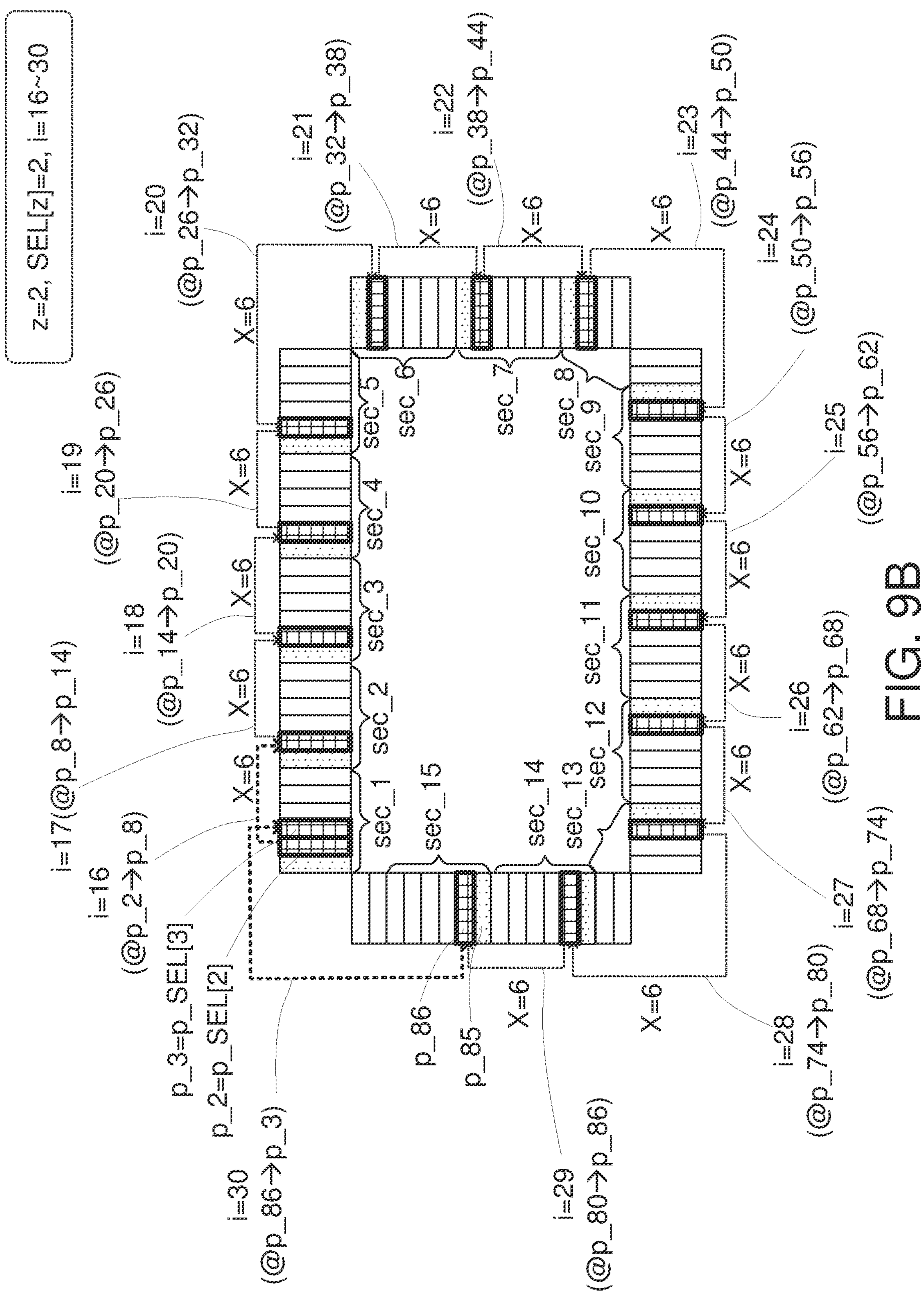
Figure 9C:
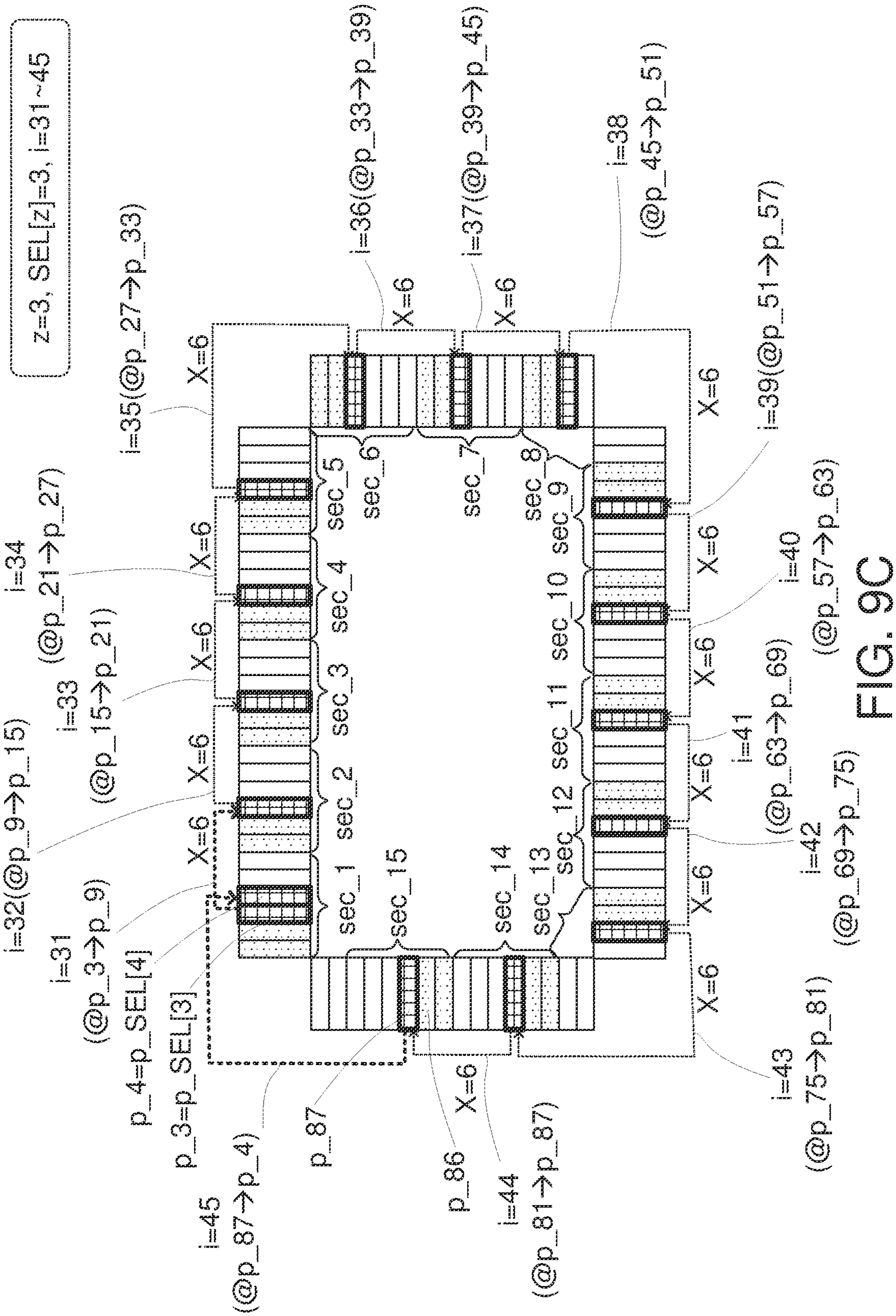

| Figure | ith delayed gating line | Source node src[i] and corresponding routing section | Destination node dst[i] and corresponding routing section |
|---|---|---|---|
| FIG. 9A | i = 1~15 (Type B) | p_1(sec_1) | p_7(sec_2) |
| | | p_7(sec_2) | p_13(sec_3) |
| | | p_13(sec_3) | p_19(sec_4) |
| | | p_19(sec_4) | p_25(sec_5) |
| | | p_25(sec_5) | p_31(sec_6) |
| | | p_31(sec_6) | p_37(sec_7) |
| | | p_37(sec_7) | p_43(sec_8) |
| | | p_43(sec_8) | p_49(sec_9) |
| | | p_49(sec_9) | p_55(sec_10) |
| | | p_55(sec_10) | p_61(sec_11) |
| | | p_61(sec_11) | p_67(sec_12) |
| | | p_67(sec_12) | p_73(sec_13) |
| | | p_73(sec_13) | p_79(sec_14) |
| | | p_79(sec_14) | p_85(sec_15) |
| | | p_85(sec_15) | p_2(sec_1) |
| FIG. 9B | i = 16~30 (Type B) | p_2(sec_1) | p_8(sec_2) |
| | | p_8(sec_2) | p_14(sec_3) |
| | | p_14(sec_3) | p_20(sec_4) |
| | | p_20(sec_4) | p_26(sec_5) |
| | | p_26(sec_5) | p_32(sec_6) |
| | | p_32(sec_6) | p_38(sec_7) |
| | | p_38(sec_7) | p_44(sec_8) |
| | | p_44(sec_8) | p_50(sec_9) |
| | | p_50(sec_9) | p_56(sec_10) |
| | | p_56(sec_10) | p_62(sec_11) |
| | | p_62(sec_11) | p_68(sec_12) |
| | | p_68(sec_12) | p_74(sec_13) |
| | | p_74(sec_13) | p_80(sec_14) |
| | | p_80(sec_14) | p_86(sec_15) |
| | | p_86(sec_15) | p_3(sec_1) |
| FIG. 9C | i = 31~45 (Type B) | p_3(sec_1) | p_9(sec_2) |
| | | p_9(sec_2) | p_15(sec_3) |
| | | p_15(sec_3) | p_21(sec_4) |
| | | p_21(sec_4) | p_27(sec_5) |
| | | p_27(sec_5) | p_33(sec_6) |
| | | p_33(sec_6) | p_39(sec_7) |
| | | p_39(sec_7) | p_45(sec_8) |
| | | p_45(sec_8) | p_51(sec_9) |

TABLE 6-continued

Figure 9D:
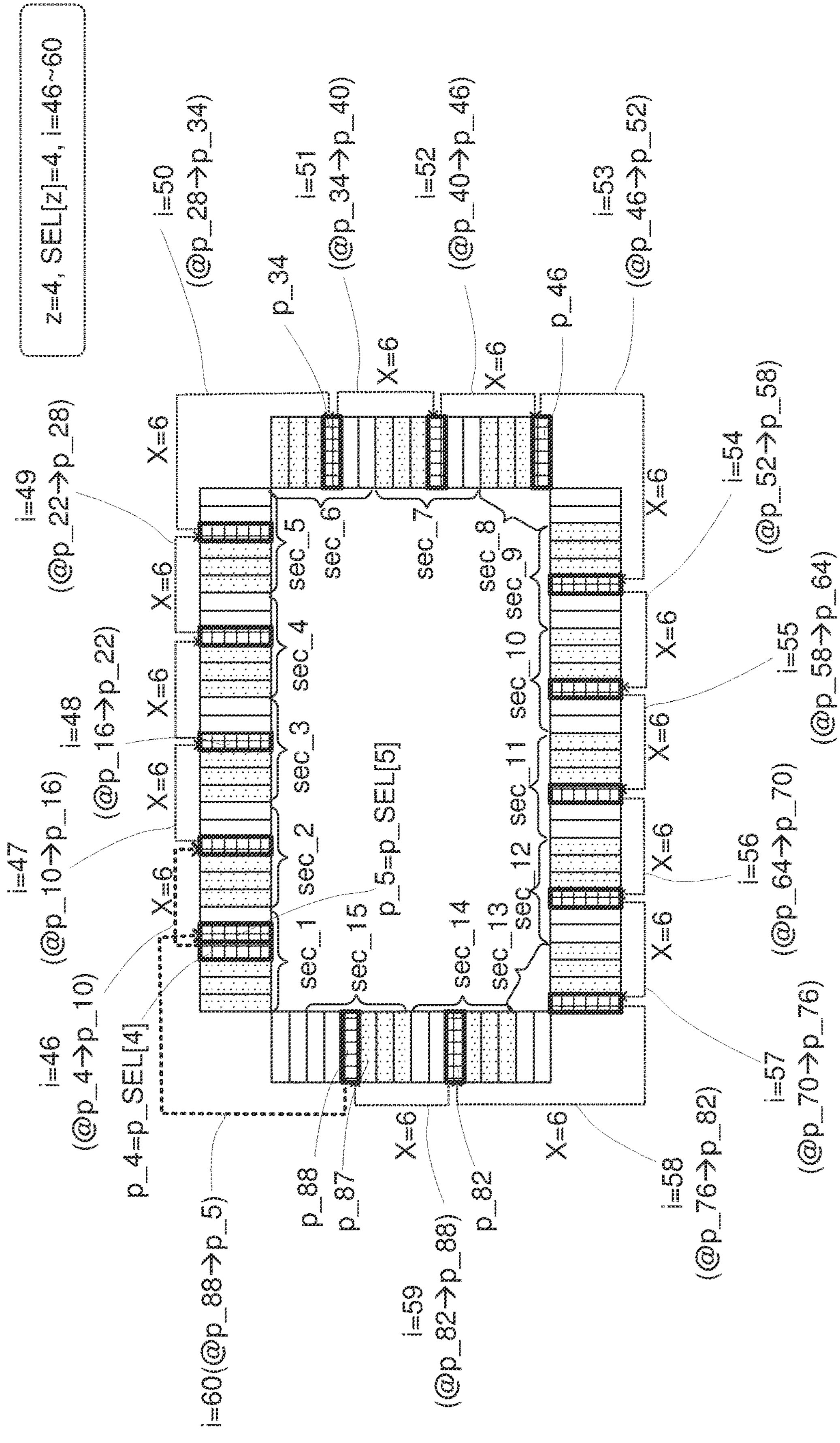
Figure 9E:
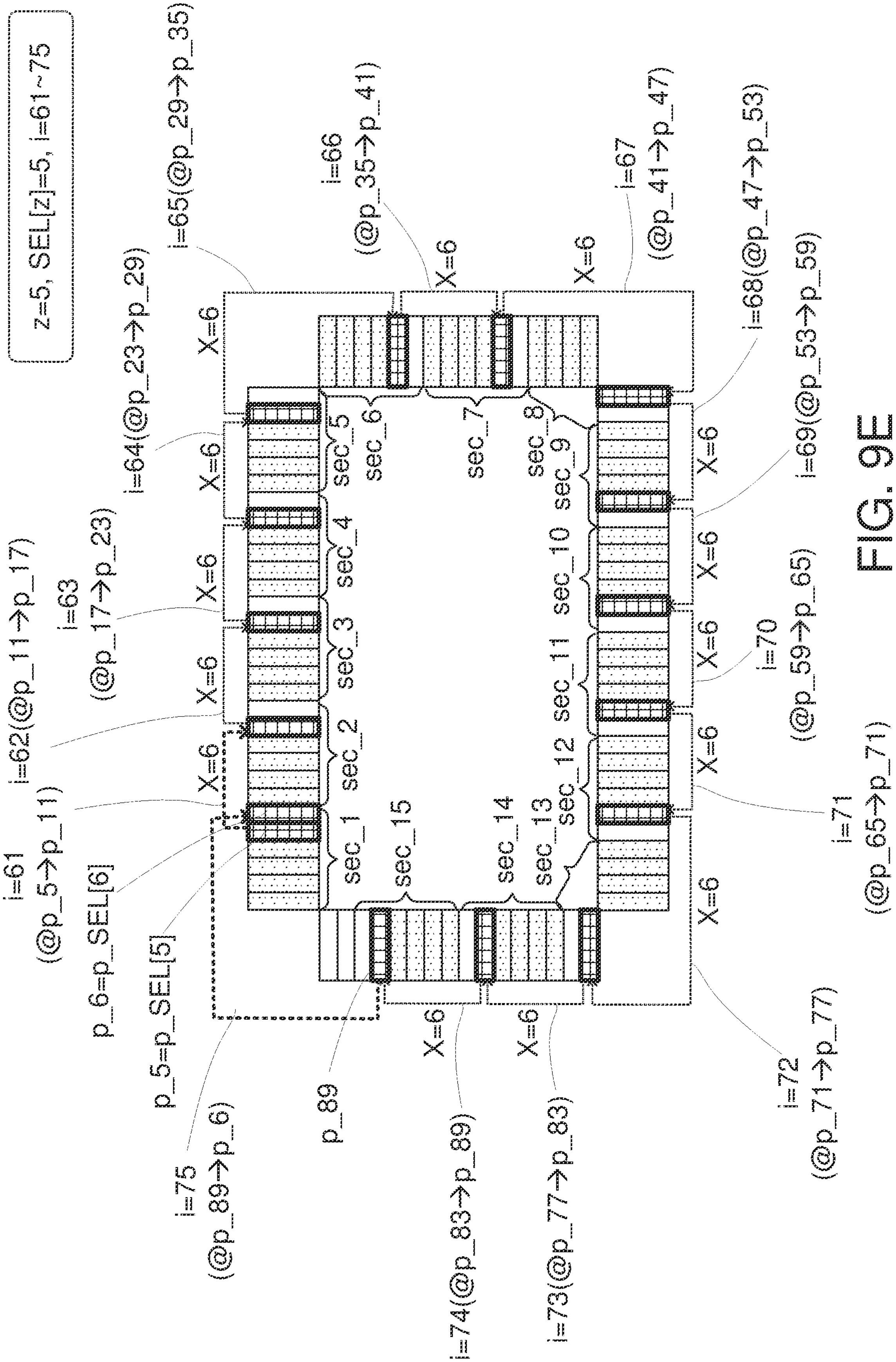
Figure 9F:
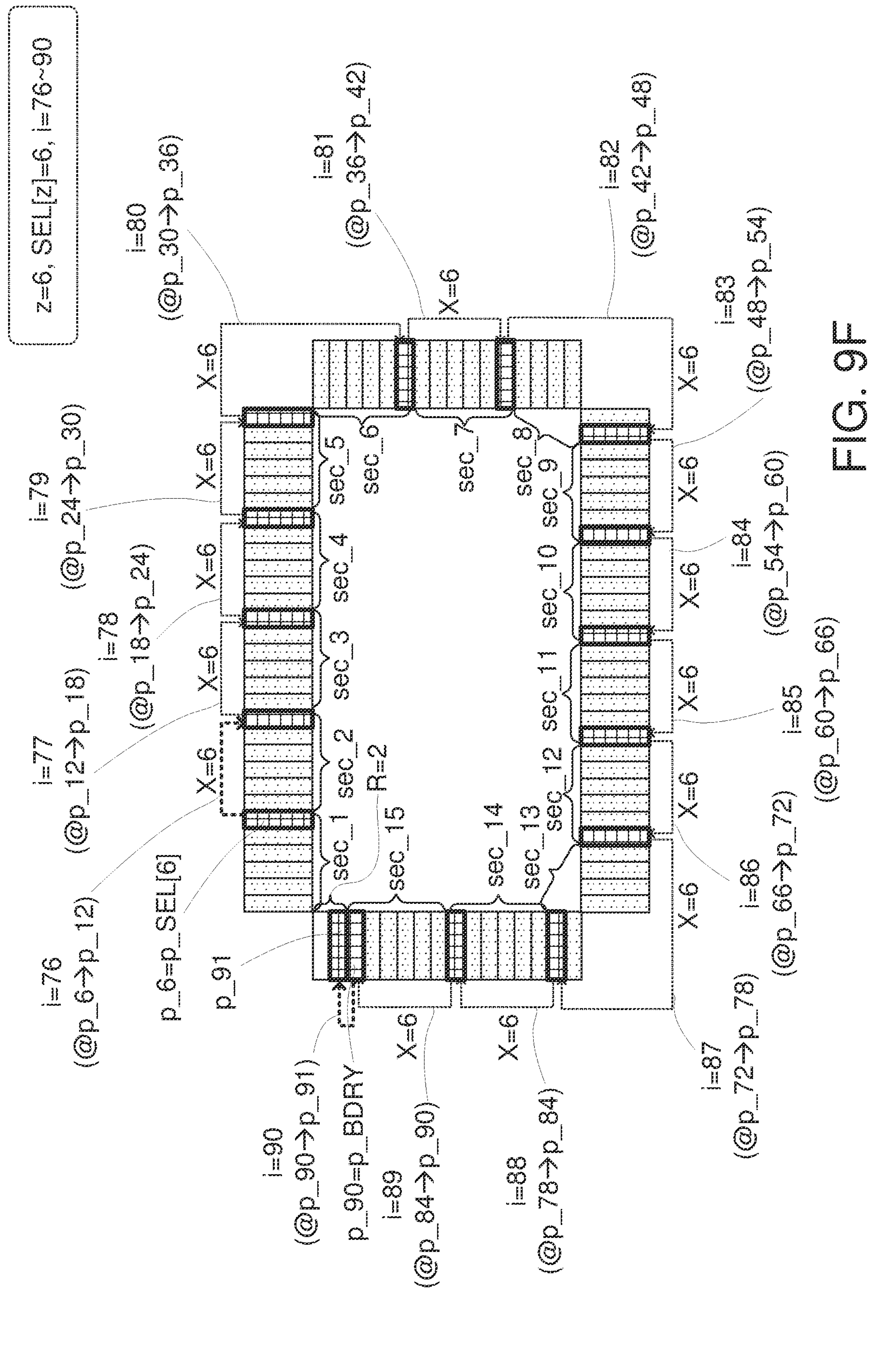
Figure 9G:
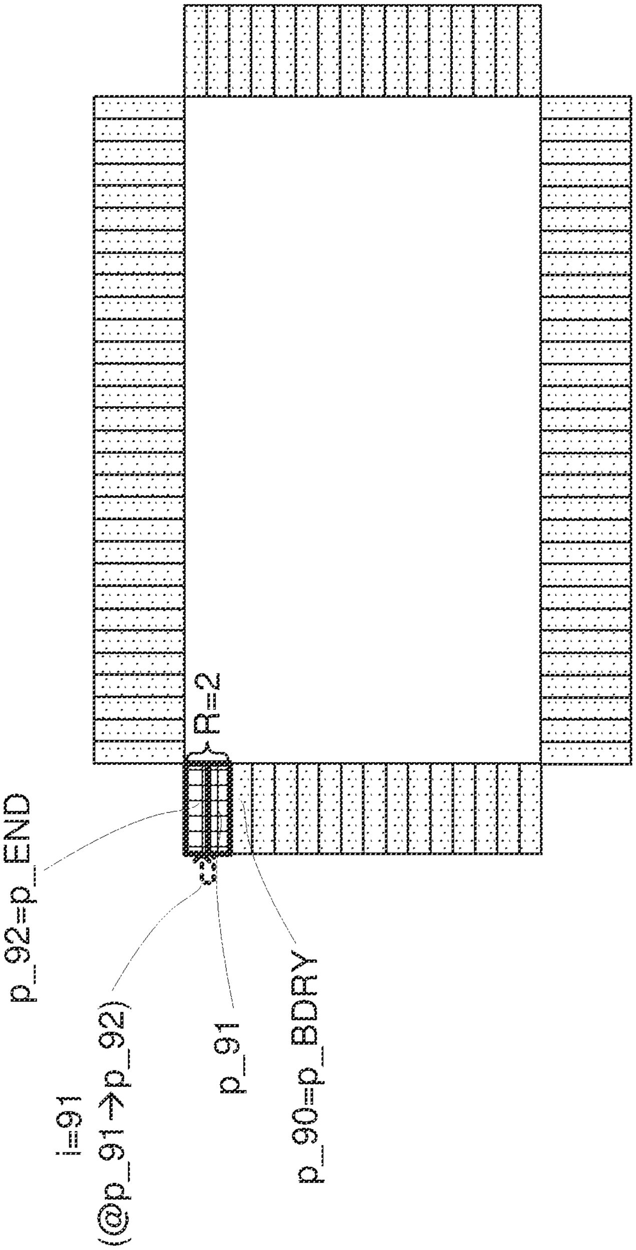

| Figure | ith delayed gating line | Source node src[i] and corresponding routing section | Destination node dst[i] and corresponding routing section |
|---|---|---|---|
| | | p_51(sec_9) | p_57(sec_10) |
| | | p_57(sec_10) | p_63(sec_11) |
| | | p_63(sec_11) | p_69(sec_12) |
| | | p_69(sec_12) | p_75(sec_13) |
| | | p_75(sec_13) | p_81(sec_14) |
| | | p_81(sec_14) | p_87(sec_15) |
| | | p_87(sec_15) | p_4(sec_1) |
| FIG. 9D | i = 46~60 (Type B) | p_4(sec_1) | p_10(sec_2) |
| | | p_10(sec_2) | p_16(sec_3) |
| | | p_16(sec_3) | p_22(sec_4) |
| | | p_22(sec_4) | p_28(sec_5) |
| | | p_28(sec_5) | p_34(sec_6) |
| | | p_34(sec_6) | p_40(sec_7) |
| | | p_40(sec_7) | p_46(sec_8) |
| | | p_46(sec_8) | p_52(sec_9) |
| | | p_52(sec_9) | p_58(sec_10) |
| | | p_58(sec_10) | p_64(sec_11) |
| | | p_64(sec_11) | p_70(sec_12) |
| | | p_70(sec_12) | p_76(sec_13) |
| | | p_76(sec_13) | p_82(sec_14) |
| | | p_82(sec_14) | p_88(sec_15) |
| | | p_88(sec_15) | p_5(sec_1) |
| FIG. 9E | i = 61~75 (Type B) | p_5(sec_1) | p_11(sec_2) |
| | | p_11(sec_2) | p_17(sec_3) |
| | | p_17(sec_3) | p_23(sec_4) |
| | | p_23(sec_4) | p_29(sec_5) |
| | | p_29(sec_5) | p_35(sec_6) |
| | | p_35(sec_6) | p_41(sec_7) |
| | | p_41(sec_7) | p_47(sec_8) |
| | | p_47(sec_8) | p_53(sec_9) |
| | | p_53(sec_9) | p_59(sec_10) |
| | | p_59(sec_10) | p_65(sec_11) |
| | | p_65(sec_11) | p_71(sec_12) |
| | | p_71(sec_12) | p_77(sec_13) |
| | | p_77(sec_13) | p_83(sec_14) |
| | | p_83(sec_14) | p_89(sec_15) |
| | | p_89(sec_15) | p_6(sec_1) |
| FIG. 9F | i = 76~90 (Type B) | p_6(sec_1) | p_12(sec_2) |
| | | p_12(sec_2) | p_18(sec_3) |
| | | p_18(sec_3) | p_24(sec_4) |
| | | p_24(sec_4) | p_30(sec_5) |
| | | p_30(sec_5) | p_36(sec_6) |
| | | p_36(sec_6) | p_42(sec_7) |
| | | p_42(sec_7) | p_48(sec_8) |
| | | p_48(sec_8) | p_54(sec_9) |
| | | p_54(sec_9) | p_60(sec_10) |
| | | p_60(sec_10) | p_66(sec_11) |
| | | p_66(sec_11) | p_72(sec_12) |
| | | p_72(sec_12) | p_78(sec_13) |
| | | p_78(sec_13) | p_84(sec_14) |
| | | p_84(sec_14) | p_90(sec_15) |
| | i = 90 (Type A) | p_90(sec_15) | p_91(--) |
| FIG. 9G | i = 91 (Type A) | p_91(--) | p_92(--) |

FIG. 9A shows the connection relationship between the gate-controlled elements during the first layout loop (z=1) when the delayed gating lines are routed according to Type B in the layout method. In FIG. 9A, the thicker dotted arrows indicate the ith delayed gating lines (i=1, 15) whose source nodes src[i] are located in the routing sections sec_1, sec_15; and the thinner dotted arrows indicate the ith delayed gating lines (i=2~14) whose source nodes src[i] are located in the routing sections sec_2~sec_14.

The first group of rows of Table 6 lists the gate-controlled elements selected for routing the ith delayed gating lines (i=1~15). The gate-controlled elements p_1, p_7, p_13, p_19, p_25, p_31, p_37, p_43, p_49, p_55, p_61, p_67, p_73, p_79, p_85 are selected as the source nodes src[1]~src[15] of the ith delayed gating lines (i=1~15); and the gate-controlled elements p_7, p_13, p_19, p_25, p_31, p_37, p_43, p_49, p_55, p_61, p_67, p_73, p_79, p_85, p_2 are selected as the destination nodes dst[1]~dst[15] of the ith delayed gating lines (i=1~15).

Please refer to both FIG. 9A and Table 6. In FIG. 9A, the gate-controlled elements p_1, p_7 are respectively selected as the source node src[1] and the destination node dst[1] of the ith delayed gating line (i=1); the gate-controlled elements p_7, p_13 are respectively selected as the source node src[2] and the destination node dst[2], of the ith delayed gating line (i=2); the gate-controlled elements p_13, p_19 are respectively selected as the source node src[3] and the destination node dst[3] of the ith delayed gating line (i=3); the gate-controlled elements p_19, p_25 are respectively selected as the source node src[4] and the destination node dst[4] of the ith delayed gating line (i=4); the gate-controlled elements p_25, p_31 are respectively selected as the source node src[5] and the destination node dst[5] of the ith delayed gating line (i=5); the gate-controlled elements p_31, p_37 are respectively selected as the source node src[6] and the destination node dst[6] of the ith delayed gating line (i=6); the gate-controlled elements p_37, p_43 are respectively selected as the source node src[7] and the destination node dst[7] of the ith delayed gating line (i=7); the gate-controlled elements p_43, p_49 are respectively selected as the source node src[8] and the destination node dst[8] of the ith delayed gating line (i=8); the gate-controlled elements p_49, p_55 are respectively selected as the source node src[9] and the destination node dst[9] of the ith delayed gating line (i=9); the gate-controlled elements p_55, p_61 are respectively selected as the source node src[10] and the destination node dst[10] of the ith delayed gating line (i=10); the gate-controlled elements p_61, p_67 are respectively selected as the source node src[11] and the destination node dst[11] of the ith delayed gating line (i=11); the gate-controlled elements p_67, p_73 are respectively selected as the source node src[12] and the destination node dst[12] of the ith delayed gating line (i=12); the gate-controlled elements p_73, p_79 are respectively selected as the source node src[13] and the destination node dst[13], of the ith delayed gating line (i=13); the gate-controlled elements p_79, p_85 are respectively selected as the source node src[14] and the destination node dst[14] of the ith delayed gating line (i=14); and the gate-controlled elements p_85, p_2 are respectively selected as the source node src[15] and the destination node dst[15] of the ith delayed gating line (i=15). The provision of other delayed gating lines can be derived from the description with reference to FIG. 9A, and the source node src[i] and the destination node dst[i] of each delayed gating line are not elaborated one by one herein.

Please refer to both FIG. 9B and Table 6 to realize how to select the gate-controlled elements to route the delayed gating lines according to Type B and decide the connection relating to the delayed gating lines during the zth layout loop (z=2). The second group of rows of Table 6 further list the gate-controlled elements selected as the source nodes src[16]~src[30] and the destination nodes dst[16]~dst[30] corresponding to the ith delayed gating lines (i=16~30). In FIG. 9B, the thicker dotted arrows indicate the ith delayed gating lines (i=16, 30) whose source nodes src[i] are located in the routing sections sec_1, sec_15, and the thinner dotted arrows indicate the ith delayed gating lines (i=17~29) whose source nodes src[i] are located in the routing sections sec_2~sec_14.

Please refer to both FIG. 9C and Table 6 to realize how to select the gate-controlled elements as the delayed gating lines according to Type B and decide the connection relating to the delayed gating lines during the zth layout loop (z=3). The third group of rows of Table 6 further list the gate-controlled elements selected as the source nodes src[31]~src[45] and the destination nodes dst[31]~dst[45] corresponding to the ith delayed gating lines (i=31~45). In FIG. 9C, the thicker dotted arrows indicate the ith delayed gating lines (i=31, 45) whose source nodes src[i] are located in the routing sections sec_1, sec_15; and the thinner dotted arrows indicate the ith delayed gating lines (i=32~44) whose source nodes src[i] are located in the routing sections sec_2~sec_14.

Please refer to both FIG. 9D and Table 6 to realize how to select the gate-controlled elements to route the delayed gating lines according to Type B and decide the connections related to the delayed gating lines during the zth layout loop (z=4). The fourth group of rows of Table 6 further list the gate-controlled elements selected as the source nodes src[46]~src[60] and the destination nodes dst[46]~dst[60] corresponding to the ith delayed gating lines (i=46~60). In FIG. 9D, the thicker dotted arrows indicate the ith delayed gating lines (i=46, 60) whose source nodes src[i] are located in the routing sections sec_1, sec_15; and the thinner dotted arrows indicate the ith delayed gating lines (i=47~59) whose source nodes src[i] are located in the routing sections sec_2~sec_14.

Please refer to both FIG. 9E and Table 6 to realize how to select the gate-controlled elements as the delayed gating lines according to Type B and decide the connection relating to the delayed gating lines during the zth layout loop (z=5). The fifth group of rows of Table 6 further list the gate-controlled elements selected as the source nodes src[61]~src[75] and the destination nodes dst[61]~dst[75] corresponding to the ith delayed gating lines (i=61~75). In FIG. 9E, the thicker dotted arrows indicate the ith delayed gating lines (i=61, 75) whose source nodes src[i] are located in the routing sections sec_1, sec_15; and the thinner dotted arrows indicate the ith delayed gating lines (i=62~74) whose source nodes src[i] are located in the routing sections sec_2~sec_14.

Please refer to both FIG. 9F and Table 6 to realize how to select the gate-controlled elements as the delayed gating lines according to Type B and decide the connection relating to the delayed gating lines during the zth layout loop (z=6). The sixth group of rows of Table 6 further list the gate-controlled elements selected as the source nodes src[76]~src[90] and the destination nodes dst[76]~dst[90] corresponding to the ith delayed gating lines (i=76~90). In FIG. 9F, the thicker dotted arrows indicate the ith delayed gating lines (i=76, 90) whose source nodes src[i] are located in the routing sections sec_1, sec_15; and the thinner dotted arrows indicate the ith delayed gating lines (i=77~89) whose source nodes src[i] are located in the routing sections sec_2~sec_14.

In FIG. 9F, when the gate-controlled element p_90 is selected as the destination node dst[89], the distance between the gate-controlled element p_90 and the gate-controlled element p_84 selected as the source node src[89] is X=6 gate-controlled elements. On the other hand, when the gate-controlled element p_90 is selected as the source node src[90], the gate-controlled element p_90 is immediately adjacent to the gate-controlled element p_91 selected as the destination node dst[90]. Therefore, the gate-controlled element p_90 could be viewed as a boundary position p_BDRY connected to two delayed gating lines of inequivalent length.

According to the descriptions of FIGS. 9A~9F, after the delayed gating lines according to Type B are routed during the Z=6 layout loops, the gate-controlled element p_92 has not been selected as the destination node. At this time, it is improper to route the ith delayed gating line (i=91) according to Type B. Instead, Type A is preferred to route the ith delayed gating line (i=91).

Please refer to both FIG. 9G and Table 4. In the layout method of FIG. 9G, the ith delayed gating line (i=91) is routed according to Type A. The source node src[91] of the ith delayed gating line (i=91) is the gate-controlled element p_91, and the destination node dst[91] of the ith delayed gating line (i=91) is the gate-controlled element p_92.

Figure 10:
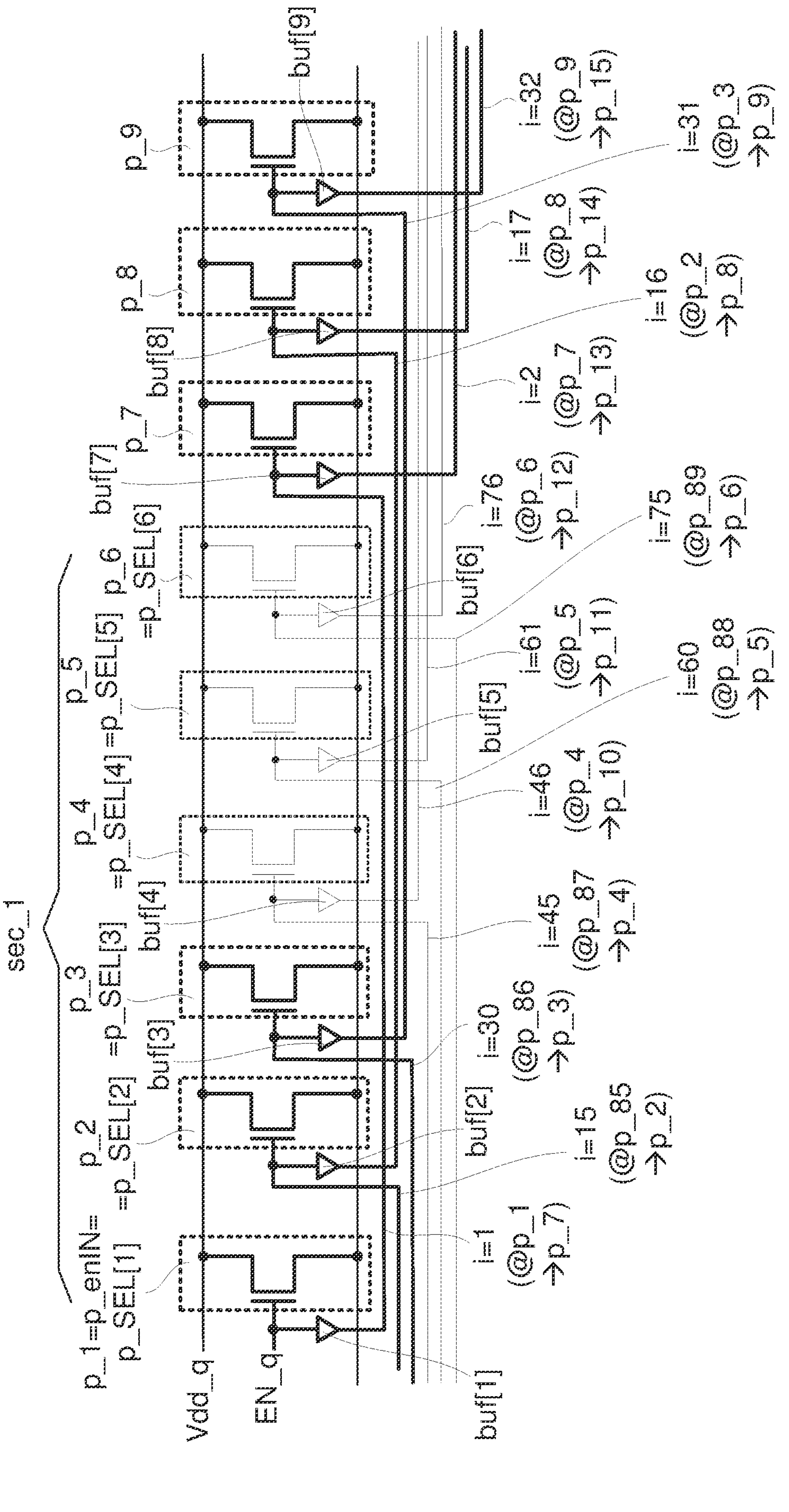
FIG. 10 is a schematic diagram showing how the delayed gating lines associated with the gate-controlled elements p_1~p_9 located at the first side are implemented with the buffers buf[1]~buf[9] after performing the layout process as shown in FIGS. 9A-9G.

FIG. 10 is a schematic diagram showing how the delayed gating lines associated with the gate-controlled elements p_1~p_9 located at the first side are implemented with the buffers buf[1]~buf[9] after performing the layout process as shown in FIGS. 9A-9G. The details about how to select and use the buffers buf[1]~buf[9] to connect the control terminals of the gate-controlled elements p_1~p_9 of FIG. 10 to form the ith delayed gating lines (i=1~9) can be derived from the description with reference to FIGS. 9A~9F, and are not repeated herein.

Figure 11:
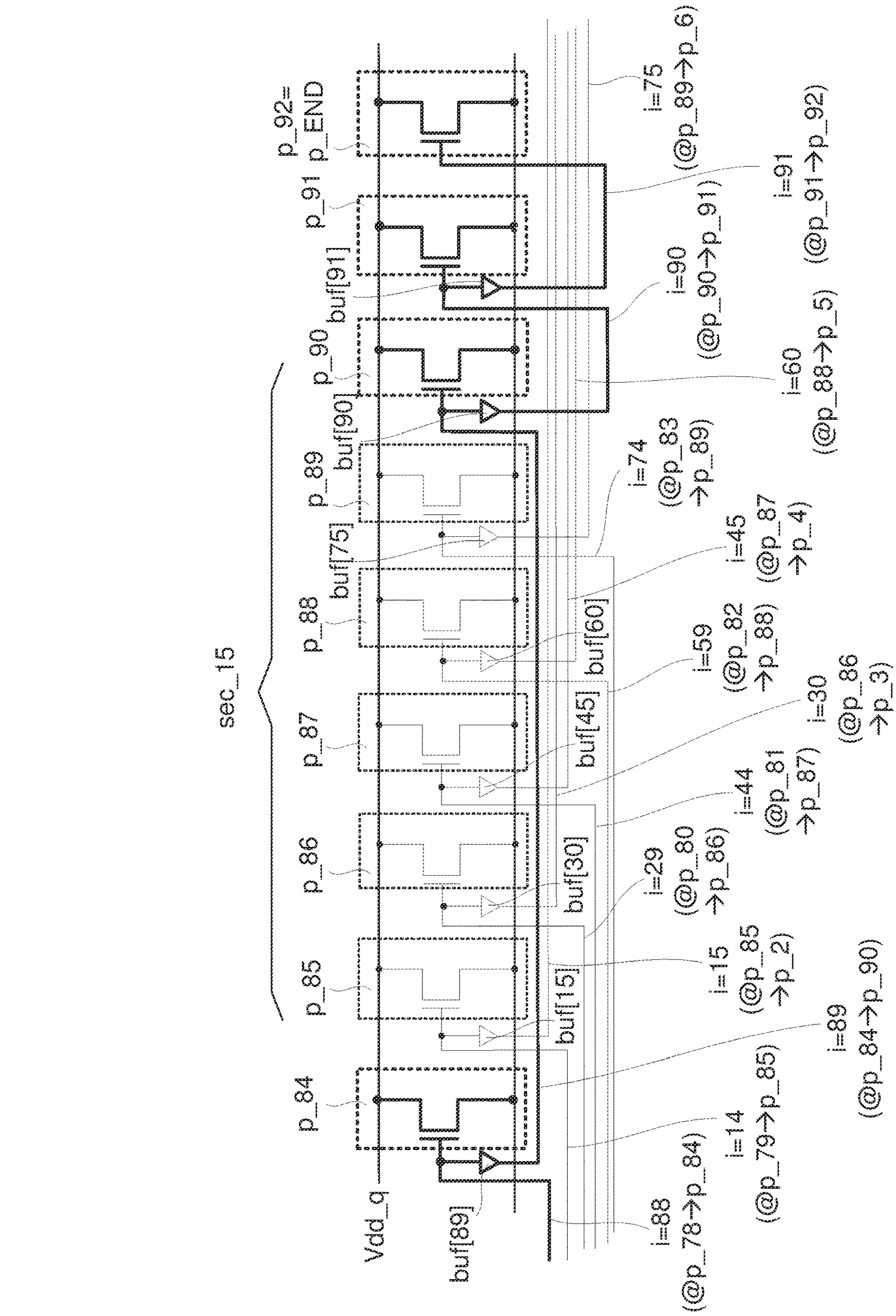
FIG. 11 is a schematic diagram showing how the delayed gating lines associated with the gate-controlled elements p_84~p_92 located at the fourth side are implemented with the buffers buf[89], buf[15], buf[30], buf[45], buf[60], buf [75], buf[90], buf[91] after performing the layout process as shown in FIGS. 9A-9G.

FIG. 11 is a schematic diagram showing how the delayed gating lines associated with the gate-controlled elements p_84~p_92 located at the fourth side are implemented with the buffers buf[89], buf[15], buf[30], buf[45], buf[60], buf[75], buf[90], buf[91] after performing the layout process as shown in FIGS. 9A-9G. The details about how to select and use the buffers buf[89], buf[15], buf[30], buf[45], buf[60], buf[75], buf[90], buf[91] to connect the control terminals of the gate-controlled elements p_84~p_92 of FIG. 11 to form the ith delayed gating lines (i=89, 15, 30, 45, 60, 75, 90, 91) can be derived from the description with reference to FIGS. 9A~9G, and are not repeated herein.

In FIGS. 9A~9F, the two delayed gating lines end at and start at the gate-controlled element p_90 are routed according to Type B and Type A, respectively, and thus the gate-controlled element p_90 is viewed as a boundary position p_BDRY (that is, p_BDRY=p_90) between two of the delayed gating lines having different types. In practical applications, when the layout adopts both Type A and Type B to route the delayed gating lines, the values of the variables K, X, Y, INIT may meet the condition that the source node src[i] and the destination node dst[i] of the ith delayed gating line are not neighboring gate-controlled elements, but the distance between the gate-controlled elements selected as the source node src[i] and the destination node dst[i] is not equivalent to X gate-controlled elements.

Figure 12A:
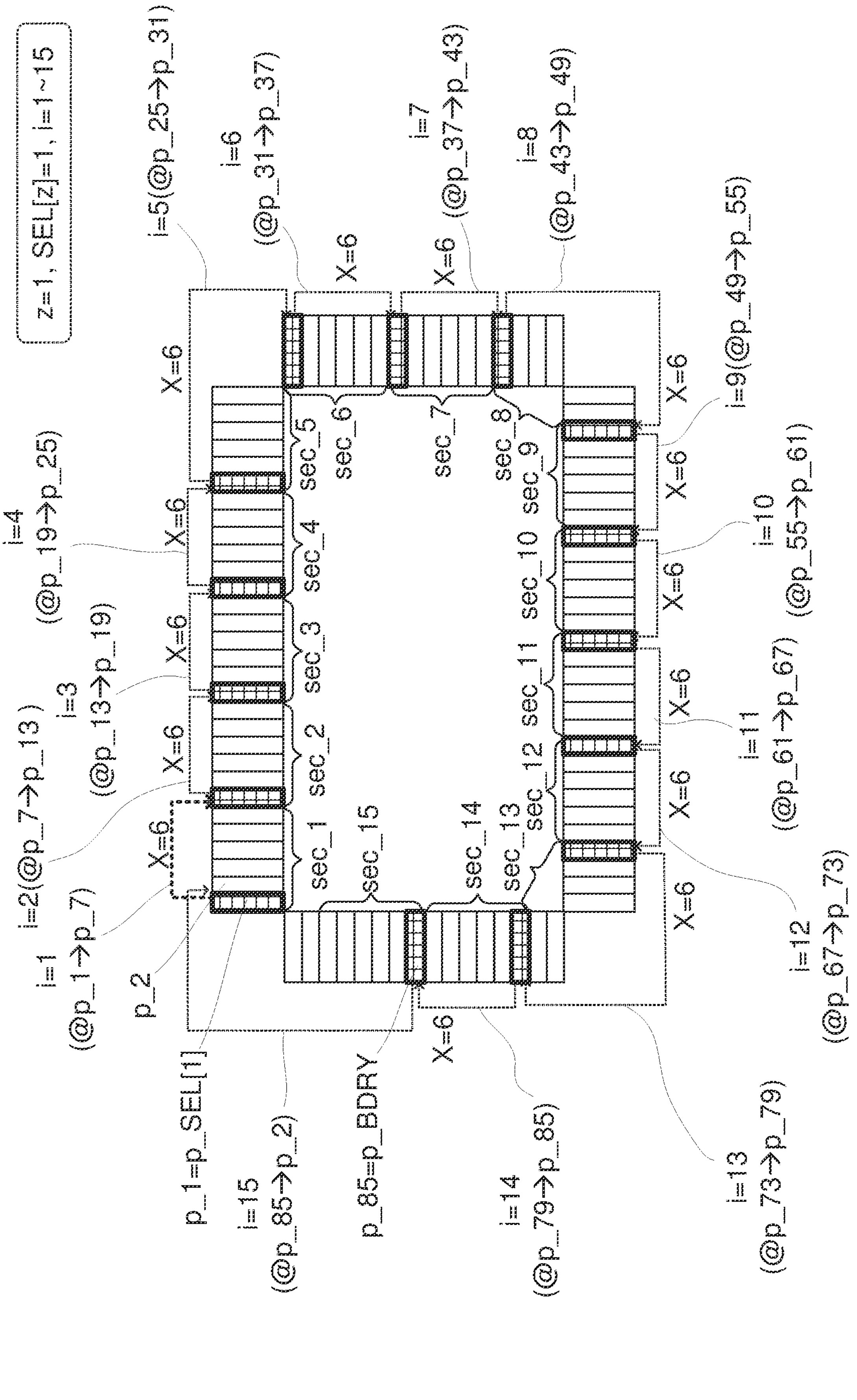
FIGS. 12A and 12B are schematic diagrams showing that the buffers buf[1]~buf[91] are selected as the ith delayed gating lines (i=1~91) between the gate-controlled elements p_1~p_92 on condition that the gate-controlled element p_1 is selected as the layout loop-initialization position p_INIT (that is, p_INIT=p_1) wherein Y=15 delayed gating lines (i=1~15) are routed according to Type B during Z=1 layout loop and remained (K−1−Y)=76 delayed gating lines (i=16~91) are routed according to Type A except for the delayed gating lines crossing different routing sections.
Figure 12B:
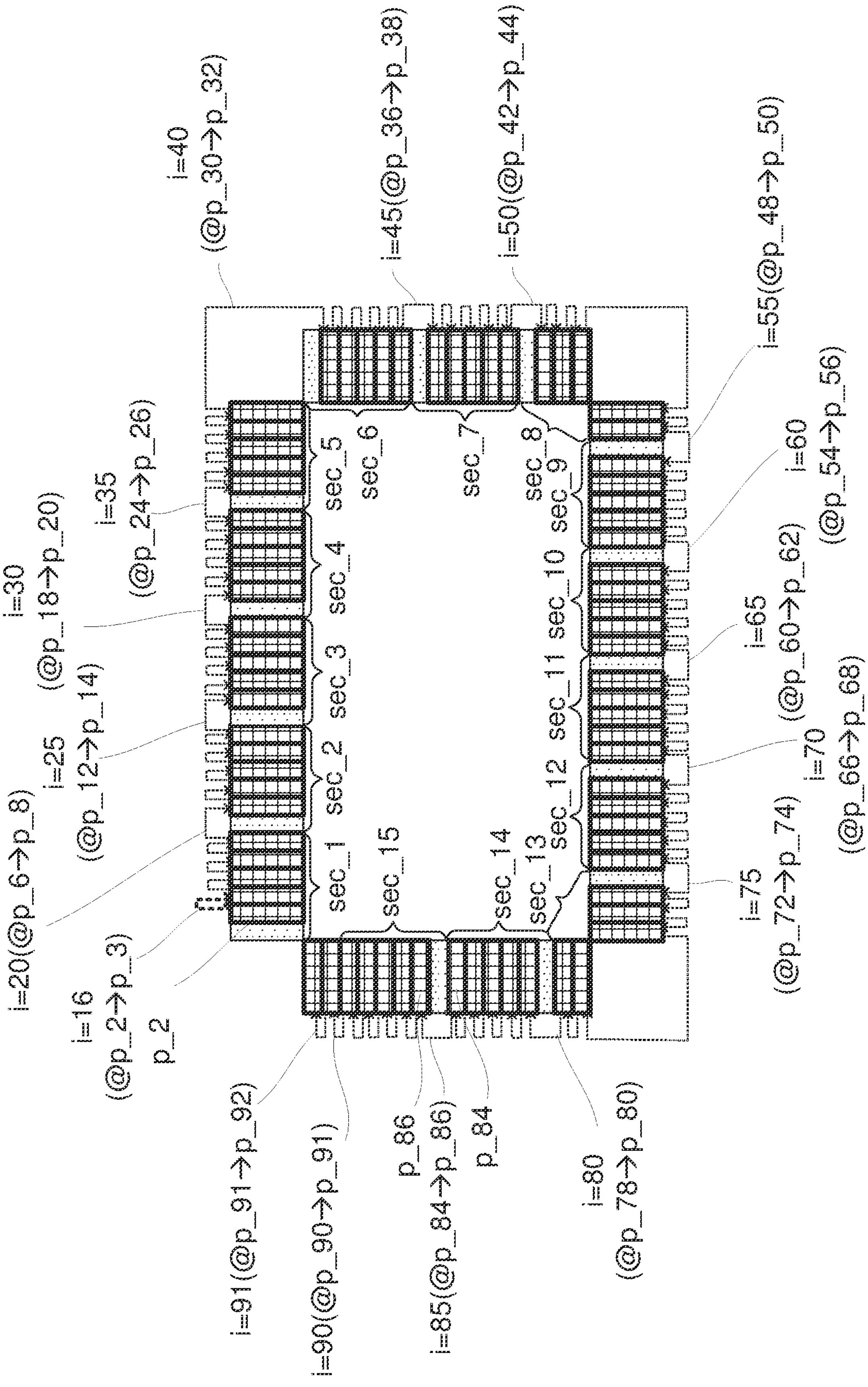

For example, in FIGS. 12A and 12B, the gate-controlled element p_85 is a boundary position p_BDRY (p_BDRY=p_85), and the two delayed gating lines (i=14, 15) ends at and starts at the gate-controlled element p_85 have a length of X=6 gate-controlled elements and 9(>X) gate-controlled elements, respectively. Further, in the embodiments with reference to FIGS. 13A~13G, the gate-controlled element p_86 is a boundary position p_BDRY (p_BDRY=p_86), and the two delayed gating lines (i=89, 90) end at and start at the gate-controlled element p_86 have a length of X gate-controlled element and 5(<X) gate-controlled elements. Thus, in the case of Z<X, the delayed gating line connected to and starts at the boundary position p_BDRY may have a length longer than X gate-controlled elements. In the case of Z=X, the delayed gating line connected to and starts at the boundary position p_BDRY has a length shorter than X gate-controlled elements.

FIGS. 12A and 12B are schematic diagrams showing that the ith delayed gating lines (i=1~91) are connected between the gate-controlled elements p_1~p_92 on condition that the gate-controlled element p_1 is selected as the layout loop-initialization position p_INIT (that is, p_INIT=p_1) wherein Y=15 delayed gating lines (i=1~15) are routed according to Type B during Z=1 layout loop and remained (K−1−Y)=76 delayed gating lines (i=16~91) are routed according to Type A except for the delayed gating lines crossing different routing sections. Table 7 concludes the source nodes src[1]~src[91] and the destination nodes dst[1]~dst[91] of respective delayed gating lines (i=1~91) in the embodiments with reference to FIGS. 12A and 12B.

TABLE 7

| Figure | ith delayed gating line | Source node src[i] and corresponding routing section | Destination node dst[i] and corresponding routing section |
|---|---|---|---|
| FIG. 12A | i = 1~15 (Type B) | p_1(sec_1) | p_7(sec_2) |
| | | p_7(sec_2) | p_13(sec_3) |
| | | p_13(sec_3) | p_19(sec_4) |
| | | p_19(sec_4) | p_25(sec_5) |
| | | p_25(sec_5) | p_31(sec_6) |
| | | p_31(sec_6) | p_37(sec_7) |
| | | p_37(sec_7) | p_43(sec_8) |
| | | p_43(sec_8) | p_49(sec_9) |
| | | p_49(sec_9) | p_55(sec_10) |
| | | p_55(sec_10) | p_61(sec_11) |
| | | p_61(sec_11) | p_67(sec_12) |
| | | p_67(sec_12) | p_73(sec_13) |
| | | p_73(sec_13) | p_79(sec_14) |
| | | p_79(sec_14) | p_85(sec_15) |
| | | p_85(sec_15) | p_2(sec_1) |
| FIG. 12B | i = 16~19, | p_2(sec_1)~p_5(sec_1) | p_3(sec_1)~p_6(sec_1) |
| | 21~24, | p_8(sec_2)~p_11(sec_2) | p_9(sec_2)~p_12(sec_2) |
| | 26~29, | p_14(sec_3)~p_17(sec_3) | p_15(sec_3)~p_18(sec_3) |
| | 31~34, | p_20(sec_4)~p_23(sec_4) | p_21(sec_4)~p_24(sec_4) |
| | 36~39, | p_26(sec_5)~p_29(sec_5) | p_27(sec_5)~p_30(sec_5) |
| | 41~44, | p_32(sec_6)~p_35(sec_6) | p_33(sec_6)~p_36(sec_6) |
| | 46~49, | p_38(sec_7)~p_41(sec_7) | p_39(sec_7)~p_42(sec_7) |
| | 51~54, | p_44(sec_8)~p_47(sec_8) | p_45(sec_8)~p_48(sec_8) |
| | 56~59, | p_50(sec_9)~p_53(sec_9) | p_51(sec_9)~p_54(sec_9) |
| | 61~64, | p_56(sec_10)~p_59(sec_10) | p_57(sec_10)~p_60(sec_10) |
| | 66~69, | p_62(sec_11)~p_65(sec_11) | p_63(sec_11)~p_66(sec_11) |
| | 71~74, | p_68(sec_12)~p_71(sec_12) | p_69(sec_12)~p_72(sec_12) |
| | 76~79, | p_74(sec_13)~p_77(sec_13) | p_75(sec_13)~p_78(sec_13) |
| | 81~84, | p_80(sec_14)~p_83(sec_14) | p_81(sec_14)~p_84(sec_14) |
| | 86~91 | p_86(sec_15)~p_89(sec_15) | p_87(sec_15)~p_90(sec_15) |
| | (Type A) | p_90(sec_15) | p_91(--) |
| | (Within a single section) | p_91(--) | p_92(--) |
| | i = 20, 25, | p_6(sec_1) | p_8(sec_2) |
| | 30, 35, | p_12(sec_2) | p_14(sec_3) |
| | 40, 45 | p_18(sec_3) | p_20(sec_4) |
| | 50, 55, | p_24(sec_4) | p_26(sec_5) |
| | 60, 65, | p_30(sec_5) | p_32(sec_6) |
| | 70, 75, | p_36(sec_6) | p_38(sec_7) |
| | 80, 85 | p_42(sec_7) | p_44(sec_8) |
| | (Type B) | p_48(sec_8) | p_50(sec_9) |
| | (Crossing | p_54(sec_9) | p_56(sec_10) |
| | different | p_60(sec_10) | p_62(sec_11) |
| | sections) | p_66(sec_11) | p_68(sec_12) |
| | | p_72(sec_12) | p_74(sec_13) |
| | | p_78(sec_13) | p_80(sec_14) |
| | | p_84(sec_14) | p_86(sec_15) |

Please refer to FIG. 12A and Table 7 together. FIG. 12A shows that Y=15 delayed gating lines (i=1~15) are routed according to Type B during the first layout loop (z=1). The layout of delayed gating lines in FIG. 12A is the same as that in FIG. 9A.

It is to be noted that the source node src[15] of the ith delayed gating line (i=15) is located at the fourth side of the circuit block BLK_q, but the destination node dst[15] is located at the first side of the circuit block BLK_q. Therefore, one circulation along the edge of the circuit block BLK_q is complete after the ith delayed gating line (i=15) is connected. At this time, the zth layout loop (z=1) in which the delayed gating lines are routed according to Type B is complete, as shown in FIG. 12A.

It can be seen from FIG. 12A that, after the zth layout loop (z=1) in which the delayed gating lines are routed according to Type B, (K−1)−Y=91−15=76 delayed gating lines (i=16~91) have not been routed. Among the 16 gate-controlled elements p_1, p_7, p_13, p_19, p_25, p_31, p_37, p_43, p_49, p_55, p_61, p_67, p_73, p_79, p_85, p_2 selected for routing the ith delayed gating lines (i=1~15), every gate-controlled element except the gate-controlled elements p_1, p_2 is selected as the destination node dst[i] of the ith delayed gating line and selected as the source node src[i+1] of the (i+1)th delayed gating line. The gate-controlled element p_1 for receiving the block-enabling signal EN_q is only used as the source node src[1] without being used as the destination node. On the other hand, the gate-controlled element p_2 is only used as the destination node dst[15] without being used as the source node during the first layout loop (z=1) when the delayed gating lines are routed according to Type B. On condition that Z=1, the unselected gate-controlled elements p_3~p_6, p_8~p_12, p_14~p_18, p_20~p_24, p_26~p_30, p_32~p_36, p_38~p_42, p_44~p_48, p_50~p_54, p_56~p_60, p_62~p_66, p_68~p_72, p_74~p_78, p_80~p_84, p_86~p_92 are now used for routing the delayed gating lines within the same routing section (i=16~19, 21~24, 26~29, 31~34, 36~39, 41~44, 46~49, 51~54, 56~59, 61~64, 66~69, 71~74, 76~79, 81~84, 86~91) according to Type A or used for routing the delayed gating lines crossing different routing sections (i=20, 25, 30, 35, 40, 45, 50, 55, 60, 65, 70, 75, 80, 85) according to Type B.

In FIG. 12A, the distance between the gate-controlled element p_85 selected as the destination node dst[14] and the gate-controlled element p_79 selected as the source node src[14] is X=6 gate-controlled elements. On the other hand, the distance between the gate-controlled element p_85 selected as the source node src[15] and the gate-controlled element p_2 selected as the destination node dst[15] is 9 gate-controlled elements. Hence, the gate-controlled element p_90 is viewed as a boundary position p_BDRY connected to two delayed gating lines of inequivalent length.

Please refer to both FIG. 12B and Table 7. The layout method of FIG. 12B determines the ith delayed gating lines (i=16~91) according to Type A and Type B. Firstly, the gate-controlled elements p_2 and p_3 are selected as the source node src[16], and the destination node dst[16] of the ith delayed gating line (i=16), respectively. Then, the ith delayed gating lines (i=17~91) are connected between the gate-controlled elements p_3~p_6, p_8~p_12, p_14~p_18, p_20~p_24, p_26~p_30, p_32~p_36, p_38~p_42, p_44~p_48, p_50~p_54, p_56~p_60, p_62~p_66, p_68~p_72, p_74~p_78, p_80~p_84, p_86~p_92. For example, the gate-controlled elements p_3 and p_4 are selected as the source node src[17], and the destination node dst[17] of the ith delayed gating line (i=17), respectively, and so forth.

Please refer to FIGS. 12A and 12B together. In FIG. 12A, the ith delayed gating line (i=15) connected between the gate-controlled elements p_85 and p_2 is routed according to Type B; and in FIG. 12B, the ith delayed gating line (i=16) connected between the gate-controlled elements p_2 and p_3 is routed according to Type A. Therefore, the gate-controlled element p_2 is selected as the destination node dst[15] of the ith delayed gating line (i=15) in FIG. 12A, and selected as the source node src[16] of the ith delayed gating line (i=16) in FIG. 12B. If the layout loop-initialization position p_INIT=p_1, X=6, and Z=1, the gate-controlled element p_2 is viewed as a boundary position p_BDRY connected to two delayed gating lines of inequivalent length.

In practical applications, the layout method could route the delayed gating lines according to Type B during several layout loops and then route the delayed gating lines within the same routing sections according to Type A. In addition, the delayed gating lines crossing different routing sections are routed according to Type B, if any. The embodiments with reference to FIGS. 13A~13G and 15A~15G will be given to describe the layout methods that route the delayed gating lines according to Type B during Z=6 layout loops and then route the delayed gating lines according to Type A. The number of the layout loops (Z) in which the delayed gating lines are routed according to Type B has a range of 1~X (that is, 1≤Z≤X).

FIGS. 13A~13G are schematic diagrams showing that the ith delayed gating lines (i=1~91) between the gate-controlled elements p_1~p_92 are connected on condition that the gate-controlled element p_1 is selected as the layout loop-initialization position p_INIT (that is, p_INIT=p_1) and the delayed gating lines are routed according to Type B during Z=6 layout loops wherein the position-order of the loop starting position p_SEL[1]~p_SEL[6] in the layout loops does not follow the position-order of the gate-controlled elements. Table 8 concludes the source nodes src[1]~src[91] and the destination nodes dst[1]~dst[91] of respective delayed gating lines (i=1~91) in the embodiments with reference to FIGS. 13A~13G.

TABLE 8

Figure 13A:
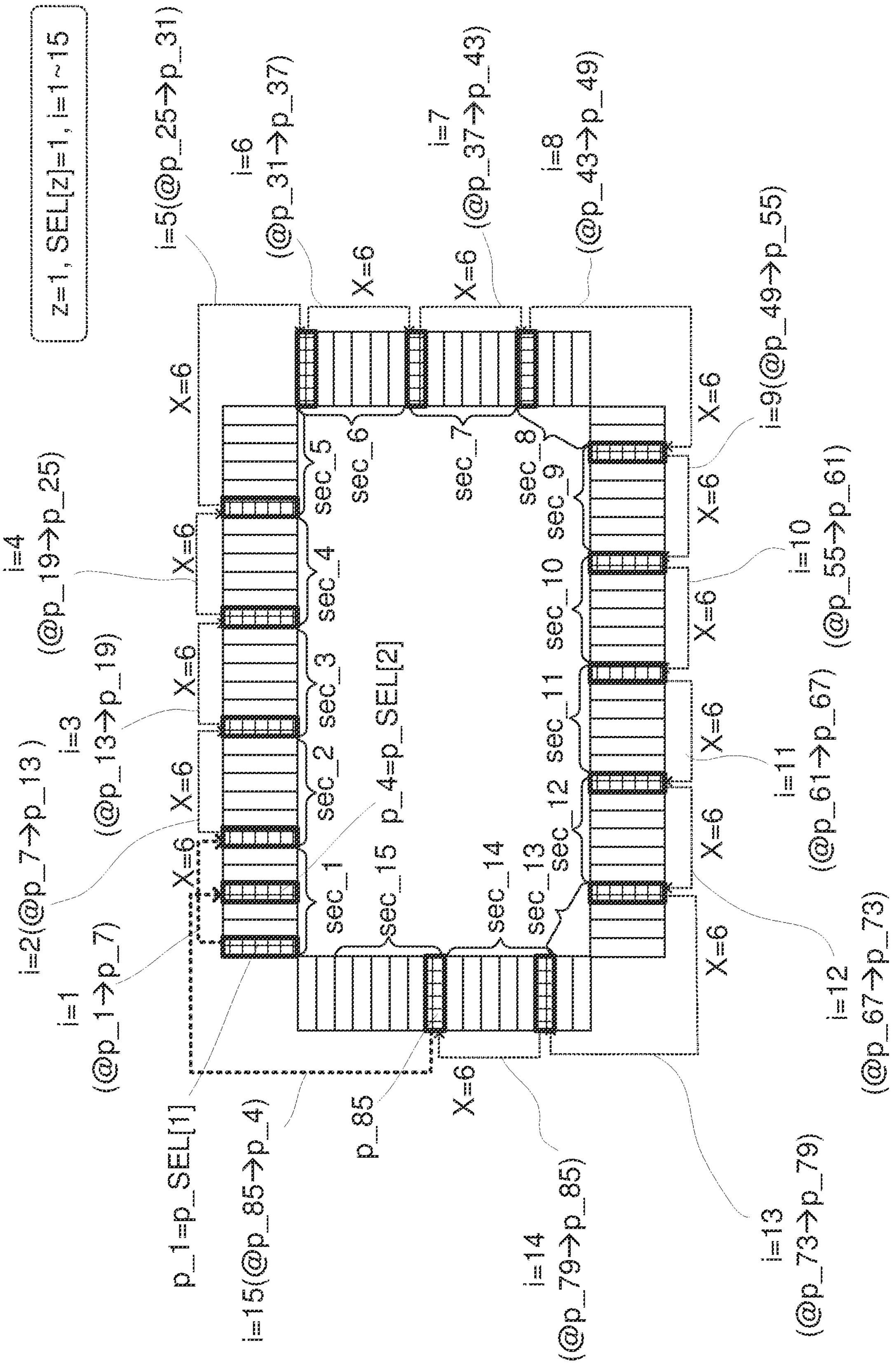
FIGS. 13A-13G are schematic diagrams showing that the buffers buf[1]~buf[91] are selected as the ith delayed gating lines (i=1~91) between the gate-controlled elements p_1~p_92 on condition that the gate-controlled element p_1 is selected as the layout loop-initialization position p_INIT (that is, p_INIT=p_1) and the delayed gating lines are routed according to Type B during Z=6 layout loops wherein the position-order of the loop starting positions p_SEL[1]~p_SEL[6] does not conform with the position-order of the gate-controlled elements.
Figure 13B:
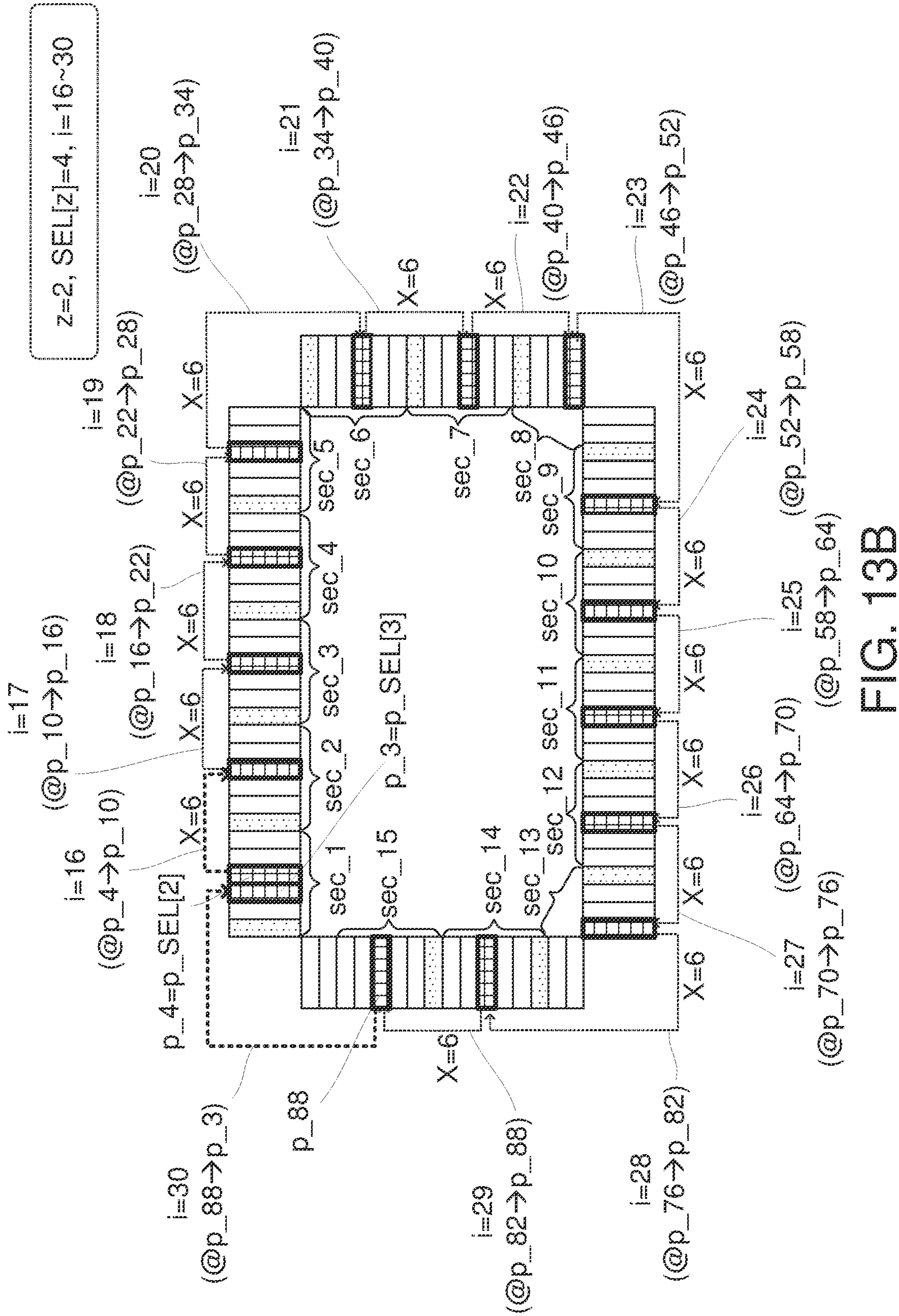
Figure 13C:
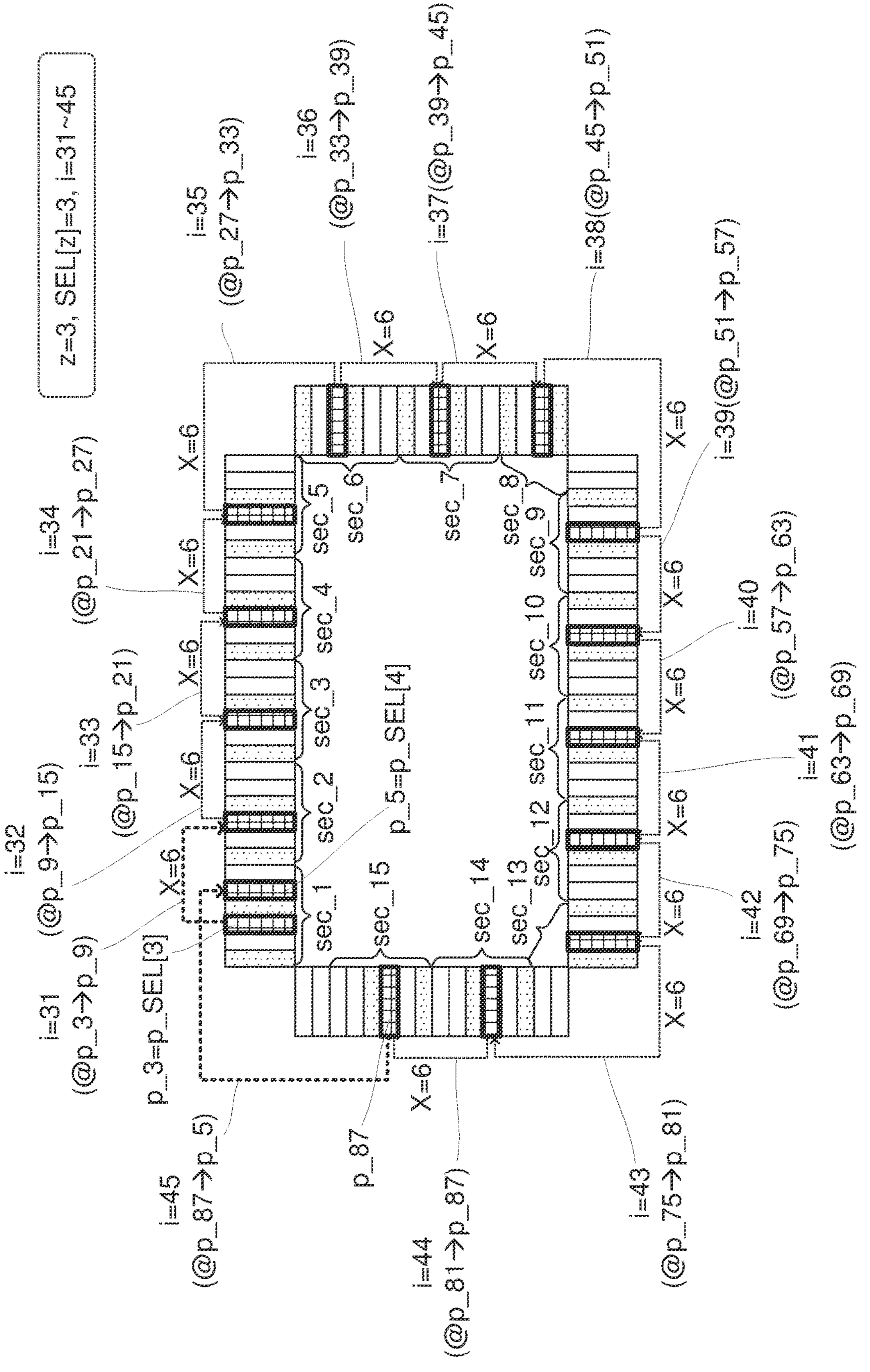
Figure 13D:
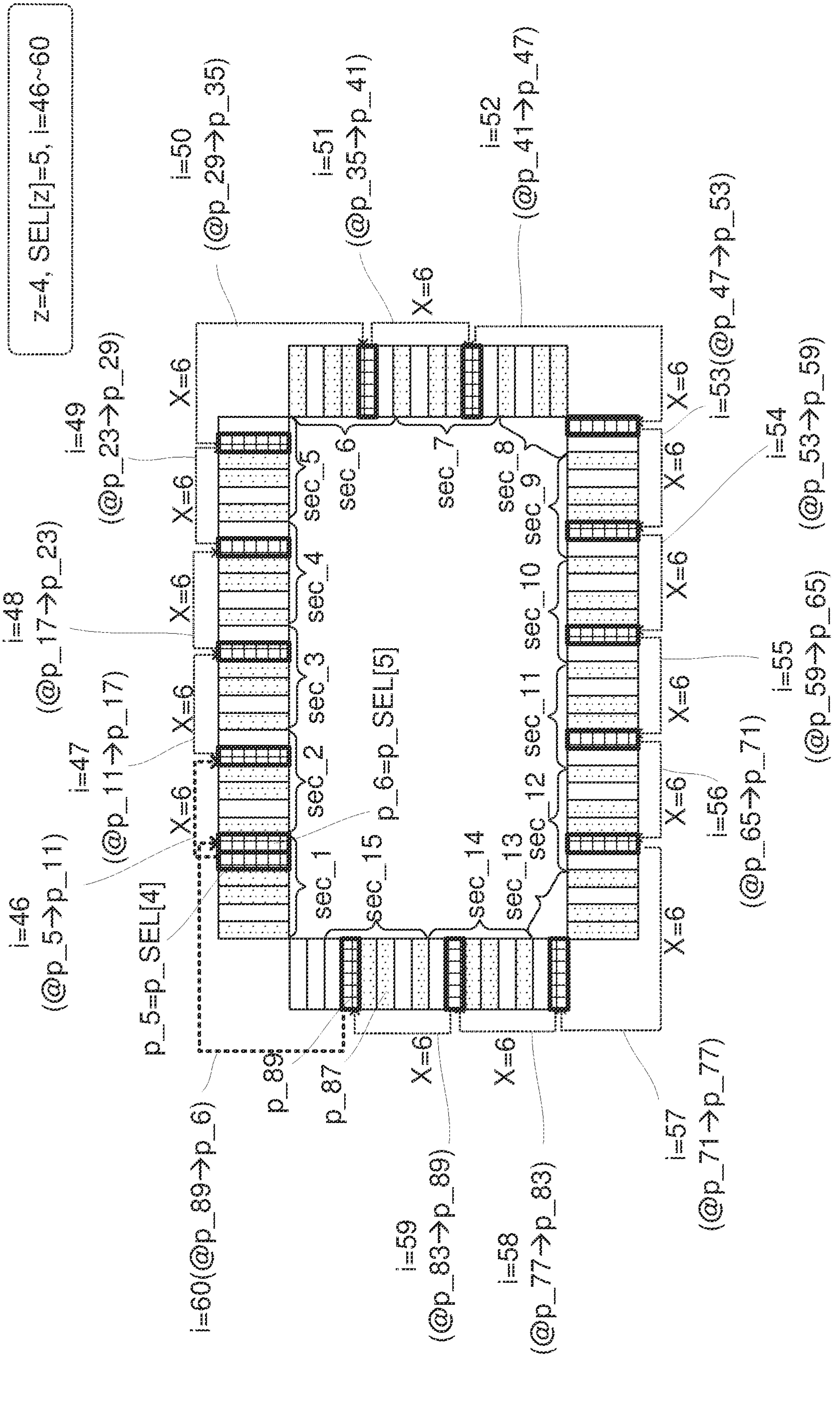

| Figure | ith delayed gating line | Source node src[i] and corresponding routing section | Destination node dst[i] and corresponding routing section |
|---|---|---|---|
| FIG. 13A | i = 1~15 (Type B) | p_1(sec_1) | p_7(sec_2) |
| | | p_7(sec_2) | p_13(sec_3) |
| | | p_13(sec_3) | p_19(sec_4) |
| | | p_19(sec_4) | p_25(sec_5) |
| | | p_25(sec_5) | p_31(sec_6) |
| | | p_31(sec_6) | p_37(sec_7) |
| | | p_37(sec_7) | p_43(sec_8) |
| | | p_43(sec_8) | p_49(sec_9) |
| | | p_49(sec_9) | p_55(sec_10) |
| | | p_55(sec_10) | p_61(sec_11) |
| | | p_61(sec_11) | p_67(sec_12) |
| | | p_67(sec_12) | p_73(sec_13) |
| | | p_73(sec_13) | p_79(sec_14) |
| | | p_79(sec_14) | p_85(sec_15) |
| | | p_85(sec_15) | p_4(sec_1) |
| FIG. 13B | i = 16~30 (Type B) | p_4(sec_1) | p_10(sec_2) |
| | | p_10(sec_2) | p_16(sec_3) |
| | | p_16(sec_3) | p_22(sec_4) |
| | | p_22(sec_4) | p_28(sec_5) |
| | | p_28(sec_5) | p_34(sec_6) |
| | | p_34(sec_6) | p_40(sec_7) |
| | | p_40(sec_7) | p_46(sec_8) |
| | | p_46(sec_8) | p_52(sec_9) |
| | | p_52(sec_9) | p_58(sec_10) |
| | | p_58(sec_10) | p_64(sec_11) |
| | | p_64(sec_11) | p_70(sec_12) |
| | | p_70(sec_12) | p_76(sec_13) |
| | | p_76(sec_13) | p_82(sec_14) |
| | | p_82(sec_14) | p_88(sec_15) |
| | | p_88(sec_15) | p_3(sec_1) |
| FIG. 13C | i = 31~45 (Type B) | p_3(sec_1) | p_9(sec_2) |
| | | p_9(sec_2) | p_15(sec_3) |
| | | p_15(sec_3) | p_21(sec_4) |
| | | p_21(sec_4) | p_27(sec_5) |
| | | p_27(sec_5) | p_33(sec_6) |
| | | p_33(sec_6) | p_39(sec_7) |
| | | p_39(sec_7) | p_45(sec_8) |
| | | p_45(sec_8) | p_51(sec_9) |
| | | p_51(sec_9) | p_57(sec_10) |
| | | p_57(sec_10) | p_63(sec_11) |
| | | p_63(sec_11) | p_69(sec_12) |
| | | p_69(sec_12) | p_75(sec_13) |
| | | p_75(sec_13) | p_81(sec_14) |
| | | p_81(sec_14) | p_87(sec_15) |
| | | p_87(sec_15) | p_5(sec_1) |
| FIG. 13D | i = 46~60 (Type B) | p_5(sec_1) | p_11(sec_2) |
| | | p_11(sec_2) | p_17(sec_3) |
| | | p_17(sec_3) | p_23(sec_4) |
| | | p_23(sec_4) | p_29(sec_5) |
| | | p_29(sec_5) | p_35(sec_6) |

TABLE 8-continued

Figure 13E:
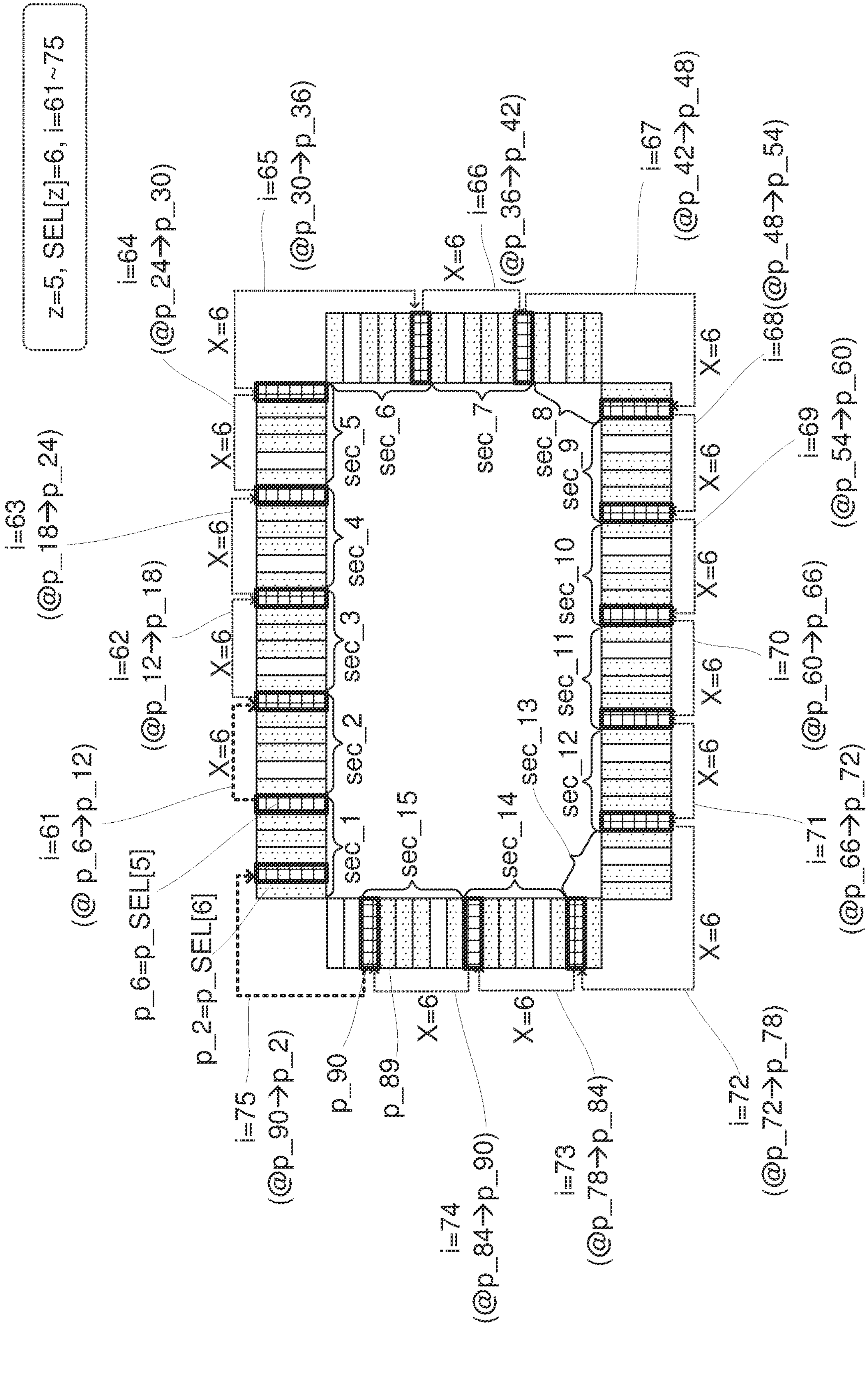
Figure 13F:
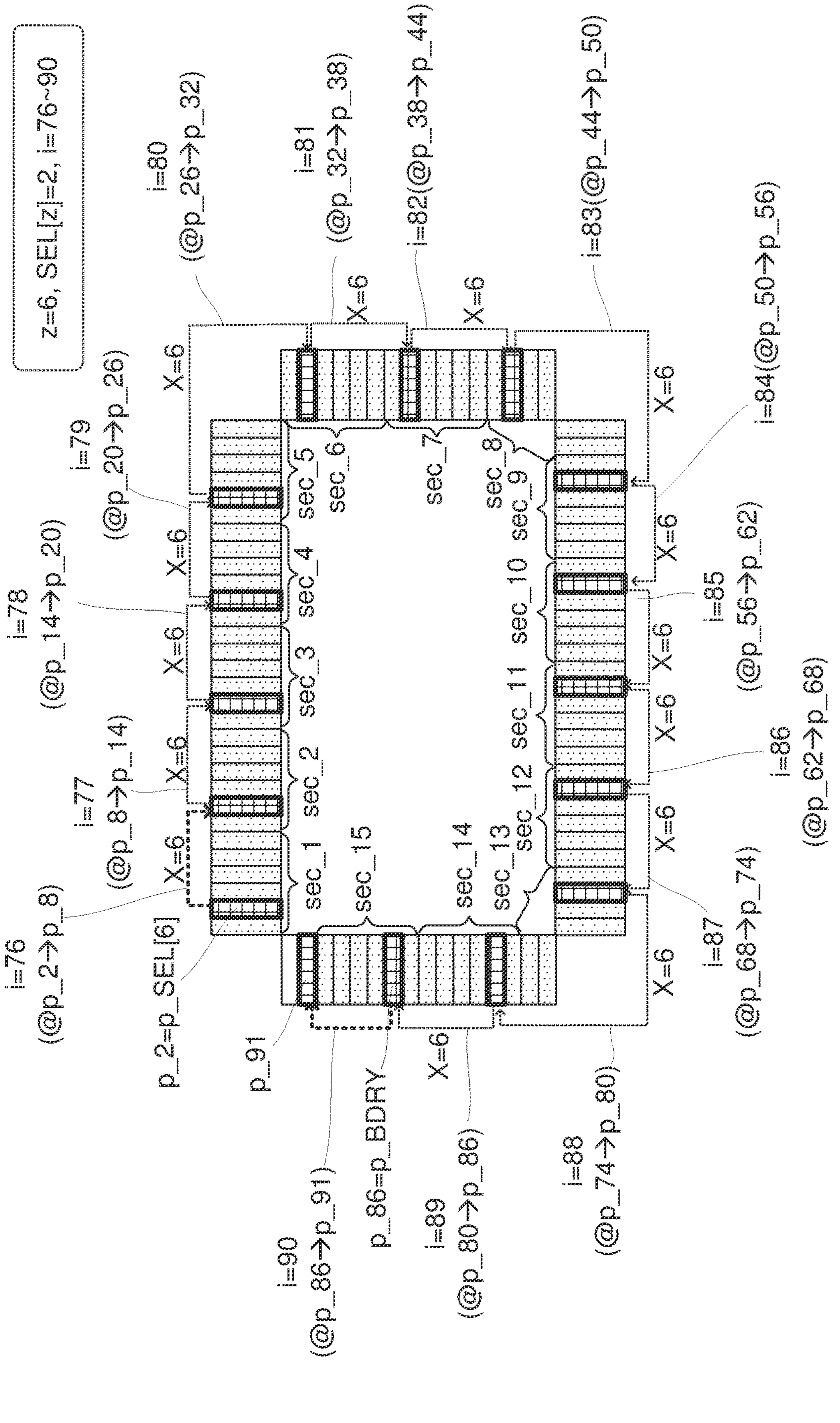
Figure 13G:
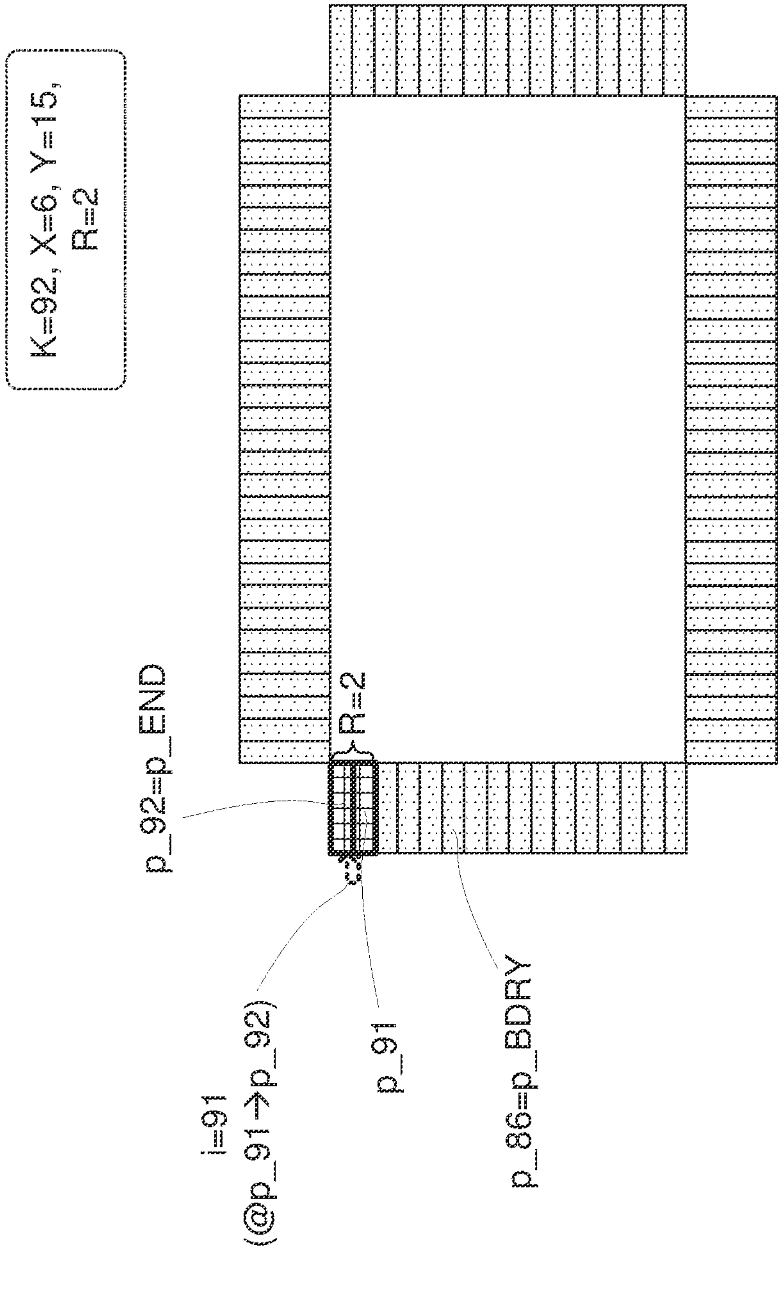

| Figure | ith delayed gating line | Source node src[i] and corresponding routing section | Destination node dst[i] and corresponding routing section |
|---|---|---|---|
| | | p_35(sec_6) | p_41(sec_7) |
| | | p_41(sec_7) | p_47(sec_8) |
| | | p_47(sec_8) | p_53(sec_9) |
| | | p_53(sec_9) | p_59(sec_10) |
| | | p_59(sec_10) | p_65(sec_11) |
| | | p_65(sec_11) | p_71(sec_12) |
| | | p_71(sec_12) | p_77(sec_13) |
| | | p_77(sec_13) | p_83(sec_14) |
| | | p_83(sec_14) | p_89(sec_15) |
| | | p_89(sec_15) | p_6(sec_1) |
| FIG. 13E | i = 61~75 (Type B) | p_6(sec_1) | p_12(sec_2) |
| | | p_12(sec_2) | p_18(sec_3) |
| | | p_18(sec_3) | p_24(sec_4) |
| | | p_24(sec_4) | p_30(sec_5) |
| | | p_30(sec_5) | p_36(sec_6) |
| | | p_36(sec_6) | p_42(sec_7) |
| | | p_42(sec_7) | p_48(sec_8) |
| | | p_48(sec_8) | p_54(sec_9) |
| | | p_54(sec_9) | p_60(sec_10) |
| | | p_60(sec_10) | p_66(sec_11) |
| | | p_66(sec_11) | p_72(sec_12) |
| | | p_72(sec_12) | p_78(sec_13) |
| | | p_78(sec_13) | p_84(sec_14) |
| | | p_84(sec_14) | p_90(sec_15) |
| | | p_90(sec_15) | p_2(sec_1) |
| FIG. 13F | i = 76~90 (Type B) | p_2(sec_1) | p_8(sec_2) |
| | | p_8(sec_2) | p_14(sec_3) |
| | | p_14(sec_3) | p_20(sec_4) |
| | | p_20(sec_4) | p_26(sec_5) |
| | | p_26(sec_5) | p_32(sec_6) |
| | | p_32(sec_6) | p_38(sec_7) |
| | | p_38(sec_7) | p_44(sec_8) |
| | | p_44(sec_8) | p_50(sec_9) |
| | | p_50(sec_9) | p_56(sec_10) |
| | | p_56(sec_10) | p_62(sec_11) |
| | | p_62(sec_11) | p_68(sec_12) |
| | | p_68(sec_12) | p_74(sec_13) |
| | | p_74(sec_13) | p_80(sec_14) |
| | | p_80(sec_14) | p_86(sec_15) |
| | | p_86(sec_15) | p_91(--) |
| FIG. 13G | i = 91 (Type A) | p_91(--) | p_92(--) |

In a concise manner, the disclosure only describes how to select the gate-controlled elements to route the first delayed gating lines (that is, i=(z−1)*Y+1) and the last delayed gating lines (that is, i=z*Y) according to Type B during the zth layout loops (z=1~6), and these delayed gating lines are indicated by thicker dotted arrows in FIGS. 13A~13F. In the diagrams, the thicker dotted arrows indicate the delayed gating lines routed according to Type B during the zth layout loops (z=1~6), wherein the source nodes src are located in the routing sections sec_1, sec_15; and the thinner dotted arrows indicate the delayed gating lines routed during the zth layout loops wherein the source nodes are located in the routing sections sec_2~sec_14.

FIG. 13A shows the delayed gating lines routed according to Type B during the zth layout loop (z=1). In the embodiment, during the zth layout loop (z=1) when the delayed gating lines are routed according to Type B, the gate-controlled element p_1 is selected as the loop starting position p_SEL[1] (that is, p_SEL[1]=p_1). Thus, for the delayed gating lines being routed according to Type B in the zth layout loop (z=1), the gate-controlled elements p_1 and p_7 are respectively selected as the source node src[1] and the destination node dst[1] of the ith delayed gating line (i=1) starting from the routing section sec_1; and the gate-controlled elements p_85 and p_4 are respectively selected as the source node src[15] and the destination node dst[15] of the ith delayed gating line (i=15) starting from the routing section sec_15. The gate-controlled element p_4 will be selected as the source node src[16] of the ith delayed gating line (i=16) during the zth layout loop (z=2) when the delayed gating lines are routed according to Type B.

FIG. 13B shows the delayed gating lines routed according to Type B during the zth layout loop (z=2). In the embodiment, during the zth layout loop (z=2) when the delayed gating lines are routed according to Type B, the gate-controlled element p_4 is selected as the loop starting position p_SEL[2] (that is, p_SEL[2]=p_4). Thus, during the zth layout loop (z=2) when the delayed gating lines are routed according to Type B, the gate-controlled elements p_4 and p_10 are respectively selected as the source node src[16] and the destination node dst[16] of the ith delayed gating line (i=16) starting from the routing section sec_1; and the gate-controlled elements p_88 and p_3 are respectively as the source node src[30] and the destination node dst[30] of the ith delayed gating line (i=30) starting from the routing section sec_15. The gate-controlled element p_3 will be selected as the source node src[31] of the ith delayed gating line (i=31) during the zth layout loop (z=3) when the delayed gating lines are routed according to Type B.

FIG. 13C shows the delayed gating lines routed according to Type B during the zth layout loop (z=3). In the embodiment, during the zth layout loop (z=3) when the delayed gating lines are routed according to Type B, the gate-controlled element p_3 is selected as the loop starting position p_SEL[3] (that is, p_SEL[3]=p_3). Thus, during the zth layout loop (z=3) when the delayed gating lines are routed according to Type B, the gate-controlled elements p_3 and p_9 are respectively selected as the source node src[31] and the destination node dst[31] of the ith delayed gating line (i=31) starting from the routing section sec_1; and the gate-controlled elements p_87 and p_5 are respectively selected as the source node src[45], and the destination node dst[45] of the ith delayed gating line (i=45) starting from the routing section sec_15. The gate-controlled element p_5 will be selected as the source node src[46] of the ith delayed gating line (i=46) during the zth layout loop (z=4) when the delayed gating lines are routed according to Type B.

FIG. 13D shows the delayed gating lines routed according to Type B during the zth layout loop (z=4). In the embodiment, during the zth layout loop (z=4) when the delayed gating lines are routed according to Type B, the gate-controlled element p_5 is selected as the loop starting position p_SEL[4] (that is, p_SEL[4]=p_5). Thus, during the zth layout loop (z=4) when the delayed gating lines are routed according to Type B, the gate-controlled elements p_5 and p_11 are respectively selected as the source node src[46] and the destination node dst[46] of the ith delayed gating line (i=46) starting from the routing section sec_1; and the gate-controlled elements p_89 and p_6 are respectively selected as the source node src[60], and the destination node dst[60] of the ith delayed gating line (i=60) starting from the routing section sec_15. The gate-controlled element p_6 will be selected as the source node src[61] of the ith delayed gating line (i=61) during the zth layout loop (z=5) when the delayed gating lines are routed according to Type B.

FIG. 13E shows the delayed gating lines routed according to Type B during the zth layout loop (z=5). In the embodiment, during the zth layout loop (z=5) when the delayed gating lines are routed according to Type B, the gate-controlled element p_6 is selected as the loop starting position p_SEL[5] (that is, p_SEL[5]=p_6). Thus, during the zth layout loop (z=5) when the delayed gating lines are routed according to Type B, the gate-controlled elements p_6 and p_12 are respectively selected as the source node src[61] and the destination node dst[61] of the ith delayed gating line (i=61) starting from the routing section sec_1; and the gate-controlled elements p_90 and p_2 are respectively selected as the source node src[75] and the destination node dst[75] of the ith delayed gating line (i=75) starting from the routing section sec_15. The gate-controlled element p_2 will be selected as the source node src[76] of the ith delayed gating line (i=76) during the zth layout loop (z=6) when the delayed gating lines are routed according to Type B.

FIG. 13F shows the delayed gating lines routed according to Type B during the zth layout loop (z=6). In the embodiment, during the zth layout loop (z=6) when the delayed gating lines are routed according to Type B, the gate-controlled element p_2 is selected as the loop starting position p_SEL[6] (that is, p_SEL[6]=p_2). Thus, during the zth layout loop (z=6) when the delayed gating lines are routed according to Type B, the gate-controlled elements p_2 and p_8 are respectively selected as the source node src[76] and the destination node dst[76] of the ith delayed gating line (i=76) starting from the routing section sec_1; and the gate-controlled elements p_86 and p_91 are respectively selected as the source node src[90], and the destination node dst[90] of the ith delayed gating line (i=90) starting from the routing section sec_15. The gate-controlled element p_91 will be selected as the source node src[91] of the ith delayed gating line (i=91) during the layout loop when the delayed gating lines are routed according to Type A.

After the ith delayed gating line (i=90) is connected, the remaining unselected gate-controlled elements cannot form the delayed gating lines having a length of X=5 gate-controlled elements. At this time, according to the positions of the gate-controlled elements and the order of routing the delayed gating lines, the gate-controlled elements p_85, p_87 immediately adjacent to the gate-controlled element p_86 have been selected as the delayed gating lines. Therefore, after the gate-controlled element p_86 is selected as the destination node dst[89], the delayed gating line cannot be routed according to Type A by selecting the gate-controlled element p_86 as the source node src[89]. As shown in FIG. 13F, the ith delayed gating line (i=90) is connected between the gate-controlled element p_86 and the gate-controlled element p_91.

In FIG. 13F, when the gate-controlled element p_86 is selected as the destination node dst[89] of the ith delayed gating line (i=89), the distance between the gate-controlled element p_86 and the gate-controlled element p_80 selected as the source node src[89] of the ith delayed gating line (i=89) is X=6 gate-controlled elements. On the other hand, when the gate-controlled element p_86 is selected as the source node src[90] of the ith delayed gating line (i=90), the distance between the gate-controlled element p_86 and the gate-controlled element p_91 selected as the destination node dst[90] of the ith delayed gating line (i=90) is only 5 (<X) gate-controlled elements. Because the ith delayed gating line (i=91) will be routed according to Type A, the gate-controlled element p_86 is viewed as a boundary position p_BDRY connected to two delayed gating lines of inequivalent length.

From the comparison between FIGS. 9A~9F and 13A~13F, during the zth layout loops (z=1~6) when the delayed gating lines are routed according to Type B as shown in FIGS. 9A~9F, the ordered loop starting positions p_SEL[1]~p_SEL[6] corresponding to the layout loops are successive gate-controlled elements in the routing section sec_1. On the other hand, during the zth layout loops (z=1~6) when the delayed gating lines are routed according to Type B as shown in FIGS. 13A~13F, the ordered loop starting selection positions p_SEL[1]~p_SEL[6] corresponding to the layout loops are not successive gate-controlled elements (that is, in random position-order) in the routing section sec_1. It is to be noted that although the loop starting positions p_SEL[1]~p_SEL[6] in the two sets of embodiments are not completely the same, the gate-controlled elements selected as the loop starting positions p_SEL[1]~p_SEL[6] are all located in the routing section sec_1. Table 9 shows the selection of the loop starting positions p_SEL[z] in FIGS. 9A~9F and 13A~13F.

TABLE 9

| | FIGS. 9A~9G | FIGS. 13A~13G |
|---|---|---|
| | Layout loop-initialization position p_INIT p_INIT = p_1 | |
| Gate-controlled elements of loop starting positions p_SEL[1]~p_SEL[6] | Successive delay gate-controlled elements | Non-successive delay gate-controlled elements |
| p_SEL[1] of layout loop (z = 1) (Type B) | FIG. 9A p_SEL[1] = p_1 | FIG. 13A p_SEL[1] = p_1 |
| p_SEL[2] of layout loop (z = 2) (Type B) | FIG. 9B p_SEL[2] = p_2 | FIG. 13B p_SEL[2] = p_4 |
| p_SEL[3] of layout loop (z = 3) (Type B) | FIG. 9C p_SEL[3] = p_3 | FIG. 13C p_SEL[3] = p_3 |
| p_SEL[4] of layout loop (z = 4) (Type B) | FIG. 9D p_SEL[4] = p_4 | FIG. 13D p_SEL[4] = p_5 |
| p_SEL[5] of layout loop (z = 5) (Type B) | FIG. 9E p_SEL[5] = p_5 | FIG. 13E p_SEL[5] = p_6 |
| p_SEL[6] of layout loop (z = 6) (Type B) | FIG. 9F p_SEL[6] = p_6 | FIG. 13F p_SEL[6] = p_2 |
| Number of gate-controlled elements at the fourth side for routing delayed gating line (Type A) R = (K − ((INIT − 1) + Y*X)) | 3 (p_90, p_91, p_92) | 2 (p_91, p_92) |

During the zth layout loops (z=1~6) when the delayed gating lines are routed according to Type B, the layout of the delayed gating lines between the gate-controlled elements p_1~p_90 could be different due to different selections of the loop starting positions p_SEL[z]. For example, the ith delayed gating line (i=90) is connected between the gate-controlled elements p_90 and p_91 in FIG. 9F; and the ith delayed gating line (i=90) is connected between the gate-controlled elements p_86 and p_91 in FIG. 13F.

The destination node dst[90] of the ith delayed gating line (i=90) is the gate-controlled element p_91 in both FIGS. 9F and 13F. Especially, the gate-controlled element p_91 is connected to the gate-controlled element p_90 selected as the source node src[90] in FIG. 9F, and the gate-controlled element p_91 is connected to the gate-controlled element p_86 selected as the source node src[90] in FIG. 13F. Accordingly, the gate-controlled elements selected as the loop starting positions p_SEL[z] may affect the position of the gate-controlled element selected as the boundary position p_BDRY. It could be seen from the comparison between FIGS. 9A~9F and 13A~13F that no delayed gating line is connected between the gate-controlled elements p_91 and p_92 after the layout loops regardless of the selection of the loop starting positions p_SEL[z]. Therefore, the ith delayed gating line (i=91) uses the gate-controlled element p_91 as the source node src[91] and the gate-controlled element p_92 as the destination node dst[91] in both FIGS. 9G and 13G.

In the embodiments with reference to FIGS. 13A~13G, the layout loop-initialization position p_INIT is the gate-controlled element p_1. Hence, after the Z=6 layout loops, the gate-controlled elements p_91 and 92 have not been selected as the destination node dst[i] regardless of the section of the loop starting position p_SEL[z]. In practical applications, the loop starting position p_SEL[1] is not limited to the gate-controlled element p_1. Instead, the loop starting position p_SEL[1] could select any one of the X=6 gate-controlled elements p_1~p_6 in the routing section sec_1. Such modification can be derived from the above description and is not repeated herein.

In the above embodiments, the case of the layout loop-initialization position p_INIT=p_1=p_SEL[1] is given. In practical applications, the layout loop-initialization position p_INIT may be any one of the gate-controlled elements p_1~p_30 at the first side. According to the embodiments in FIGS. 14 and 15A~15G, the gate-controlled element p_4 is selected as the layout loop-initialization position p_INIT (that is, p_INIT=p_4).

Figure 14:
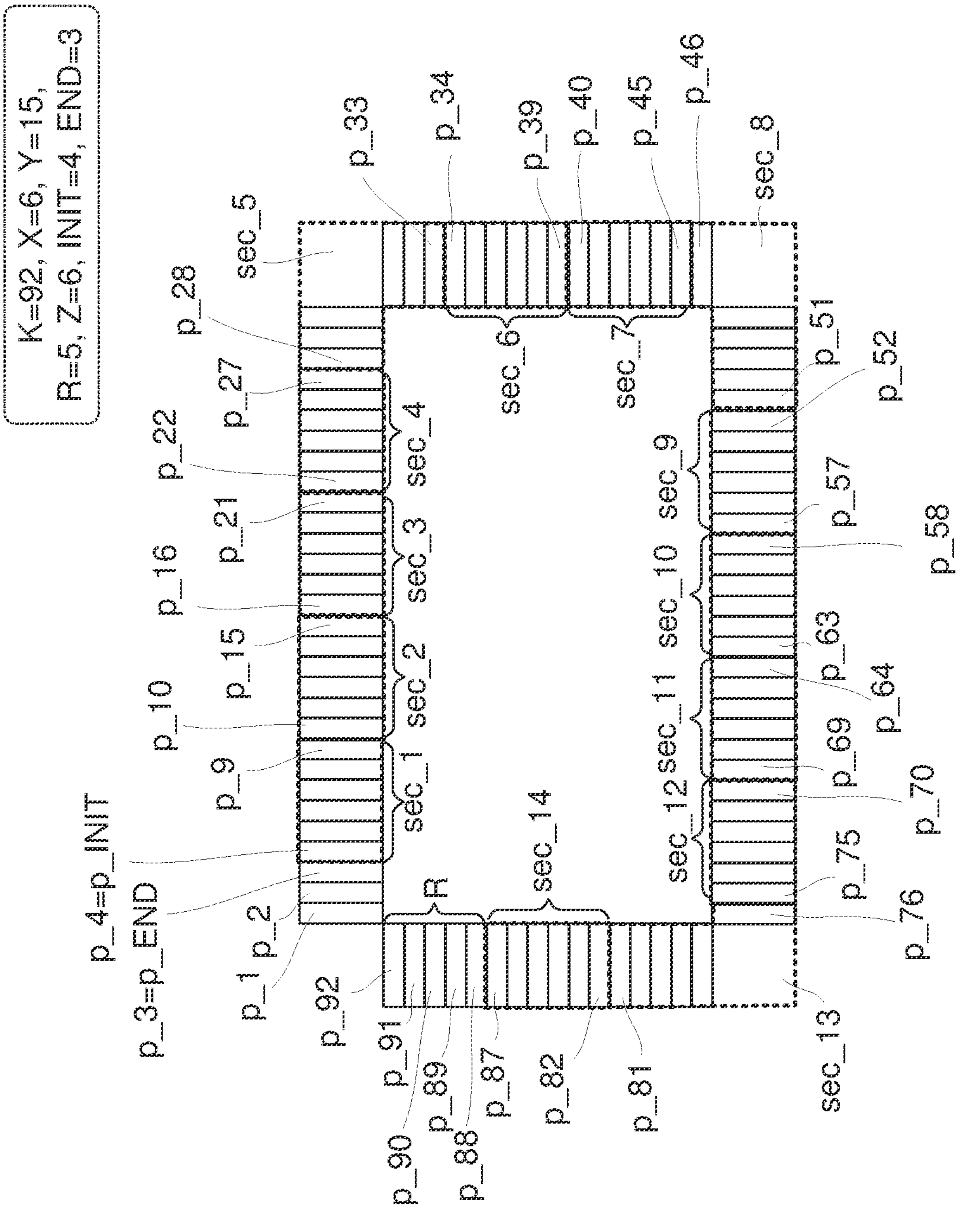
FIG. 14 is a schematic diagram showing that the gate-controlled elements are divided into routing sections sec_1~sec_15 on condition that K=92, X=6, and the gate-controlled element p_4 is selected as the layout loop-initialization position p_INIT (that is, p_INIT=p_4).

FIG. 14 is a schematic diagram showing that the gate-controlled elements are divided into routing sections sec_1~sec_15 on condition that K=92, X=6, and the gate-controlled element p_4 is selected as the layout loop-initialization position p_INIT (that is, p_INIT=p_4). In FIG. 14, the gate-controlled element p_4 is selected as the layout loop-initialization position p_INIT (that is, p_INIT=p_4), and the gate-controlled element p_3 is the layout loop-end position p_END (that is, p_END=p_3) accordingly. Table 10 concludes the gate-controlled elements p_1~p_92 of respective routing sections sec_1~sec_14 in the embodiment with reference to FIG. 14.

TABLE 10

| Gate-controlled element | Routing section |
|---|---|
| p_1, p_2, p_3 | — |
| p_4~p_9 | sec_1 |
| p_10~p_15 | sec_2 |
| p_16~p_21 | sec_3 |
| p_22~p_27 | sec_4 |
| p_28~p_33 | sec_5 |
| p_34~p_39 | sec_6 |
| p_40~p_45 | sec_7 |
| p_46~p_51 | sec_8 |
| p_52~p_57 | sec_9 |
| p_58~p_63 | sec_10 |
| p_64~p_69 | sec_11 |
| p_70~p_75 | sec_12 |
| p_76~p_81 | sec_13 |
| p_82~p_87 | sec_14 |
| p_88, p_89, p_90, p_91, p_92 | — |

Please refer to both Table 10 and FIG. 14. It could be seen from Table 10 and FIG. 14 that when the gate-controlled element p_4 is selected as the layout loop-initialization position p_INIT (that is, p_INIT=p_4) on condition that K=92 and X=6, there are X*Y=6*14=84 gate-controlled elements p_4~p_87, among the K=92 gate-controlled elements p_1~p_92 on the edge of the circuit block BLK_q, corresponding to the Y=14 routing sections sec_1~sec_14. The remaining K−X*Y=92−84=8 gate-controlled elements p_88~p_92 and p_1~p_3 do not belong to any routing section.

FIGS. 15A~15G are schematic diagrams showing that the ith delayed gating lines (i=1~91) are connected between the gate-controlled elements p_1~p_92 on condition that the gate-controlled element p_4 is selected as the layout loop-initialization position p_INIT (that is, p_INIT=p_4), and the delayed gating lines are routed according to Type B during Z=6 layout loops. Table 11 concludes the source nodes src[1]~src[91] and the destination nodes dst[1]~dst[91] of the ith delayed gating lines (i=1~91) in the embodiments with reference to FIGS. 15A~15G.

TABLE 11

Figure 15A:
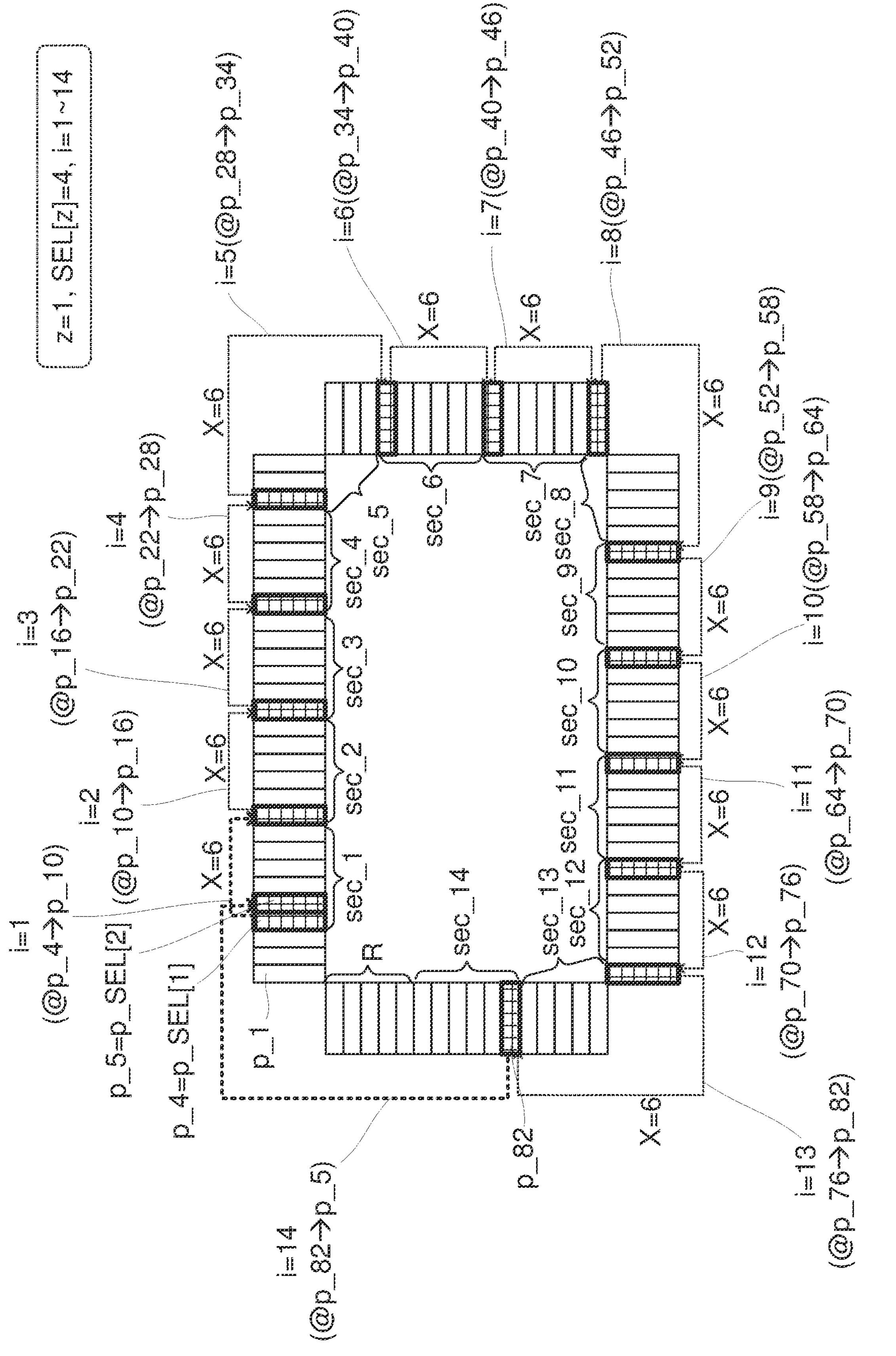
FIGS. 15A-15G are schematic diagrams showing that the buffers buf[1]~buf[91] are selected as the ith delayed gating lines (i=1~91) between the gate-controlled elements p_1~p_92 on condition that the gate-controlled element p_4 is selected as the layout loop-initialization position p_INIT (that is, p_INIT=p_4) and the delayed gating lines are routed according to Type B during Z=6 layout loops.
Figure 15B:
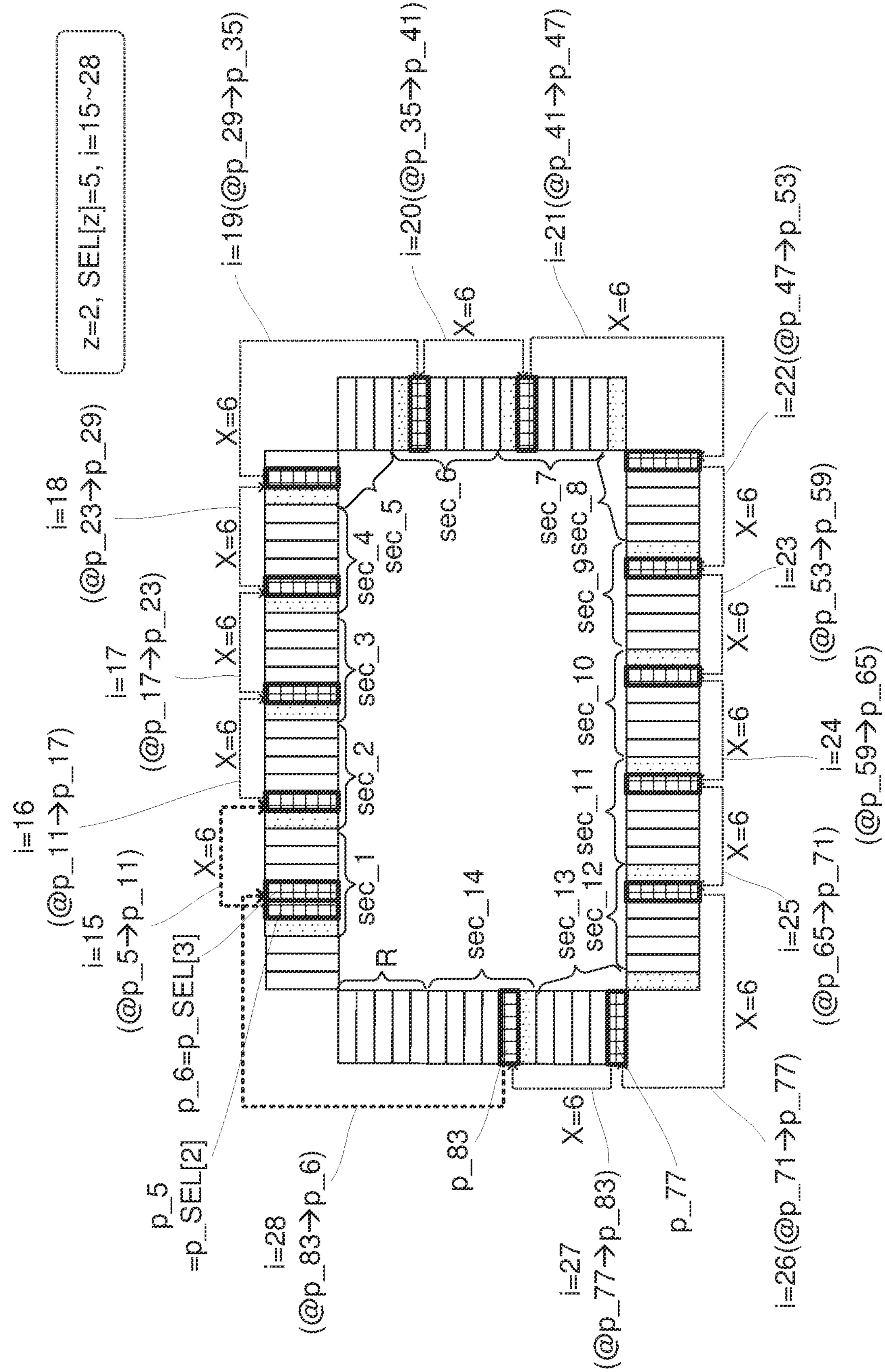

| Figure | ith delayed gating line | Source node src[i] and corresponding routing section | Destination node dst[i] and corresponding routing section |
|---|---|---|---|
| FIG. 15A | i = 1~14 (Type B) | p_4(sec_1) | p_10(sec_2) |
| | | p_10(sec_2) | p_16(sec_3) |
| | | p_16(sec_3) | p_22(sec_4) |
| | | p_22(sec_4) | p_28(sec_5) |
| | | p_28(sec_5) | p_34(sec_6) |
| | | p_34(sec_6) | p_40(sec_7) |
| | | p_40(sec_7) | p_46(sec_8) |
| | | p_46(sec_8) | p_52(sec_9) |
| | | p_52(sec_9) | p_58(sec_10) |
| | | p_58(sec_10) | p_64(sec_11) |
| | | p_64(sec_11) | p_70(sec_12) |
| | | p_70(sec_12) | p_76(sec_13) |
| | | p_76(sec_13) | p_82(sec_14) |
| | | p_82(sec_14) | p_5(sec_1) |
| FIG. 15B | i = 15~28 (Type B) | p_5(sec_1) | p_11(sec_2) |
| | | p_11(sec_2) | p_17(sec_3) |
| | | p_17(sec_3) | p_23(sec_4) |
| | | p_23(sec_4) | p_29(sec_5) |
| | | p_29(sec_5) | p_35(sec_6) |
| | | p_35(sec_6) | p_41(sec_7) |
| | | p_41(sec_7) | p_47(sec_8) |
| | | p_47(sec_8) | p_53(sec_9) |
| | | p_53(sec_9) | p_59(sec_10) |
| | | p_59(sec_10) | p_65(sec_11) |
| | | p_65(sec_11) | p_71(sec_12) |

TABLE 11-continued

Figure 15C:
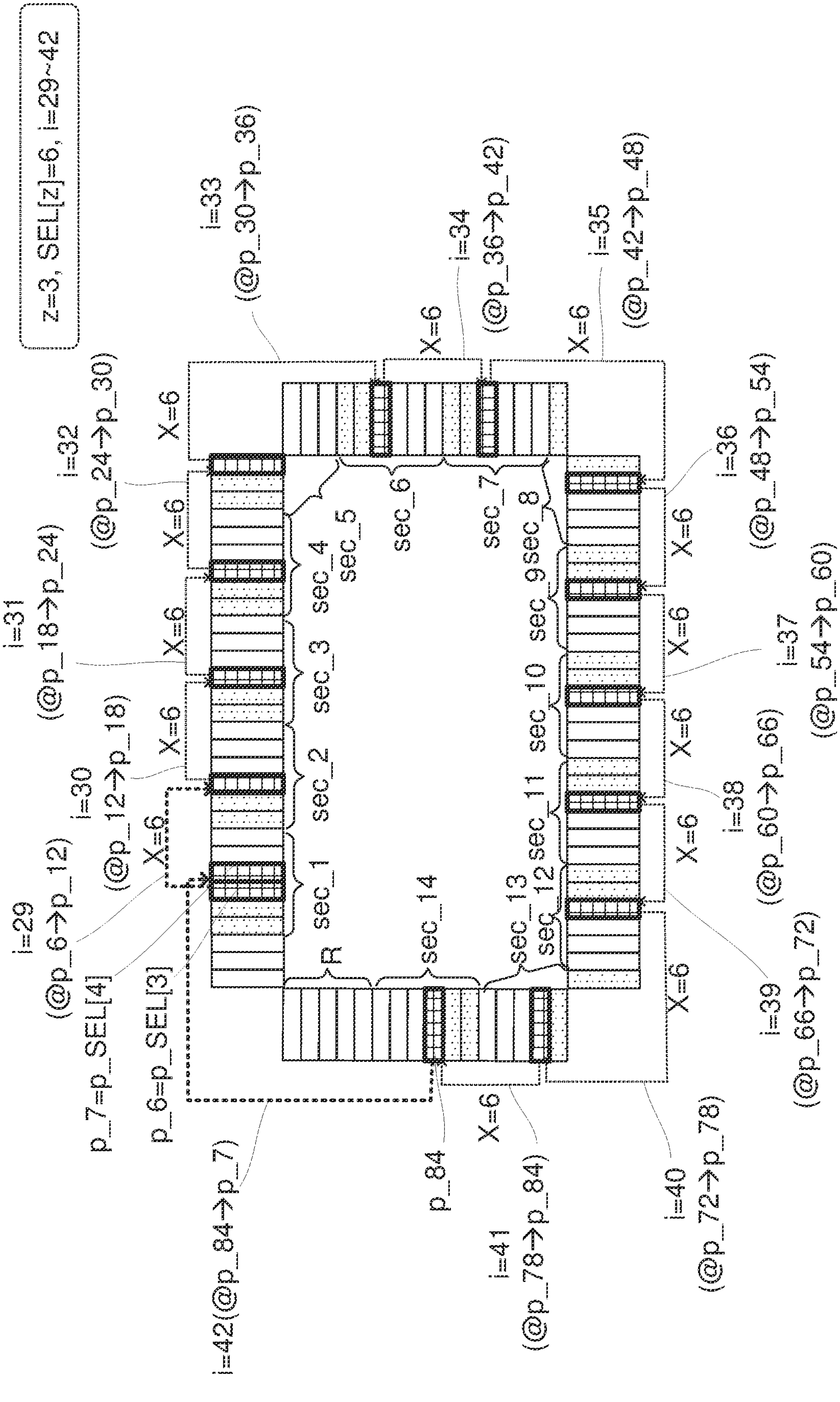
Figure 15D:
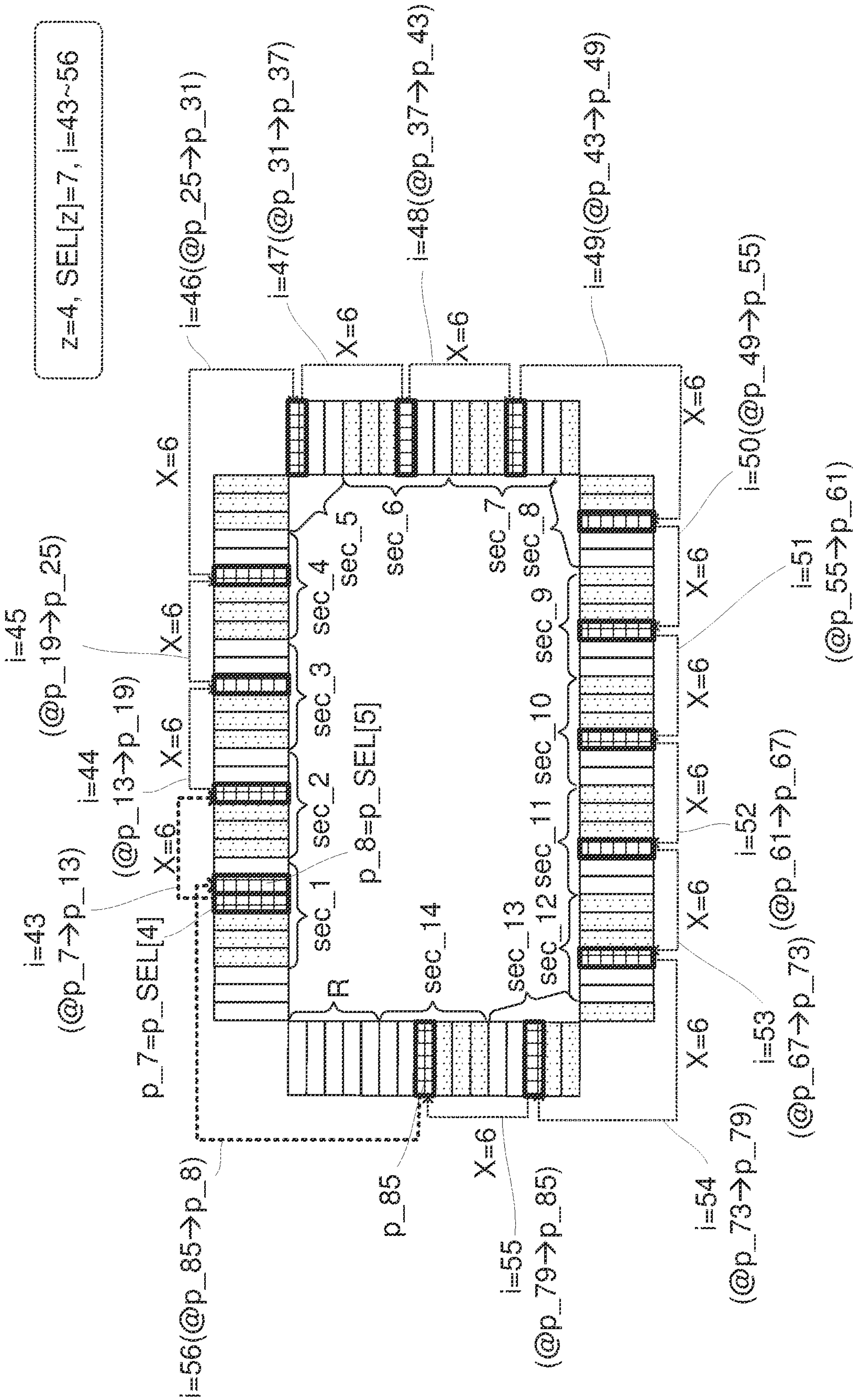
Figure 15E:
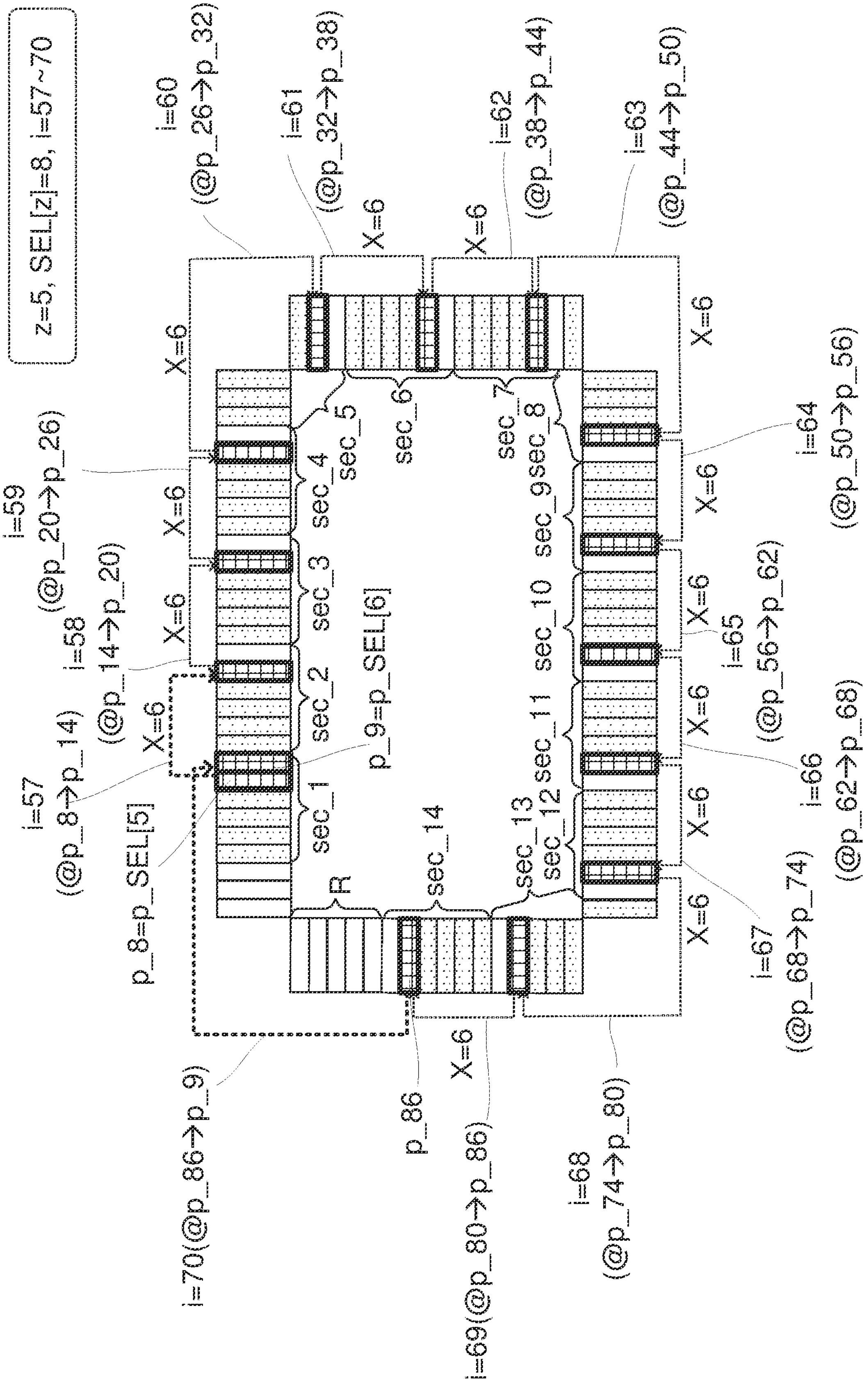
Figure 15F:
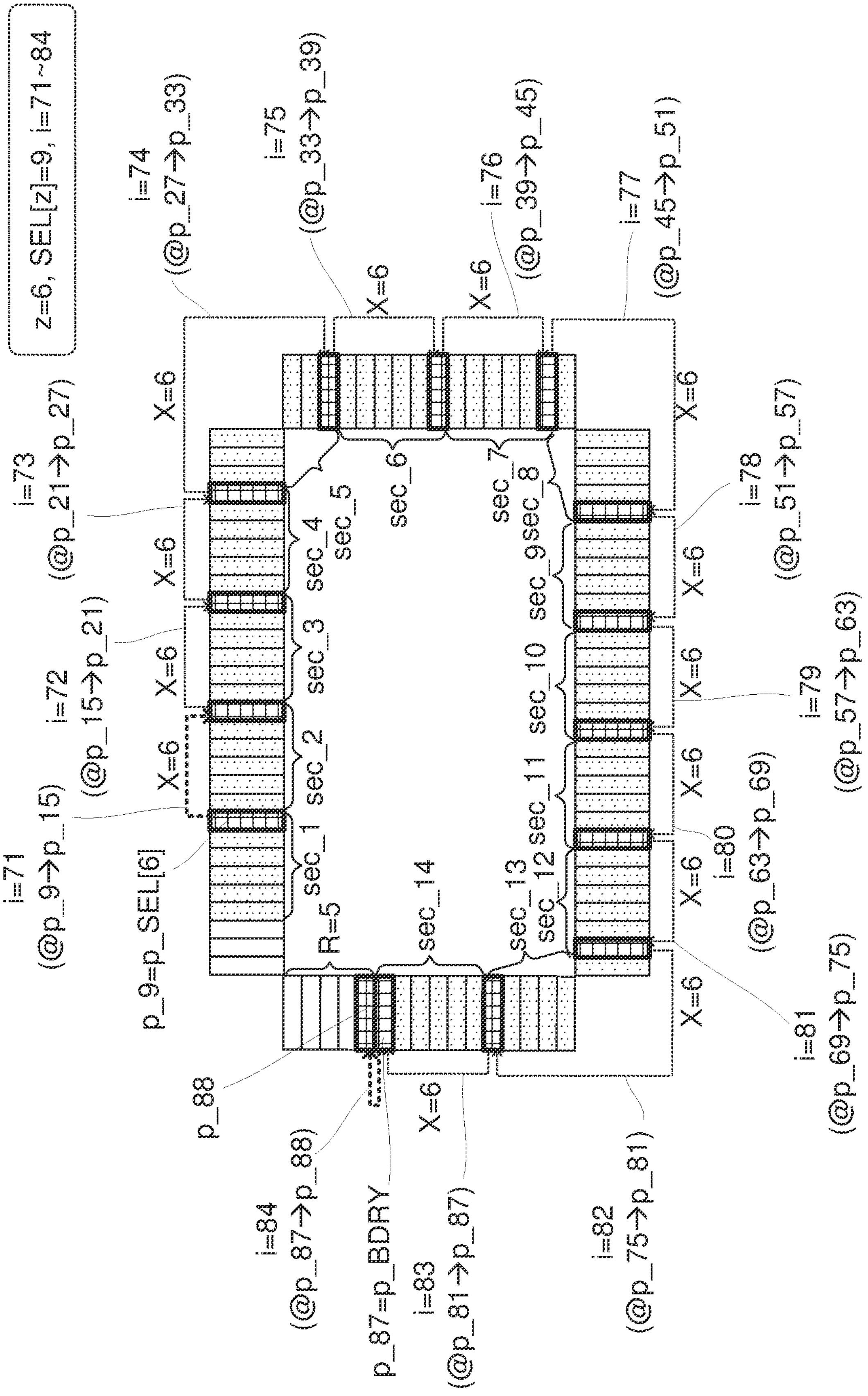
Figure 15G:
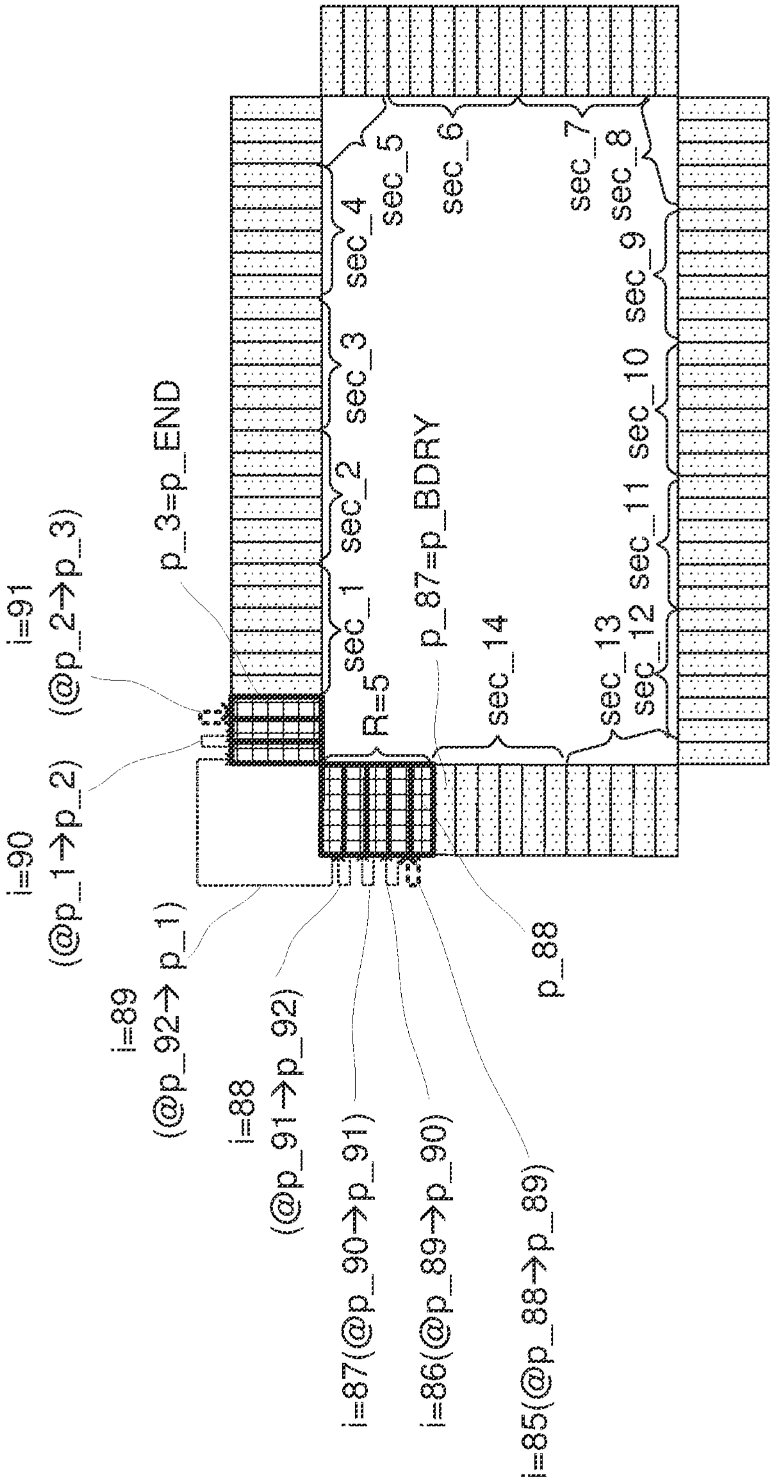

| Figure | ith delayed gating line | Source node src[i] and corresponding routing section | Destination node dst[i] and corresponding routing section |
|---|---|---|---|
| | | p_71(sec_12) | p_77(sec_13) |
| | | p_77(sec_13) | p_83(sec_14) |
| | | p_83(sec_14) | p_6(sec_1) |
| FIG. 15C | i = 29~42 (Type B) | p_6(sec_1) | p_12(sec_2) |
| | | p_12(sec_2) | p_18(sec_3) |
| | | p_18(sec_3) | p_24(sec_4) |
| | | p_24(sec_4) | p_30(sec_5) |
| | | p_30(sec_5) | p_36(sec_6) |
| | | p_36(sec_6) | p_42(sec_7) |
| | | p_42(sec_7) | p_48(sec_8) |
| | | p_48(sec_8) | p_54(sec_9) |
| | | p_54(sec_9) | p_60(sec_10) |
| | | p_60(sec_10) | p_66(sec_11) |
| | | p_66(sec_11) | p_72(sec_12) |
| | | p_72(sec_12) | p_78(sec_13) |
| | | p_78(sec_13) | p_84(sec_14) |
| | | p_84(sec_14) | p_7(sec_1) |
| FIG. 15D | i = 43~56 (Type B) | p_7(sec_1) | p_13(sec_2) |
| | | p_13(sec_2) | p_19(sec_3) |
| | | p_19(sec_3) | p_25(sec_4) |
| | | p_25(sec_4) | p_31(sec_5) |
| | | p_31(sec_5) | p_37(sec_6) |
| | | p_37(sec_6) | p_43(sec_7) |
| | | p_43(sec_7) | p_49(sec_8) |
| | | p_49(sec_8) | p_55(sec_9) |
| | | p_55(sec_9) | p_61(sec_10) |
| | | p_61(sec_10) | p_67(sec_11) |
| | | p_67(sec_11) | p_73(sec_12) |
| | | p_73(sec_12) | p_79(sec_13) |
| | | p_79(sec_13) | p_85(sec_14) |
| | | p_85(sec_14) | p_8(sec_1) |
| FIG. 15E | i = 57~70 (Type B) | p_8(sec_1) | p_14(sec_2) |
| | | p_14(sec_2) | p_20(sec_3) |
| | | p_20(sec_3) | p_26(sec_4) |
| | | p_26(sec_4) | p_32(sec_5) |
| | | p_32(sec_5) | p_38(sec_6) |
| | | p_38(sec_6) | p_44(sec_7) |
| | | p_44(sec_7) | p_50(sec_8) |
| | | p_50(sec_8) | p_56(sec_9) |
| | | p_56(sec_9) | p_62(sec_10) |
| | | p_62(sec_10) | p_68(sec_11) |
| | | p_68(sec_11) | p_74(sec_12) |
| | | p_74(sec_12) | p_80(sec_13) |
| | | p_80(sec_13) | p_86(sec_14) |
| | | p_86(sec_14) | p_9(sec_1) |
| FIG. 15F | i = 71~84 (Type B) | p_9(sec_1) | p_15(sec_2) |
| | | p_15(sec_2) | p_21(sec_3) |
| | | p_21(sec_3) | p_27(sec_4) |
| | | p_27(sec_4) | p_33(sec_5) |
| | | p_33(sec_5) | p_39(sec_6) |
| | | p_39(sec_6) | p_45(sec_7) |
| | | p_45(sec_7) | p_51(sec_8) |
| | | p_51(sec_8) | p_57(sec_9) |
| | | p_57(sec_9) | p_63(sec_10) |
| | | p_63(sec_10) | p_69(sec_11) |
| | | p_69(sec_11) | p_75(sec_12) |
| | | p_75(sec_12) | p_81(sec_13) |
| | | p_81(sec_13) | p_87(sec_14) |
| | | p_87(sec_14) | p_88(--) |
| FIG. 15G | i = 85~91 (Type A) | p_88(--) | p_89(--) |
| | | p_89(--) | p_90(--) |
| | | p_90(--) | p_91(--) |
| | | p_91(--) | p_92(--) |
| | | p_92(--) | p_1(--) |
| | | p_1(--) | p_2(--) |
| | | p_2(--) | p_3(--) |

The layout in FIGS. 15A~15G can be derived from the description of the layout in FIGS. 9A~9G, and is not repeated herein. The difference between the embodiments with reference to FIGS. 15A~15G and FIGS. 9A~9G is that the gate-controlled element p_4 is selected as the layout loop-initialization position p_INIT (that is, p_INIT=p_4) in FIGS. 15A~15G. Even though the condition of X=6 gate-controlled elements is unchanged, the gate-controlled elements p_1~p_92 are divided into only Y=14 routing sections sec_1~sec_14. Therefore, during the zth layout loops (z=1~6) when the delayed gating lines are routed according to Type B, only 14 delayed gating lines having the length of X=6 gate-controlled elements are routed in each layout loop. Also, the layout method routes 14*6=84 delayed gating lines (i=1~84) having the length of X=6 gate-controlled elements in FIGS. 15A~15F.

Please refer to FIG. 15F. In FIG. 15F, the ith delayed gating lines (i=71~83) are all routed according to Type B. During the zth layout loop (z=6) when the delayed gating lines are routed according to Type B, the gate-controlled element p_87 selected as the destination node dst[83] of the ith delayed gating line (i=83) is located in the routing section sec_14. That is, after the ith delayed gating line (i=83) is connected, the remaining unselected (K−X*Y)=92−6*14=8 gate-controlled elements should be connected according to Type A. Therefore, the ith delayed gating line (i=84) is connected between the neighboring gate-controlled elements p_87 and p_88.

In other words, when the gate-controlled element p_87 is selected as the destination node dst[83], the distance between the gate-controlled element p_87 and the gate-controlled element p_81 selected as the source node src[83] is X=6 gate-controlled elements. On the other hand, when the gate-controlled element p_87 is selected as the source node src[84], the gate-controlled element p_87 is immediately adjacent to the gate-controlled element p_88, as the destination node dst[84]. Therefore, the gate-controlled element p_87 is viewed as a boundary position p_BDRY connected to two delayed gating lines of inequivalent length.

Please refer to both FIG. 15G and Table 11. In FIG. 15G, the ith delayed gating lines (i=85~91) are routed according to Type A, and the gate-controlled elements p_88~p_92 and p_1~p_3 associated with the ith delayed gating lines (i=85~91) are represented by cells with lattice screentone. In FIG. 15G, the thicker dotted arrows indicate the ith delayed gating line (i=85) connected between the source node src[88]=p_88 and the destination node dst[85]=p_89, and the ith delayed gating line (i=91) connected between the source node src[91]=p_2 and the destination node dst[91]=p_3. In FIG. 15G, the thinner dotted arrows indicate the ith delayed gating lines (i=86~90).

Table 12 compares the embodiments with reference to FIGS. 9A~9G and FIGS. 15A~15G. In the two sets of embodiments, the loop starting positions p_SEL[1]~p_SEL[6] are successive gate-controlled elements located in the routing section sec_1. The layout loop-initialization positions p_INIT in FIGS. 9A~9G and FIGS. 15A~15G are the gate-controlled elements p_1 and p_4, respectively, and thus the layout of the ith delayed gating lines (i=1~91) is different in the two sets of embodiments.

TABLE 12

| | | FIGS. 9A~9G | FIGS. 15A~15G |
|---|---|---|---|
| | | Gate-controlled elements (sec_1) of loop starting positions p_SEL[1]~p_SEL[5] | |
| Gate-controlled element of layout loop-initialization position p_INIT | | p_INIT = p_1 | p_INIT = p_4 |
| Loop starting position p_SEL[z] | Layout loop (z = 1) (Type B) | FIG. 9A p_SEL[1] = p_1 | FIG. 15A p_SEL[1] = p_4 |
| | Layout loop (z = 2) (Type B) | FIG. 9B p_SEL[2] = p_2 | FIG. 15B p_SEL[2] = p_5 |
| | Layout loop (z = 3) (Type B) | FIG. 9C p_SEL[3] = p_3 | FIG. 15C p_SEL[3] = p_6 |

TABLE 12-continued

| Gate-controlled element of layout loop-initialization position p_INIT | FIGS. 9A~9G Gate-controlled elements (sec_1) of loop starting positions p_SEL[1]~p_SEL[5] p_INIT = p_1 | FIGS. 15A~15G p_INIT = p_4 |
|---|---|---|
| Layout loop (z = 4) (Type B) | FIG. 9D p_SEL[4] = p_4 | FIG. 15D p_SEL[4] = p_7 |
| Layout loop (z = 5) (Type B) | FIG. 9E p_SEL[5] = p_5 | FIG. 15E p_SEL[5] = p_8 |
| Layout loop (z = 6) (Type B) | FIG. 9F p_SEL[6] = p_6 | FIG. 15F p_SEL[6] = p_9 |
| Number of gate-controlled elements at the fourth side for routing delayed gating line (Type A) R = (K − ((INIT − 1) + Y*X)) | 2 (p_91, p_92) | 5 (p_88~p_92) |

As described above, according to the concepts of the disclosure, the gate-controlled elements p_1~p_K do not synchronously conduct the supply voltage Vdd_q to the circuit block BLK_q immediately after the circuit block BLK_q starts to receive the supply voltage Vdd_q. The disclosure provides a method for sequentially switching on the gate-controlled elements p_1~p_K in a specific order so as to gradually increase the currents received by the circuit block BLK_q. When the circuit block BLK_q is switched from the disabled mode MDoff to the enabled mode MDon to receive the supply voltage Vdd_q, this method can significantly reduce the fluctuation of the voltage interfering in the other circuit blocks BLK_1~BLK_(q−1) and BLK_(q+1)~BLK_Q in the enabled mode MDon.

The embodiments of the disclosure set X=6 to simplify the description. In practical applications, X is a positive integer, and 0≤X≤L. A larger value of X will result in a longer length of the delayed gating lines connected between the gate-controlled elements, and thus the overall current received by the circuit block BLK_q through the gate-controlled elements increases slower. Also, when the circuit block BLK_q switched from the disabled mode MDoff to the enabled mode MDon, the voltage change affects the other circuit blocks BLK_1~BLK_(q−1) and BLK_(q+1)~BLK_Q in a relatively smooth manner during the transition process. After certain simulations, it is observed that the propagation delay during the switching operations is transient and the normal operation of the circuit block BLK_q is not affected.

Although the above description takes the circuit block BLK_q as an example, the layout method can be modified to be applied to other circuit blocks BLK_1~BLK_(q−1) and BLK_(q+1)~BLK_Q. In practical applications, the Q circuit blocks BLK_1~BLK_Q of the integrated circuit may receive the supply voltage Vdd_1~Vdd_Q of equivalent or inequivalent values, and the values of the variables K, X, Y associated with the circuit blocks BLK_1~BLK_Q may be adjusted for different cases. The integrated circuit could further include a power control circuit (not shown) electrically connected to the circuit blocks BLK_1~BLK_Q. The power control circuit controls the voltage-switching circuit to generate and conduct the block-enabling signals EN_1~EN_Q to gate-controlled elements on corresponding circuit blocks BLK_1~BLK_Q in response to the enabled mode MDon/disabled mode MDoff of the circuit blocks BLK_1~BLK_Q. Such modification or variation for the applications can be derived from the description and need not be described in detail herein.

In the above embodiments, the gate-controlled elements p_1~p_K are placed between the supply voltage Vdd_q and the circuit block BLK_q. To activate the circuit block BLK_q, the supply voltage is provided to the circuit block BLK_q through the gate-controlled elements in a specific sequence according to the connection configuration applied to the gate-controlled elements p_1~p_K in the layout. In practical applications, the gate-controlled elements could be placed between the ground voltage Gnd and the circuit block BLK_q. The layout method determines how delayed gating lines are routed between the gate-controlled elements. To disable the circuit block BLK_q, the ground voltage is conducted to the circuit block BLK_q through the gate-controlled elements p_1~p_K in a specific sequence according to the connection configuration applied to the gate-controlled elements p_1~p_K in the layout. Such applications can be derived from the description and will not be described in detail herein.

In practical applications, the concepts of the disclosure can be modified to divide the K gate-controlled elements into layout configuration-sections and determine the layout of each layout configuration-section. For example, there are two layout configuration-sections LOsec_A and LOsec_B arranged on the edge of the circuit block BLK_q. The layout configuration-section LOsec_A includes routing sections sec_A1~sec_AY collectively including K1 gate-controlled elements, and each of the routing sections sec_A1~sec_AY includes X1 gate-controlled elements; and the layout configuration-section LOsec_B includes routing sections sec_B1~sec_BY collectively including K2 gate-controlled elements, and each of the routing sections sec_B1~sec_BY includes X2 gate-controlled elements, wherein (K1+K2)=K, and X1, X2 may have equivalent or inequivalent values. The associated layout processes requiring variable substitution to arrange the delayed gating lines are still included in the scope of the present application.

The concepts of disclosure do not limit the implementation of the layout method. For example, the layout method can be executed by a software program recorded in a non-transitory computer-readable medium or a computer-readable medium to perform the layout associated with an integrated circuit. In practical applications, the layout method of the disclosure can be selected with electronic design automation (EDA) software for the circuit layout environment. The combination of the layout method of the disclosure and various computer-aided design software is applicable to the person skilled in the arts and is not described in detail herein.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A layout method used with an integrated circuit comprising Q circuit blocks, wherein the layout method comprises steps of:

placing K gate-controlled elements and (K−1) buffers on an edge of a qth circuit block among the Q circuit blocks, wherein each of the K gate-controlled elements comprises a first terminal, a second terminal, and a control terminal, and each of the (K−1) buffers comprises an input terminal and an output terminal;

connecting the first terminals of the K gate-controlled elements to a supply voltage terminal;

connecting the second terminals of the K gate-controlled elements to the qth circuit block;

selecting, among the K gate-controlled elements, (K−1) gate-controlled elements comprising an SEL[1]-th gate-controlled element as (K−1) source nodes, wherein the control terminal of the SEL[1]-th gate-controlled element receives a qth enabling signal corresponding to the qth circuit block;

selecting, among the K gate-controlled elements, another (K−1) gate-controlled elements other than the SEL[1]-th gate-controlled element as (K−1) destination nodes; and routing the (K−1) buffers as (K−1) delayed gating lines connected between the (K−1) source nodes and the (K−1) destination nodes, respectively, wherein Q, q, K, and SEL[1] are positive integers, SEL[1] is smaller than K, and q is smaller than or equivalent to Q.

2. The layout method according to claim 1, wherein the step of routing the (K−1) buffers as the (K−1) delayed gating lines connected between the (K−1) source nodes and the (K−1) destination nodes further comprises steps of:

selecting the SEL[1]-th gate-controlled element as a first source node among the (K−1) source nodes;

selecting an (SEL[1]+X)-th gate-controlled element among the K gate-controlled elements as a first destination node among the (K−1) destination nodes; and placing a first buffer among the (K−1) buffers as a first delayed gating line among the (K−1) delayed gating lines, wherein the control terminal of the SEL[1]-th gate-controlled element is connected to the input terminal of the first buffer, and the output terminal of the first buffer is connected to the control terminal of the (SEL[1]+X)-th gate-controlled element.

3. The layout method according to claim 2, wherein when the SEL[1]-th gate-controlled element is switched on in response to the qth enabling signal, the SEL[1]-th gate-controlled element conducts a voltage at the supply voltage terminal to the qth circuit block, and the first delayed gating line conducts the qth enabling signal with a delay to the control terminal of the (SEL[1]+X)-th gate-controlled element to make the (SEL[1]+X)-th gate-controlled element switched on in response to the qth enabling signal with the delay conducted through the first delayed gating line.

4. The layout method according to claim 2, wherein the first delayed gating line is longer in length if X has a greater value.

5. The layout method according to claim 2, wherein the step of routing the (K−1) buffers as the (K−1) delayed gating lines connected between the (K−1) source nodes and the (K−1) destination nodes further comprises steps of:

selecting the (SEL[1]+X)-th gate-controlled element as a second source node among the (K−1) source nodes;

selecting an (SEL[1]+2*X)-th gate-controlled element among the K gate-controlled elements as a second destination node among the (K−1) destination nodes; and placing a second buffer among the (K−1) buffers as a second delayed gating line among the (K−1) delayed gating lines, wherein the control terminal of the (SEL[1]+X)-th gate-controlled element is connected to the input terminal of the second buffer, and the output terminal of the second buffer is connected to the control terminal of the (SEL[1]+2*X)-th gate-controlled element.

6. The layout method according to claim 1, wherein the step of routing the (K−1) buffers as the (K−1) delayed gating lines connected between the (K−1) source nodes and the (K−1) destination nodes further comprises steps of:

selecting an SEL[2]-th gate-controlled element among the K gate-controlled elements as a (Y+1)-th source node among the (K−1) source nodes, wherein SEL[2] is a positive integer not equivalent to SEL[1];

selecting an (SEL[2]+X)-th gate-controlled element among the K gate-controlled elements as a (Y+1)-th destination node among the (K−1) destination nodes; and placing a (Y+1)-th buffer among the (K−1) buffers as a (Y+1)th delayed gating line among the (K−1) delayed gating lines, wherein the control terminal of the SEL[2]-th gate-controlled element is connected to the input terminal of the (Y+1)-th buffer, and the output terminal of the (Y+1)-th buffer is connected to the control terminal of the (SEL[2]+X)-th gate-controlled element.

7. The layout method according to claim 6, wherein SEL[2] is greater than (SEL[1]−X), and SEL[2] is smaller than (SEL[1]+X).

8. The layout method according to claim 7, wherein if SEL[1] is equivalent to 1, SEL[2] is greater than SEL[1].

9. The layout method according to claim 1, wherein the step of routing the (K−1) buffers as the (K−1) delayed gating lines connected between the (K−1) source nodes and the (K−1) destination nodes further comprises steps of:

selecting an (SEL[1]+X*(Y−1))-th gate-controlled element among the K gate-controlled elements as a Yth source node among the (K−1) source nodes;

selecting an SEL[2]-th gate-controlled element among the K gate-controlled elements as a Yth destination node among the (K−1) destination nodes; and placing a Yth buffer among the (K−1) buffers as a Yth delayed gating line among the (K−1) delayed gating lines, wherein the control terminal of the (SEL[1]+X*(Y−1))-th gate-controlled element is connected to the input terminal of the Yth buffer, and the output terminal of the Yth buffer is connected to the control terminal of the SEL[2]-th gate-controlled element.

10. The layout method according to claim 9, wherein (SEL[1]+X*Y) is smaller than or equivalent to K, and (SEL[1]+X*(Y+1)) is greater than K.

11. The layout method according to claim 10, wherein if (SEL[1]+X*Y) is smaller than K, the step of routing the (K−1) buffers as the (K−1) delayed gating lines connected between the (K−1) source nodes and the (K−1) destination nodes further comprises steps of:

selecting a (K−1)-th gate-controlled element among the K gate-controlled elements as a (K-SEL[1])-th source node among the (K−1) source nodes;

selecting a Kth gate-controlled element among the K gate-controlled elements as a (K-SEL[1])-th destination node among the (K−1) destination nodes; and placing a (K-SEL[1])-th buffer among the (K−1) buffers as a (K-SEL[1])-th delayed gating line among the (K−1) delayed gating lines, wherein the control terminal of the (K−1)-th gate-controlled element is connected to the input terminal of the (K-SEL[1])-th buffer, and the output terminal of the (K-SEL[1])-th buffer is connected to the control terminal of the Kth gate-controlled element.

12. The layout method according to claim 1, further comprising steps of:

selecting a first selected gate-controlled element among the (K−1) gate-controlled elements as an (X*Y−1)-th destination node among the (K−1) destination nodes and an (X*Y)-th source node among the (K−1) source nodes;

selecting a second selected gate-controlled element among the (K−1) gate-controlled elements as an (X*Y−1)-th source node among the (K−1) source nodes;

selecting a third selected gate-controlled element among the (K−1) gate-controlled elements as an (X*Y)-th destination node among the (K−1) destination nodes, wherein a distance between the first selected gate-controlled element and the second selected gate-controlled element is X gate-controlled elements, and a distance between the first selected gate-controlled element and the third selected gate-controlled element is smaller than X gate-controlled elements.

13. The layout method according to claim 1, wherein the K gate-controlled elements are divided into Y routing sections, and each of the Y routing sections corresponds to X gate-controlled elements among the K gate-controlled elements.

14. The layout method according to claim 13, wherein a first routing section among the Y routing sections corresponds to the X gate-controlled elements starting from an INIT-th gate-controlled element to a (INIT+X−1)-th gate-controlled element.

15. The layout method according to claim 14, wherein if INIT is greater than 1, the step of routing the (K−1) buffers as the (K−1) delayed gating lines connected between the (K−1) source nodes and the (K−1) destination nodes further comprises steps of:

selecting a Kth gate-controlled element among the K gate-controlled elements as a (K-INIT+1)-th source node among the (K−1) source nodes;

selecting a first gate-controlled element among the K gate-controlled elements as a (K-INIT+1)-th destination node among the (K−1) destination nodes; and placing a (K-INIT+1)-th buffer among the (K−1) buffers as a (K-INIT+1)-th delayed gating line among the (K−1) delayed gating lines, wherein the control terminal of the Kth gate-controlled element is connected to the input terminal of the (K-INIT+1)-th buffer, and the output terminal of the (K-INIT+1)-th buffer is connected to the control terminal of the first gate-controlled element.

16. The layout method according to claim 15, wherein if INIT is greater than 2, the step of routing the (K−1) buffers as the (K−1) delayed gating lines connected between the (K−1) source nodes and the (K−1) destination nodes comprises steps of:

selecting the first gate-controlled element as a (K-INIT+2)-th source node among the (K−1) source nodes;

selecting a second gate-controlled element among the K gate-controlled elements as a (K-INIT+2)-th destination node among the (K−1) destination nodes; and placing a (K-INIT+2)-th buffer among the (K−1) buffers as a (K-INIT+2)-th delayed gating line among the (K−1) delayed gating lines, wherein the control terminal of the first gate-controlled element is connected to the input terminal of the (K-INIT+2)-th buffer, and the output terminal of the (K-INIT+2)-th buffer is connected to the control terminal of the second gate-controlled element.

17. The layout method according to claim 14, wherein if INIT is greater than 2, the step of routing the (K−1) buffers as the (K−1) delayed gating lines connected between the (K−1) source nodes and the (K−1) destination nodes further comprises steps of:

selecting an (INIT-2)-th gate-controlled element among the K gate-controlled elements as a (K−1)-th source node among the (K−1) source nodes;

selecting an (INIT-1)-th gate-controlled element among the K gate-controlled elements as a (K−1)-th destination node among the (K−1) destination nodes; and placing a (K−1)-th buffer among the (K−1) buffers as a (K−1)-th delayed gating line among the (K−1) delayed gating lines, wherein the control terminal of the (INIT-2)-th gate-controlled element is connected to the input terminal of the (K−1)-th buffer, and the output terminal of the (K−1)-th buffer is connected to the control terminal of the (INIT-1)-th gate-controlled element.

18. The layout method according to claim 14, wherein SEL[1] is greater than or equivalent to INIT, and SEL[1] is smaller than or equivalent to (INIT+X−1).

19. A non-transitory computer-readable medium recording a software program for performing a layout method of an integrated circuit, wherein a processor executes the layout method, and the layout method comprises steps of:

placing K gate-controlled elements and (K−1) buffers on an edge of a qth circuit block among Q circuit blocks in the integrated circuit, wherein each of the K gate-controlled elements comprises a first terminal, a second terminal, and a control terminal, and each of the (K−1) buffers comprises an input terminal and an output terminal;

connecting the first terminals of the K gate-controlled elements to a supply voltage terminal;

connecting the second terminals of the K gate-controlled elements to the qth circuit block;

selecting, among the K gate-controlled elements, (K−1) gate-controlled elements comprising an SEL[1]-th gate-controlled element as (K−1) source nodes, wherein the control terminal of the SEL[1]-th gate-controlled element receives a qth enabling signal corresponding to the qth circuit block;

selecting, among the K gate-controlled elements, another (K−1) gate-controlled elements other than the SEL[1]-th gate-controlled element as (K−1) destination nodes; and routing the (K−1) buffers as (K−1) delayed gating lines connected between the (K−1) source nodes and the (K−1) destination nodes, respectively, wherein Q, q, K, and SEL[1] are positive integers, SEL[1] is smaller than K, and q is smaller than or equivalent to Q.

20. An integrated circuit, comprising:

Q layout blocks corresponding to Q supply voltages, respectively, a qth layout block among the Q layout blocks comprising:

a qth circuit block operating with a qth supply voltage among the Q supply voltages;

K gate-controlled elements placed on an edge of the qth circuit block, wherein each of the K gate-controlled elements comprises a first terminal connected to a supply voltage terminal, a second terminal connected to the qth circuit block, and a control terminal, and the control terminal of an SEL[1]-th gate-controlled element among the K gate-controlled elements receives a qth enabling signal corresponding to the qth circuit block; and (K−1) buffers placed on the edge of the qth circuit block, wherein each of the (K−1) buffers comprises an input terminal and an output terminal, wherein (K−1) gate-controlled elements, among the K gate-controlled elements, comprising the SEL[1]-th gate-controlled element are selected as (K−1) source nodes, and another (K−1) gate-controlled elements, among the K gate-controlled elements, other than the SEL[1]-th gate-controlled element are selected as (K−1) destination nodes, wherein the (K−1) buffers are routed as (K−1) delayed gating lines connected between the (K−1) source nodes and the (K−1) destination nodes, respectively, wherein Q, q, K, and SEL[1] are positive integers, SEL[1] is smaller than K, and q is smaller than or equivalent to Q.

* * * * *